(12) United States Patent
Kahrimanovic

(10) Patent No.: US 10,117,321 B2
(45) Date of Patent: Oct. 30, 2018

(54) DEVICE INCLUDING A PRINTED CIRCUIT BOARD AND A METAL WORKPIECE

(71) Applicant: Infineon Technologies Austria AG, Villach (AT)

(72) Inventor: Elvir Kahrimanovic, Villach (AT)

(73) Assignee: Infineon Technologies Austria AG, Villach (AT)

( * ) Notice: Subject to any disclaimer, the term of this patent is extended or adjusted under 35 U.S.C. 154(b) by 44 days.

(21) Appl. No.: 14/949,933

(22) Filed: Nov. 24, 2015

(65) Prior Publication Data

US 2016/0165715 A1 Jun. 9, 2016

(30) Foreign Application Priority Data

Dec. 5, 2014 (DE) .................. 10 2014 117 943

(51) Int. Cl.
| | |
|---|---|
| *G06F 1/16* | (2006.01) |
| *H05K 5/00* | (2006.01) |
| *H05K 7/00* | (2006.01) |
| *H05K 1/02* | (2006.01) |
| *H05K 1/18* | (2006.01) |
| *H05K 3/34* | (2006.01) |

(52) U.S. Cl.
CPC .......... *H05K 1/0203* (2013.01); *H05K 1/021* (2013.01); *H05K 1/0209* (2013.01); *H05K 1/181* (2013.01); *H05K 3/3426* (2013.01); *H05K 2201/066* (2013.01); *H05K 2201/10053* (2013.01); *H05K 2201/1053* (2013.01); *Y02P 70/613* (2015.11)

(58) Field of Classification Search
CPC .... H05K 1/0203; H05K 1/0209; H05K 1/181; H05K 1/021; H01L 21/4842

USPC .......... 361/718, 704, 707, 712, 690; 257/685
See application file for complete search history.

(56) References Cited

U.S. PATENT DOCUMENTS

| | | | | |
|---|---|---|---|---|
| 4,209,798 | A * | 6/1980 | Beretta | H01L 23/3107 174/16.3 |
| 5,394,010 | A * | 2/1995 | Tazawa | H01L 21/4842 257/685 |
| 5,844,779 | A | 12/1998 | Choi | |
| 5,978,216 | A * | 11/1999 | Choi | H01L 21/565 165/185 |
| 6,351,385 | B1 * | 2/2002 | Featherstone, III | H01L 23/3672 165/185 |
| 8,472,196 | B2 * | 6/2013 | Zeng | H01L 23/4334 257/670 |

(Continued)

FOREIGN PATENT DOCUMENTS

| | | |
|---|---|---|
| CN | 1398149 | 2/2003 |
| CN | 101360394 | 2/2009 |

*Primary Examiner* — Anthony Haughton
(74) *Attorney, Agent, or Firm* — Dicke, Billig & Czaja, PLLC

(57) ABSTRACT

A device including a first semiconductor package that includes a semiconductor chip, an encapsulation material at least partly covering the semiconductor chip, and a contact element electrically coupled to the semiconductor chip and protruding out of the encapsulation material. In addition, the device includes a printed circuit board (PCB), wherein the first semiconductor package is mounted on the PCB and the contact element of the first semiconductor package is electrically coupled to the PCB. The device further includes a first metal workpiece mounted on the printed circuit board and electrically coupled to the contact element of the first semiconductor package.

19 Claims, 57 Drawing Sheets

(56) References Cited

U.S. PATENT DOCUMENTS

2003/0015348 A1 1/2003 Lee et al.
2009/0032921 A1 2/2009 Koga

* cited by examiner

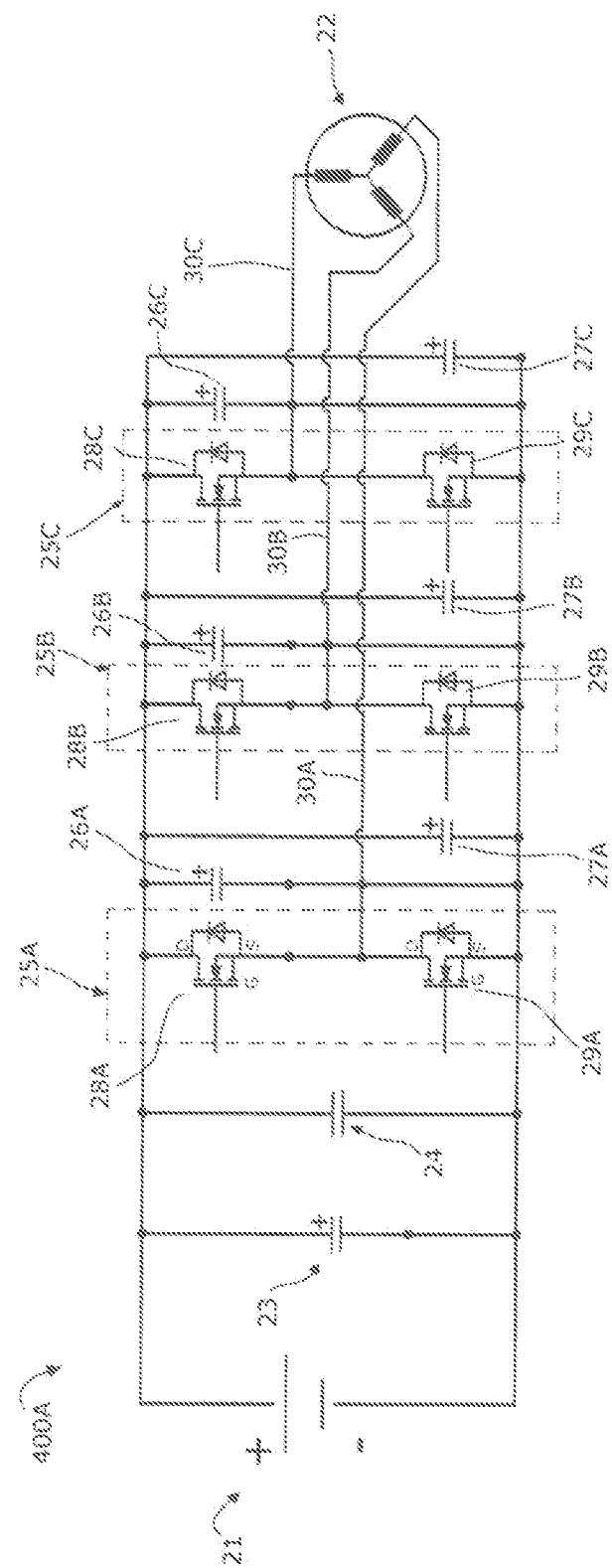

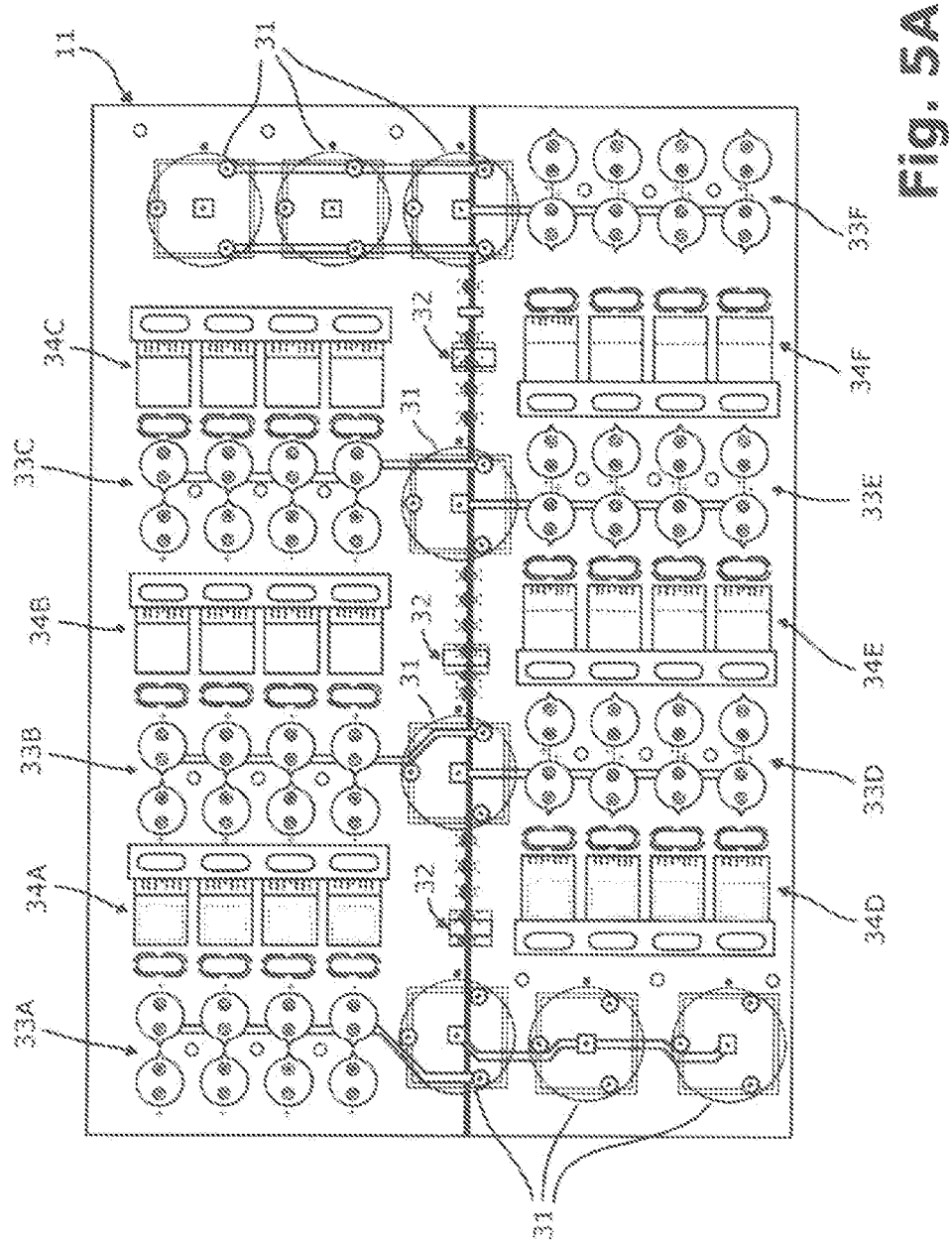

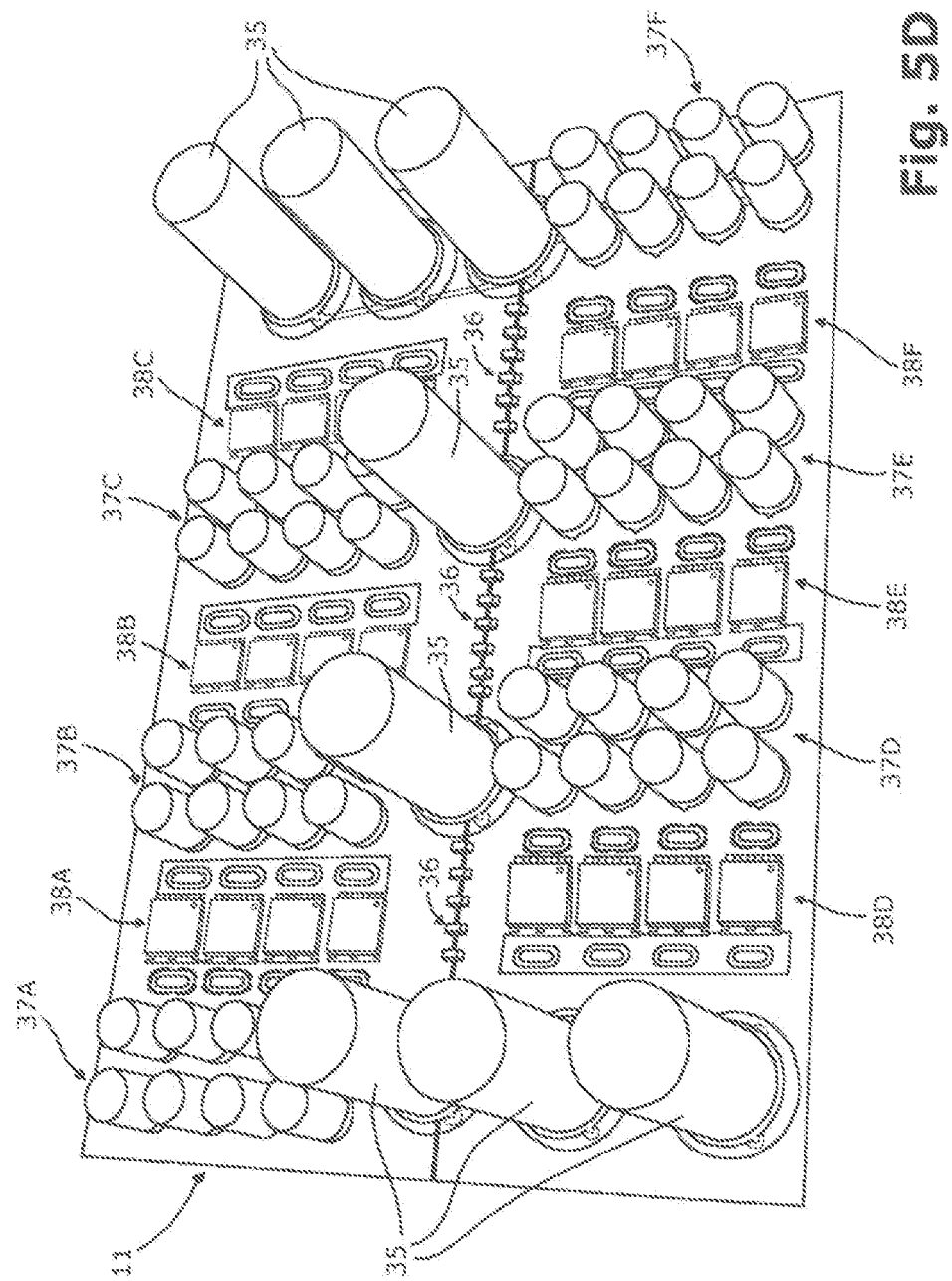

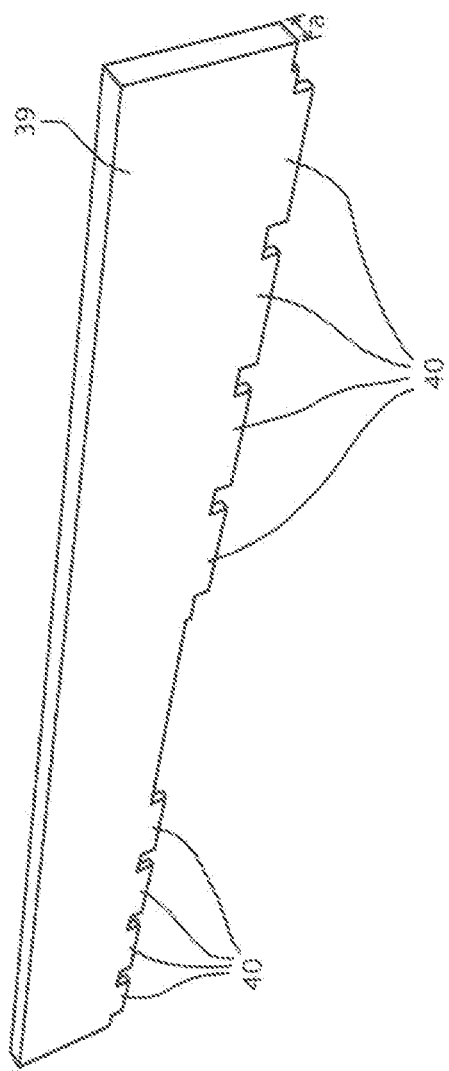

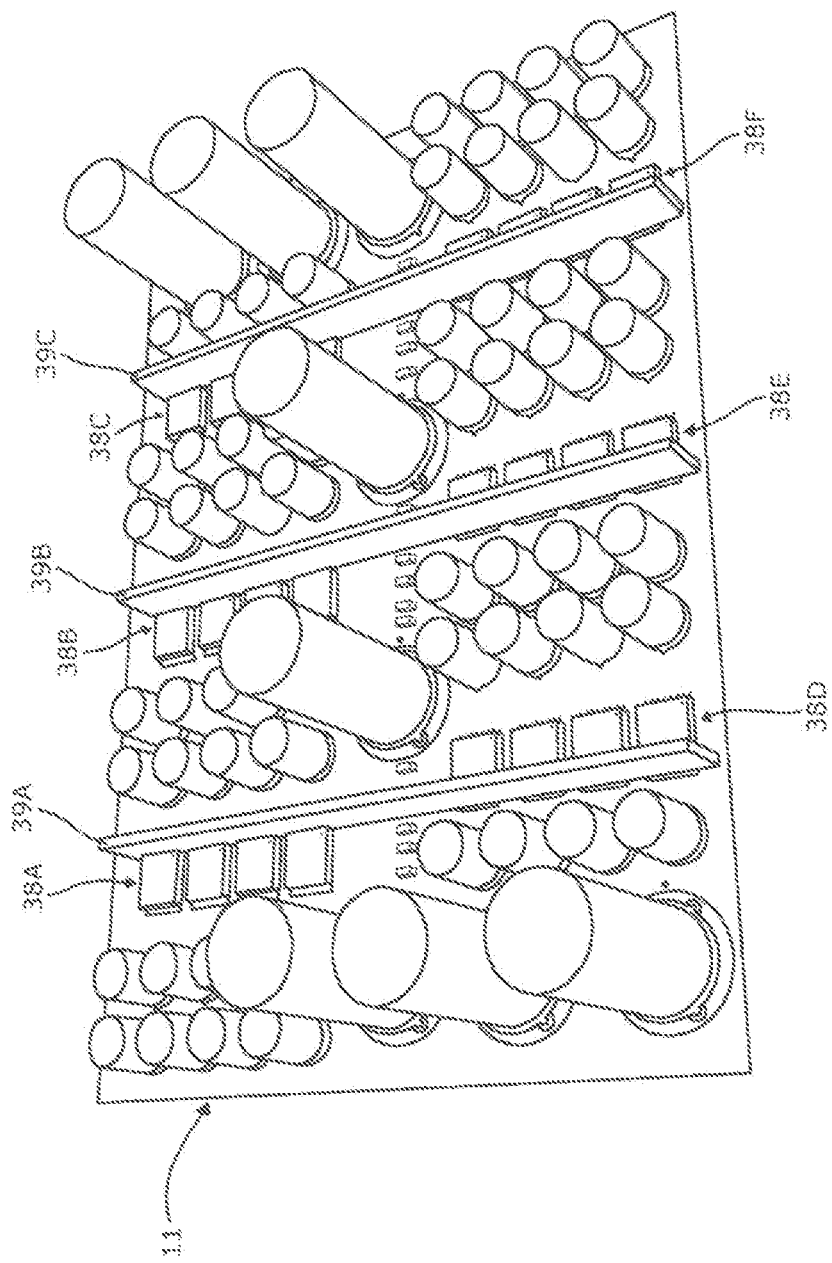

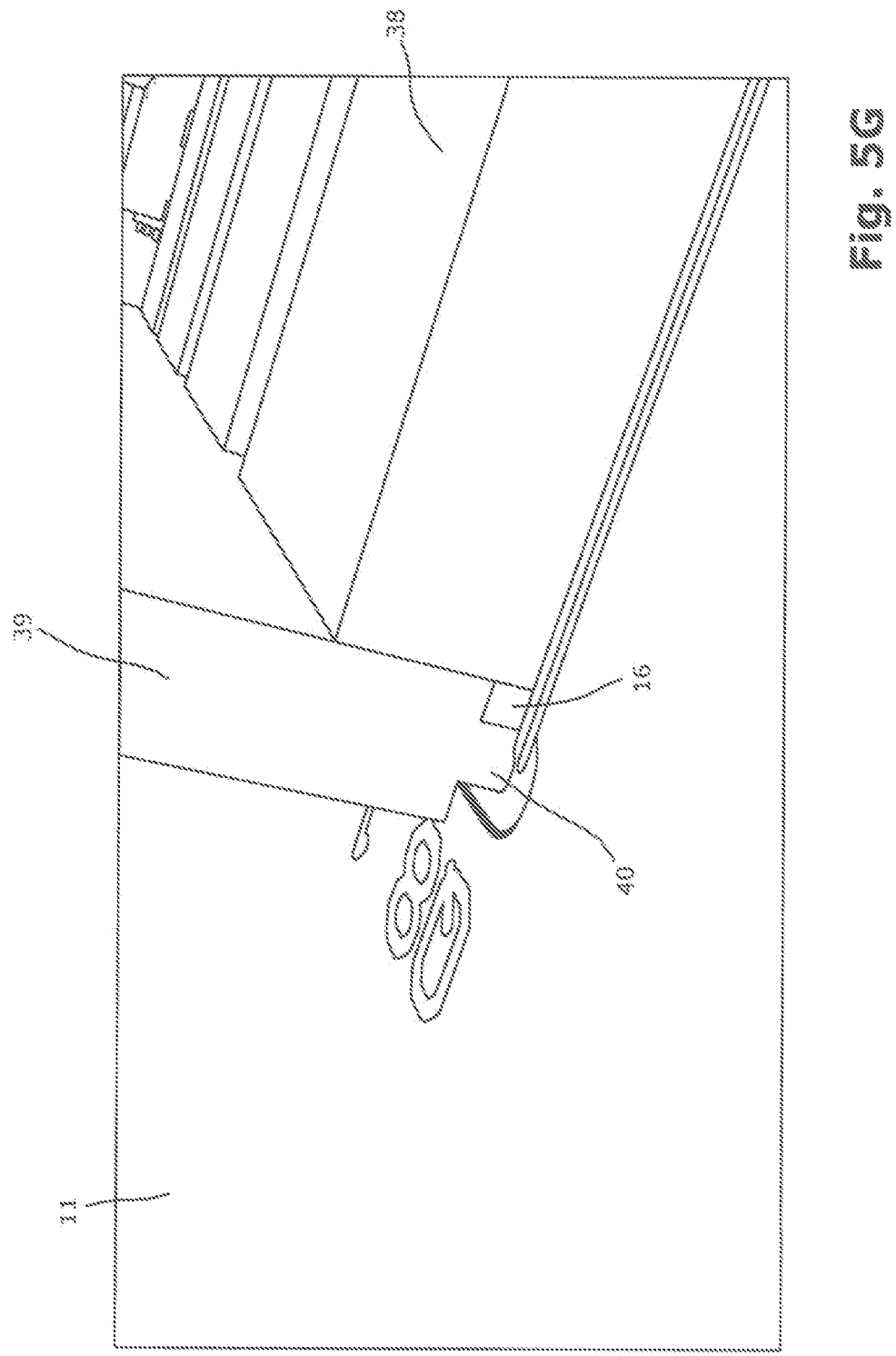

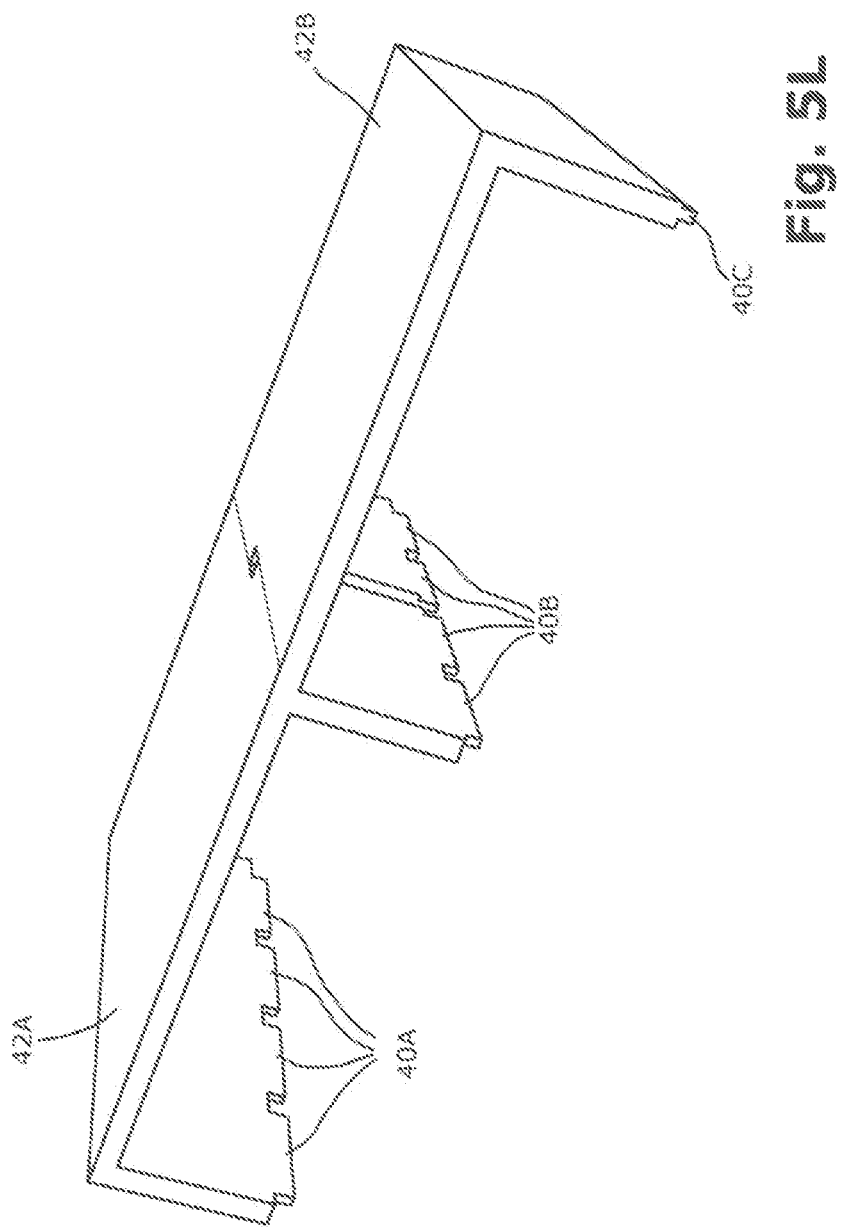

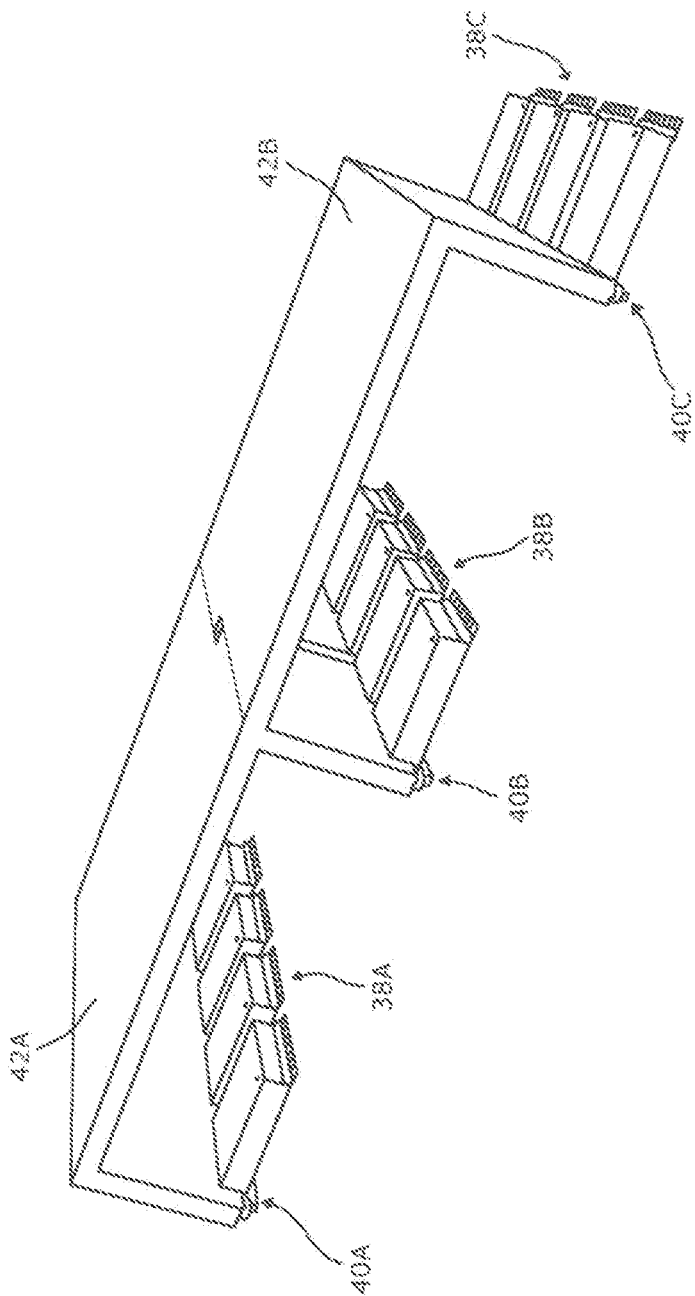

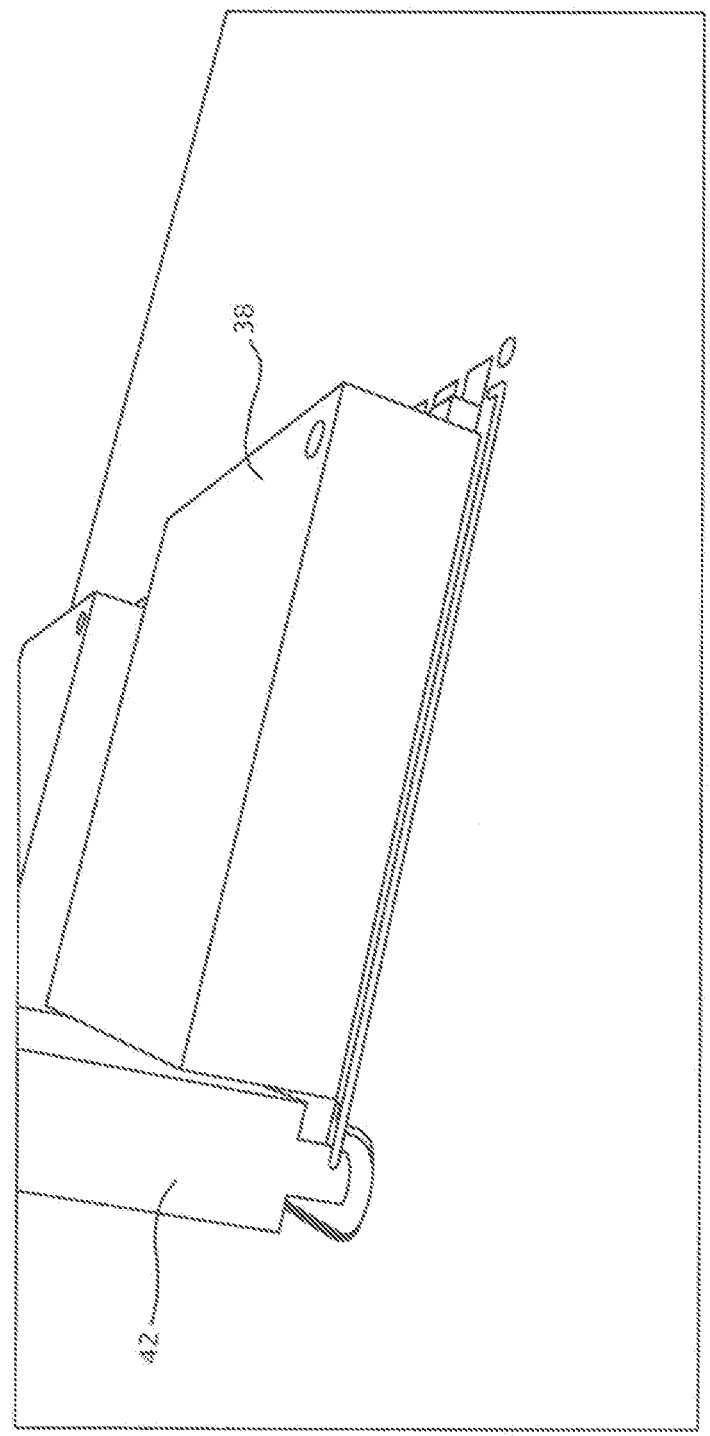

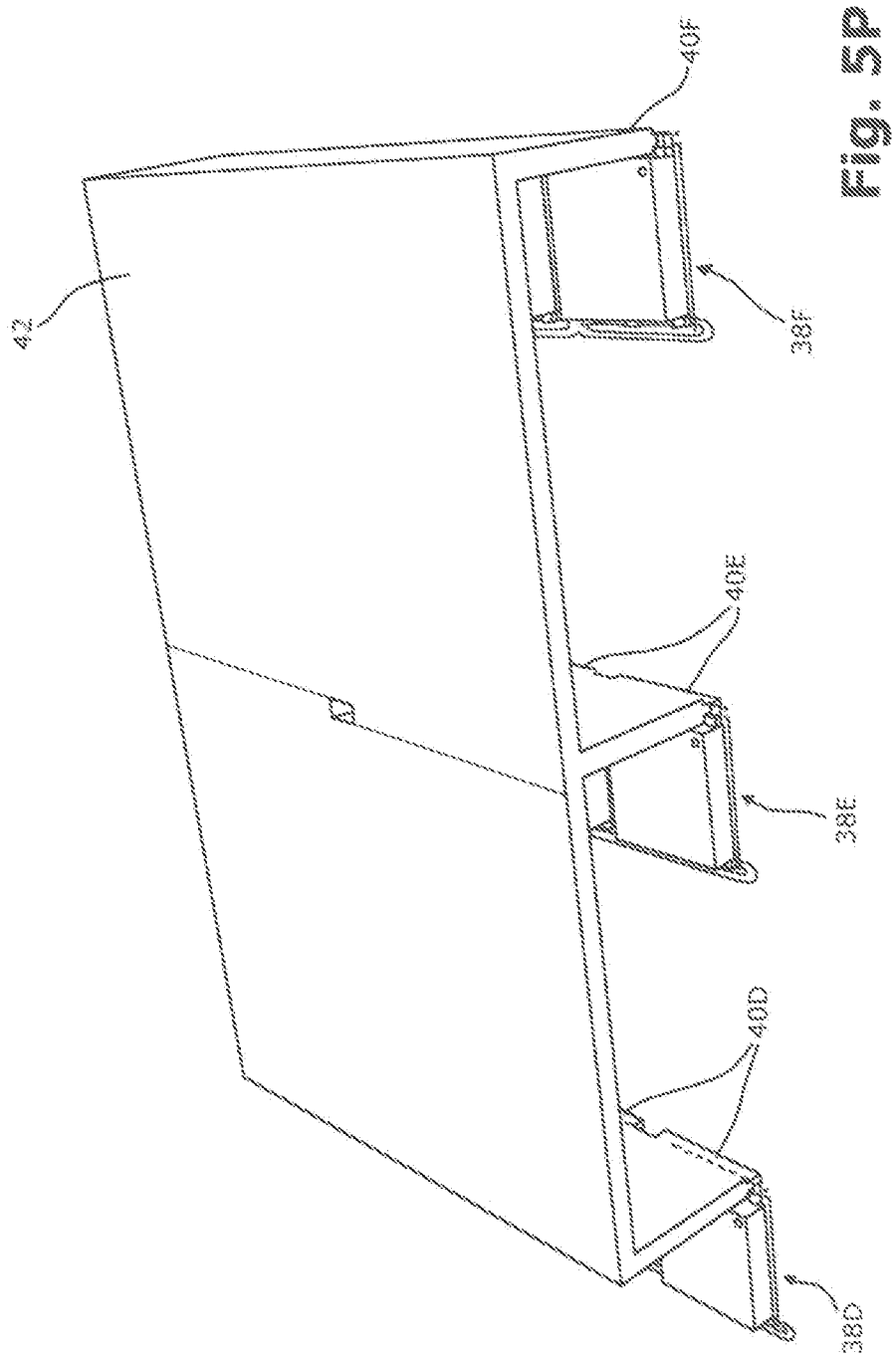

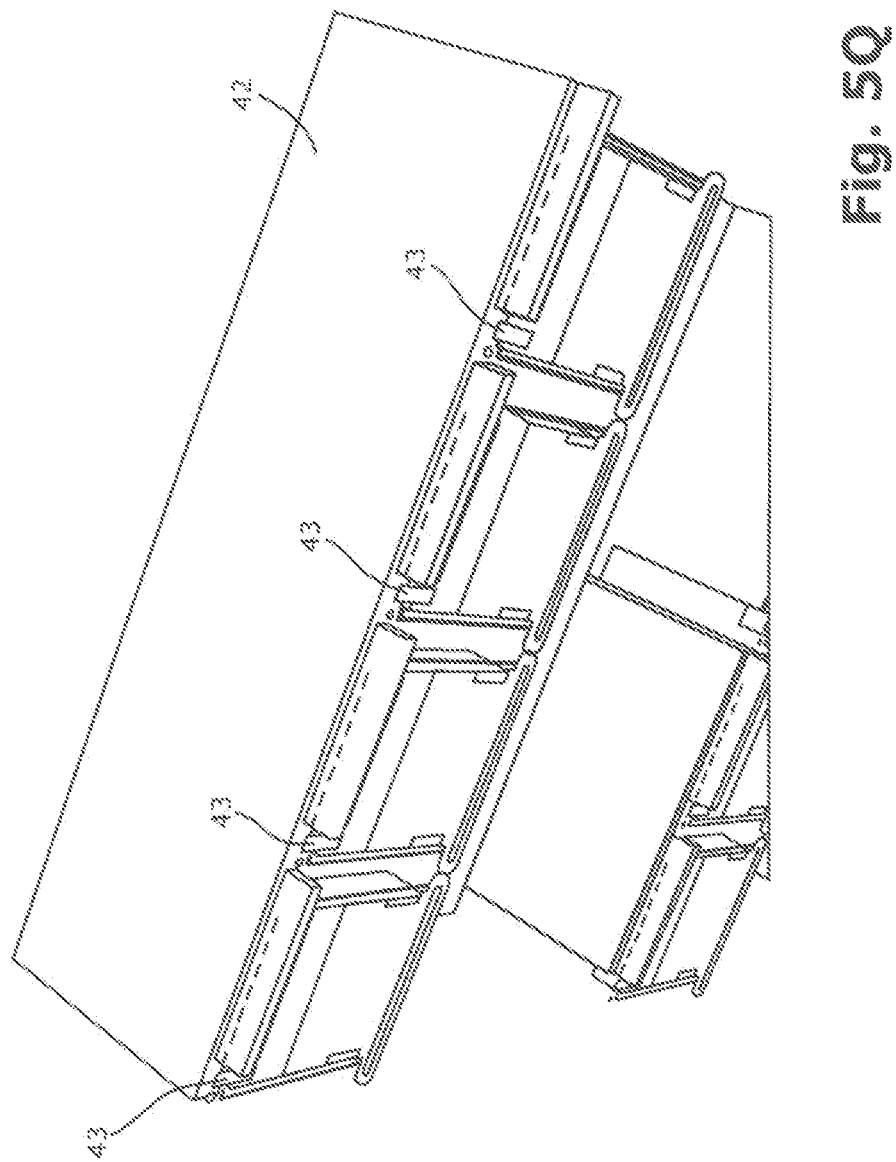

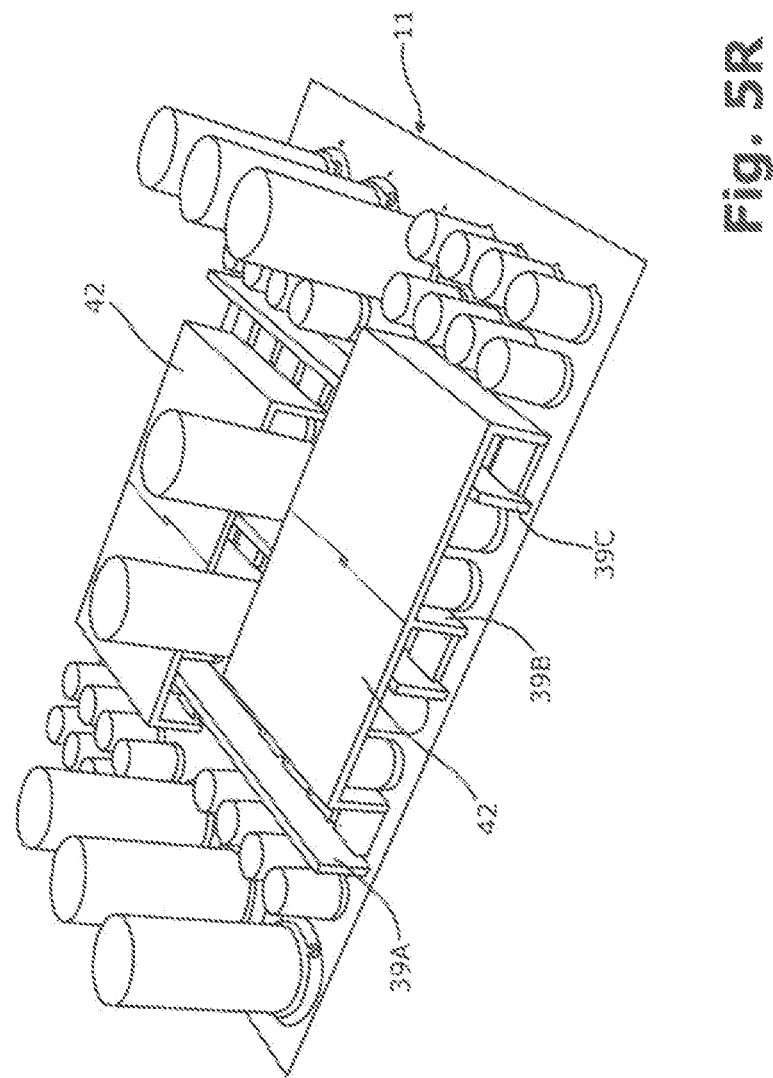

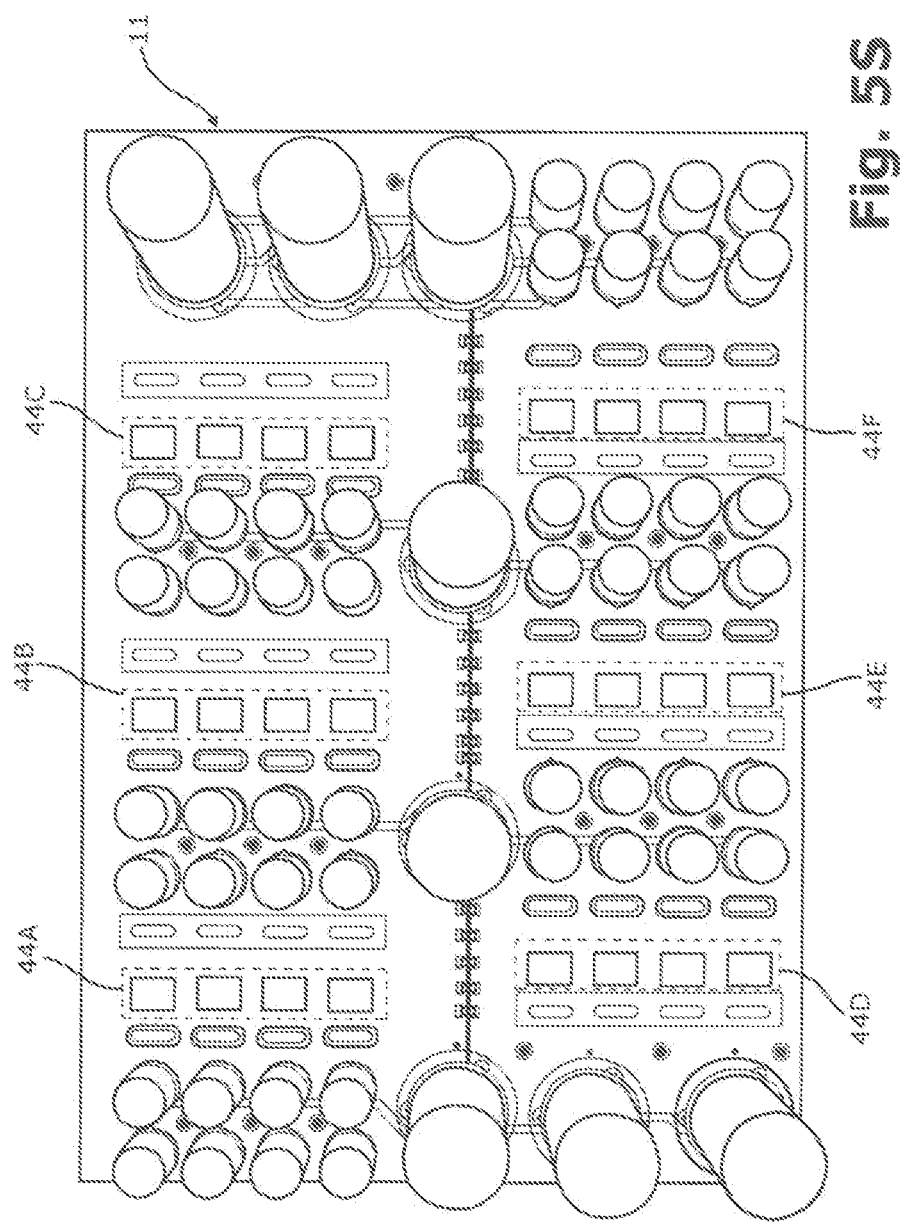

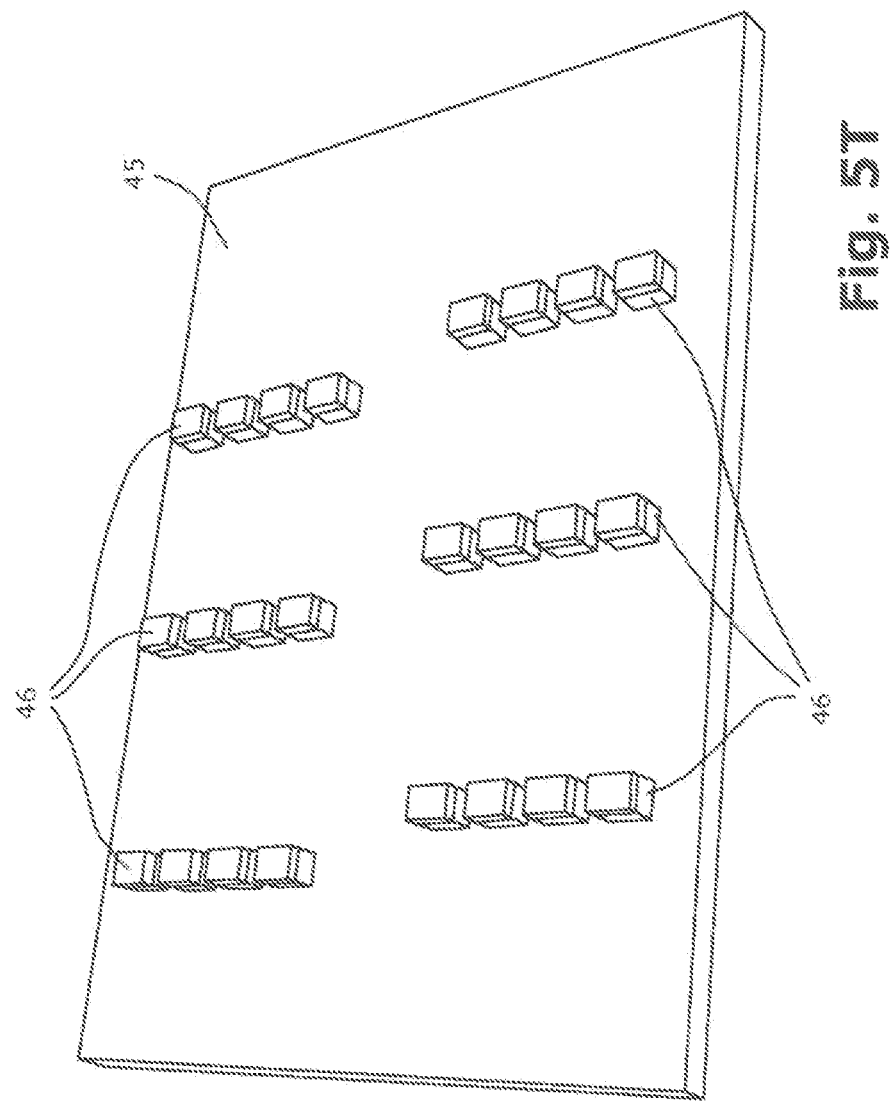

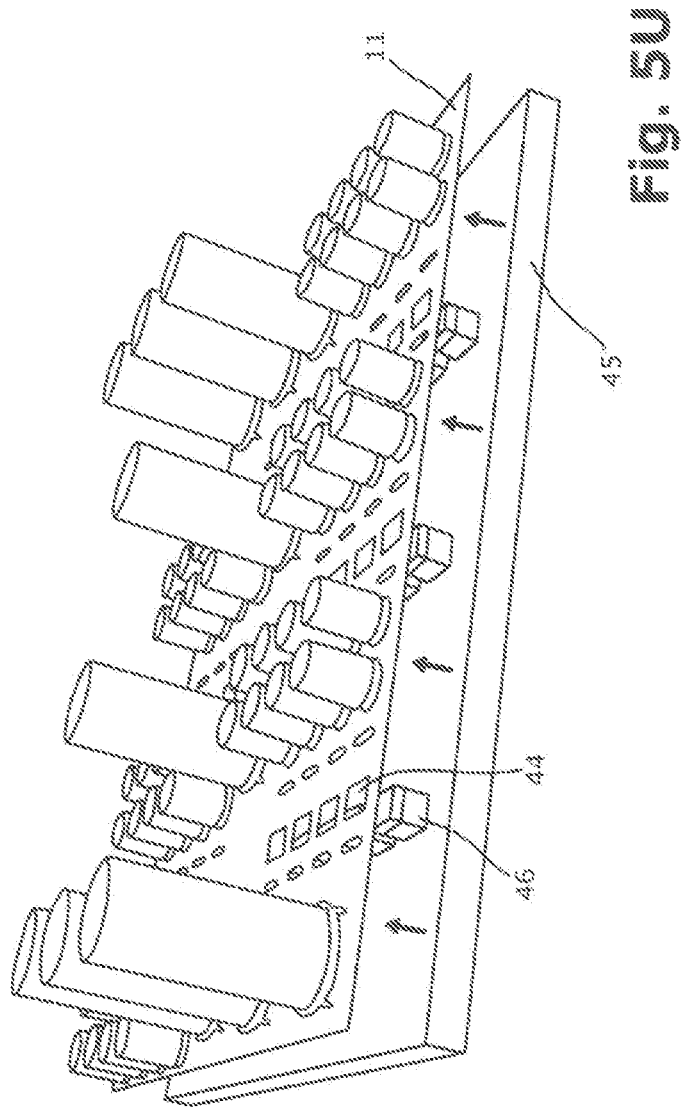

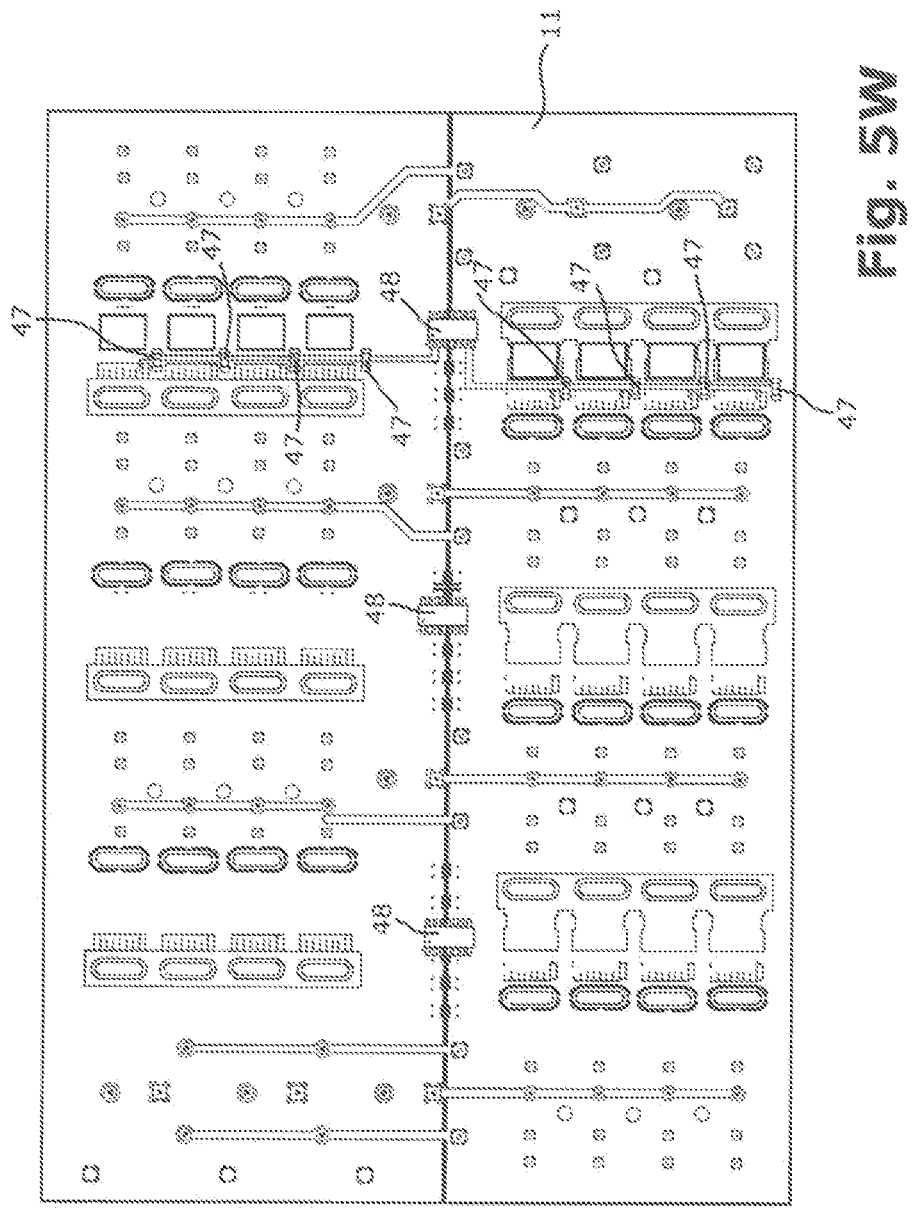

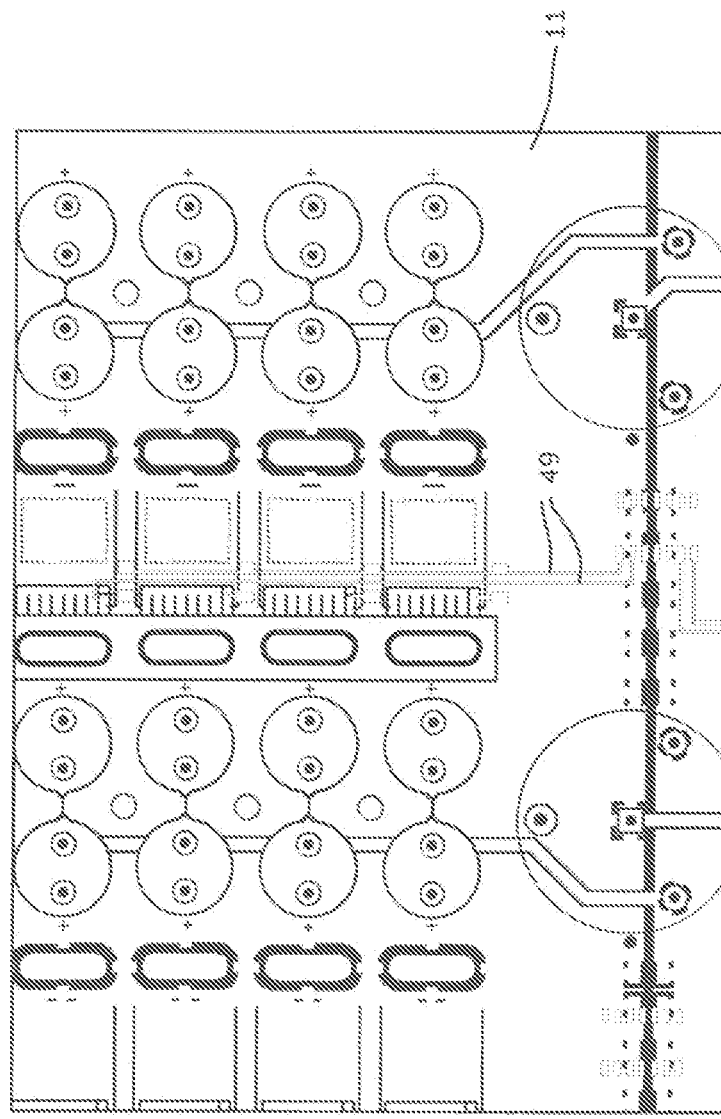

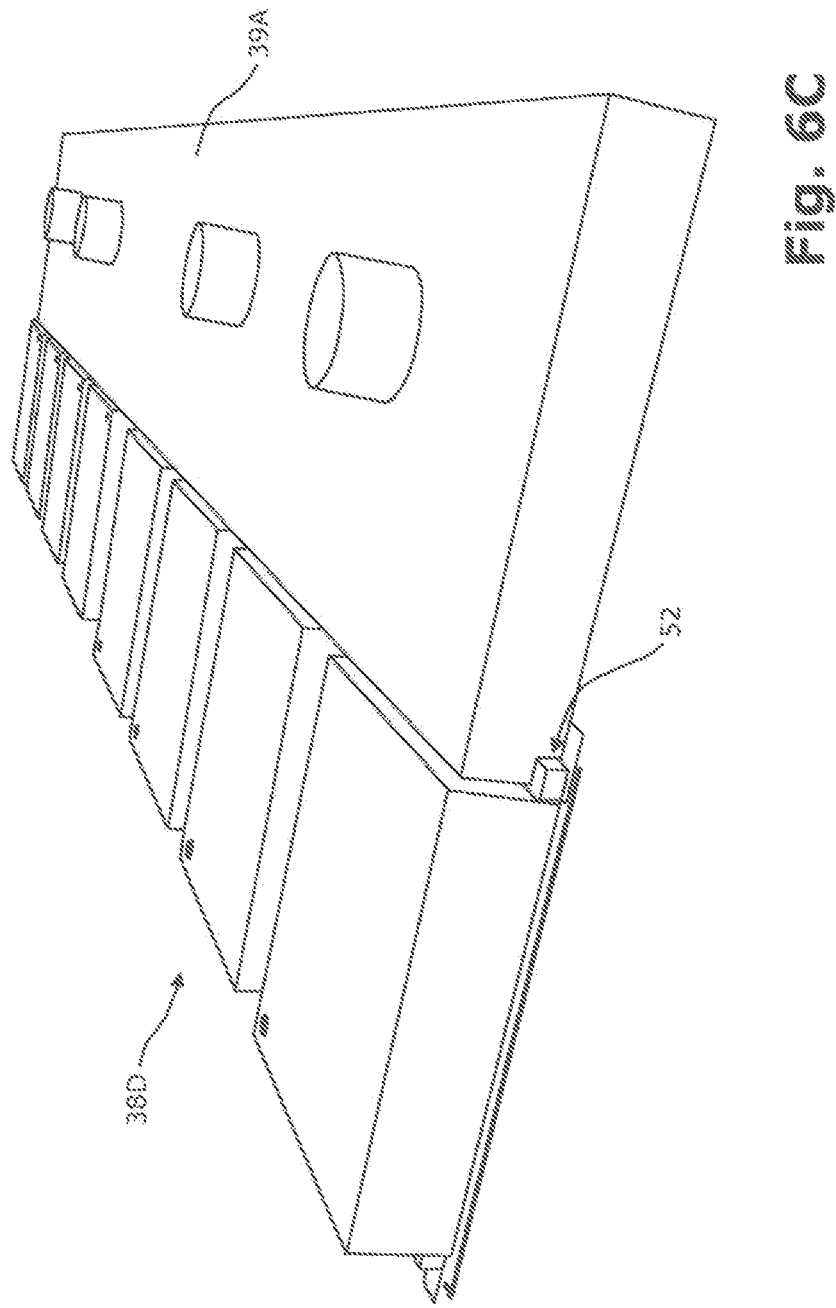

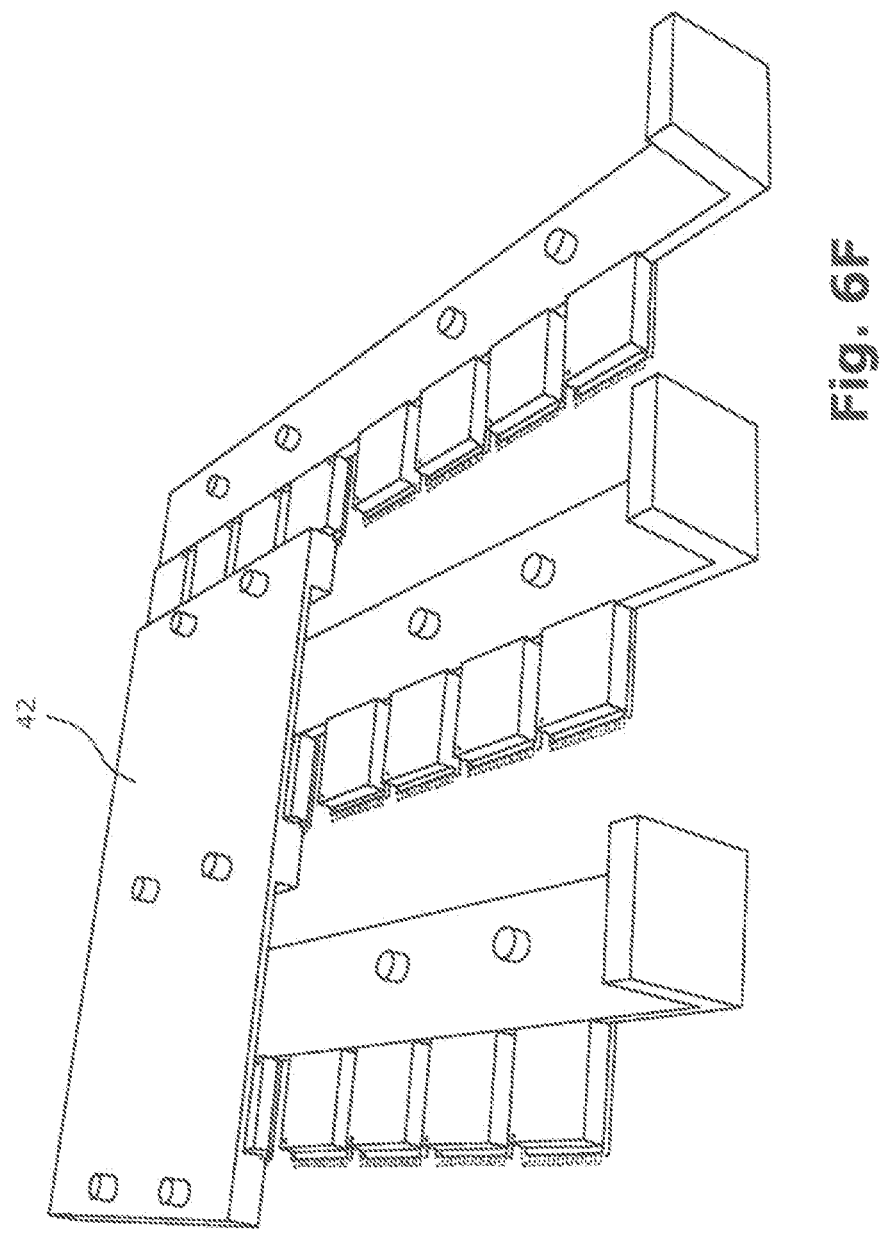

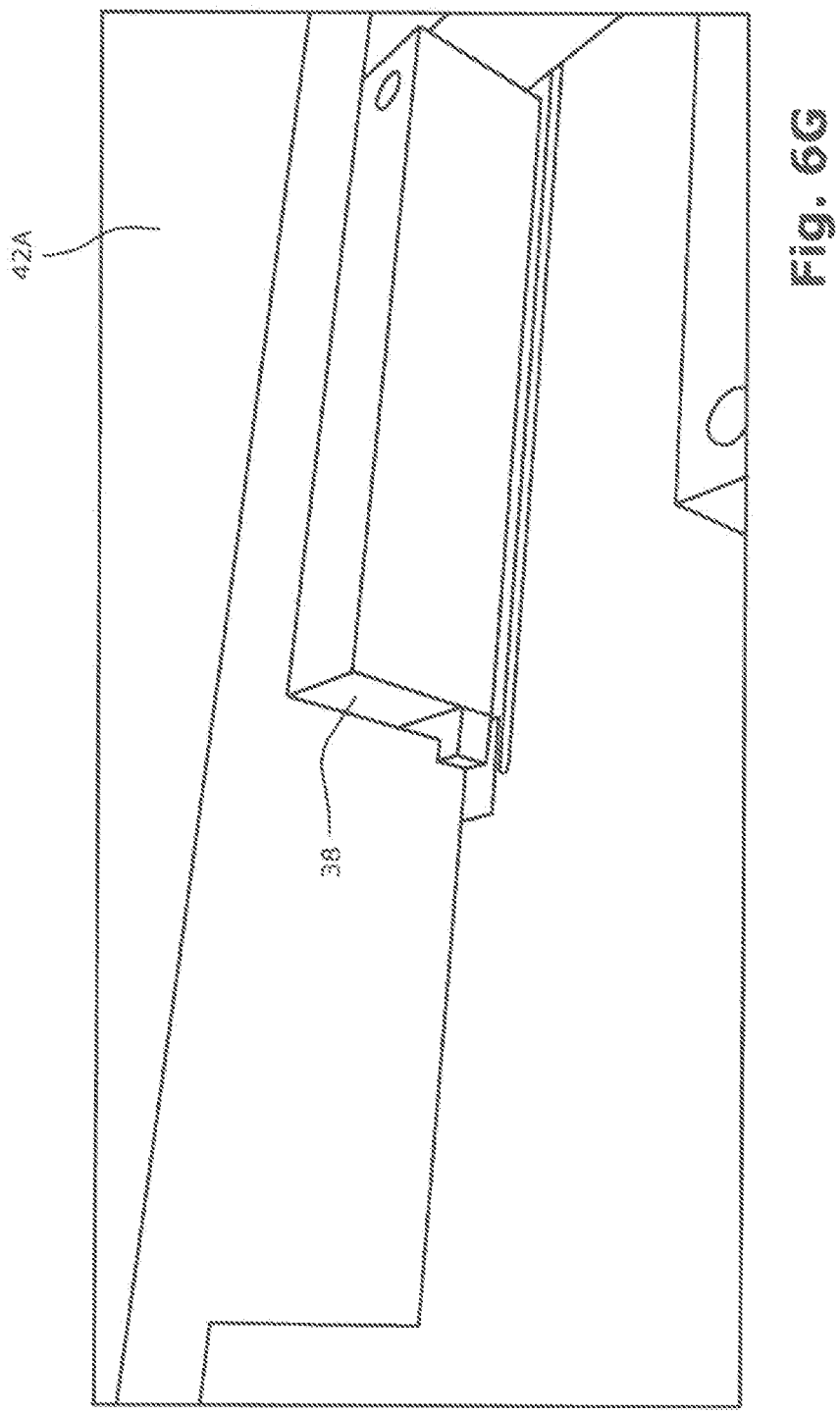

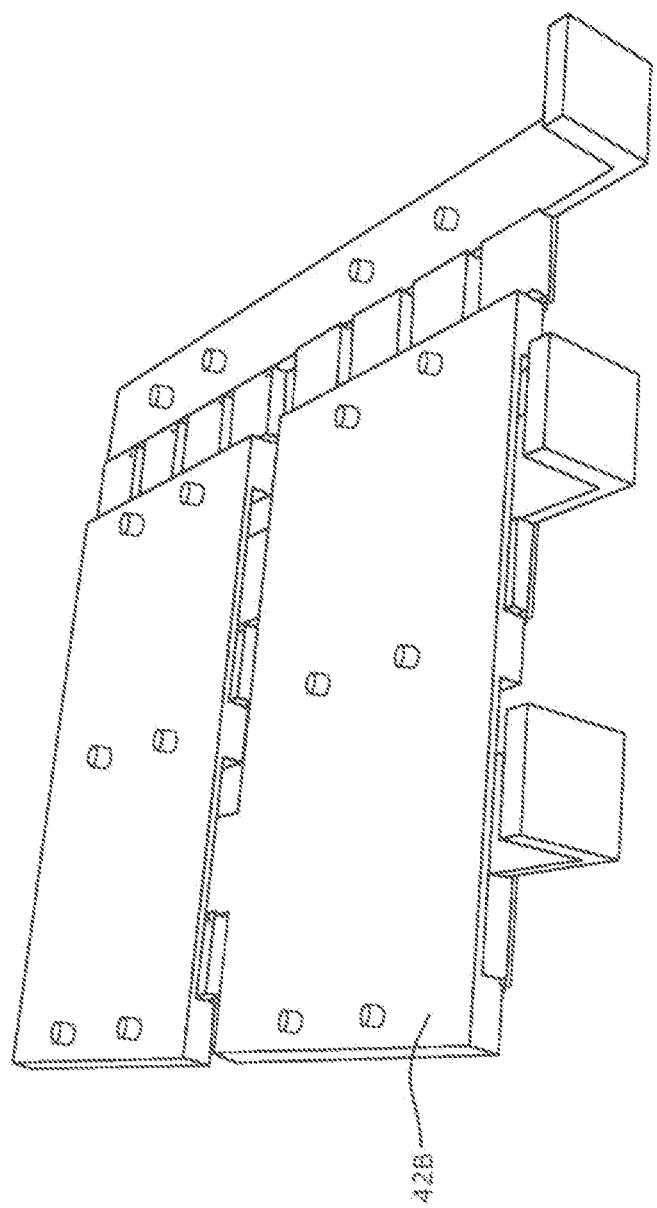

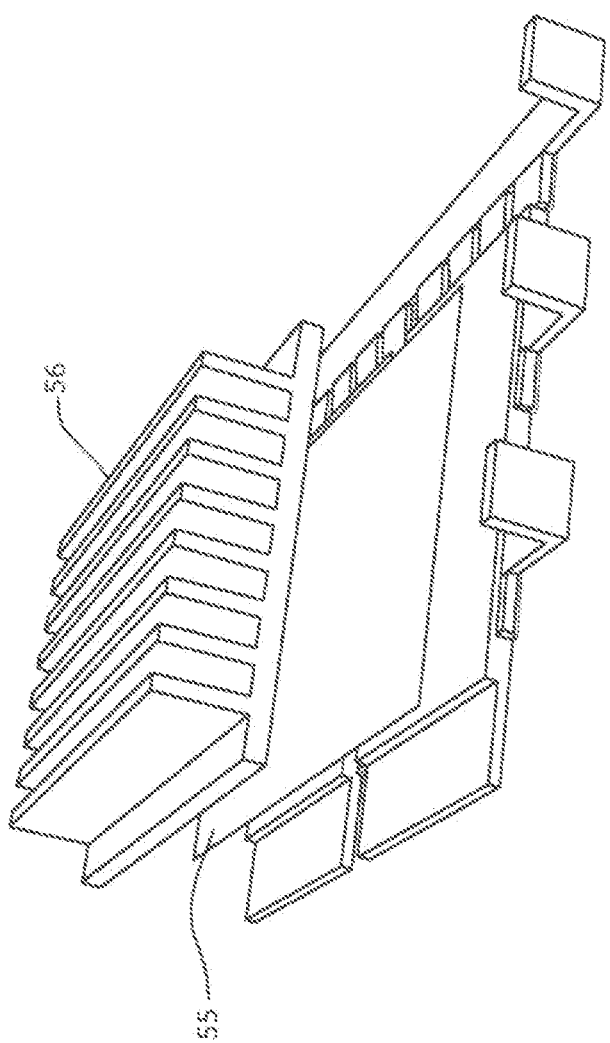

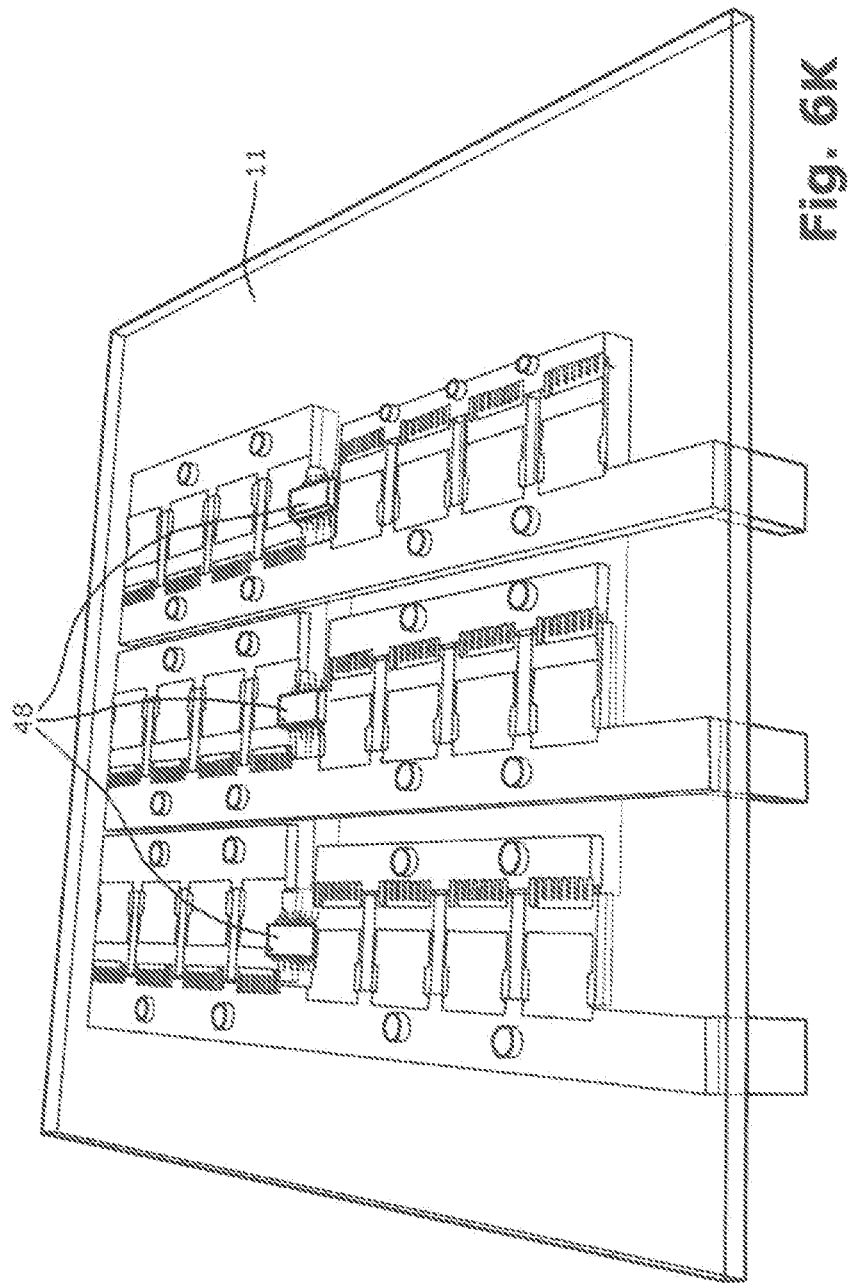

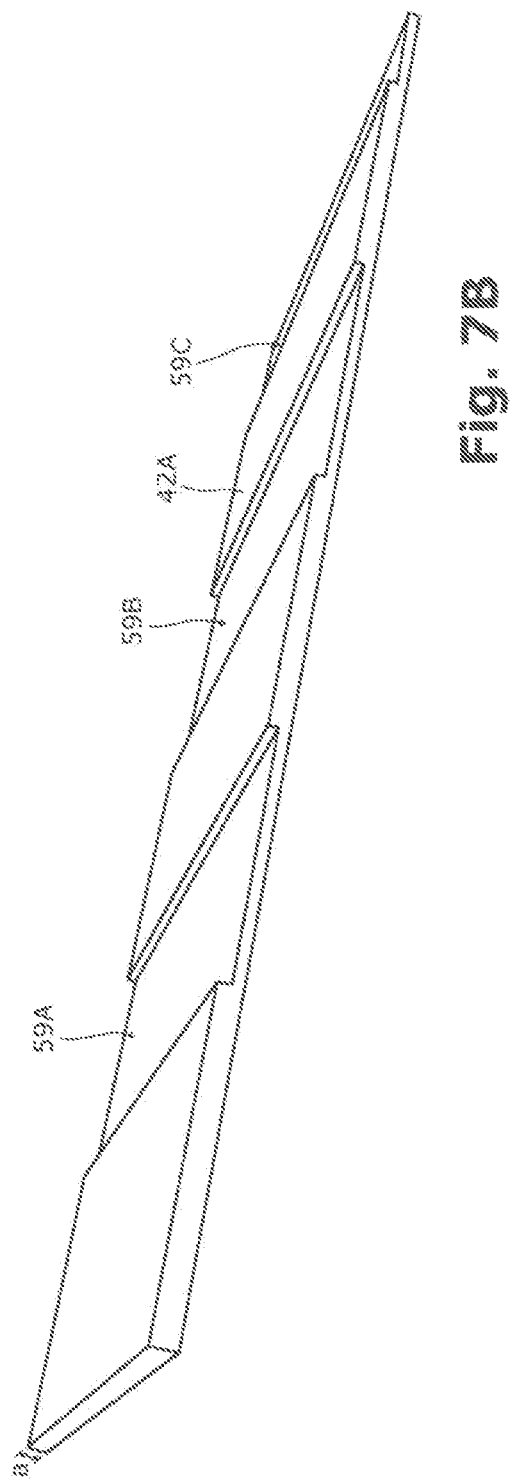

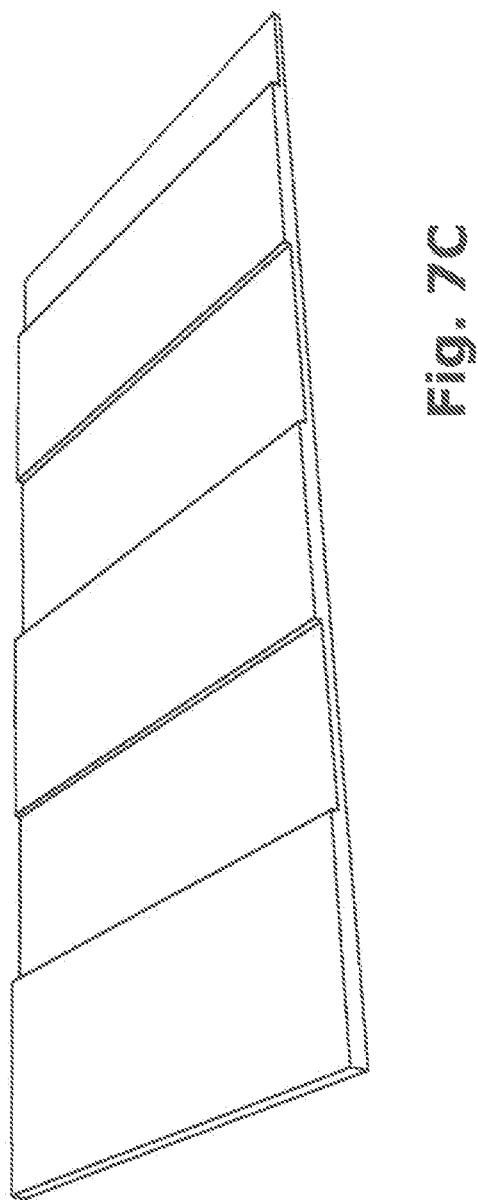

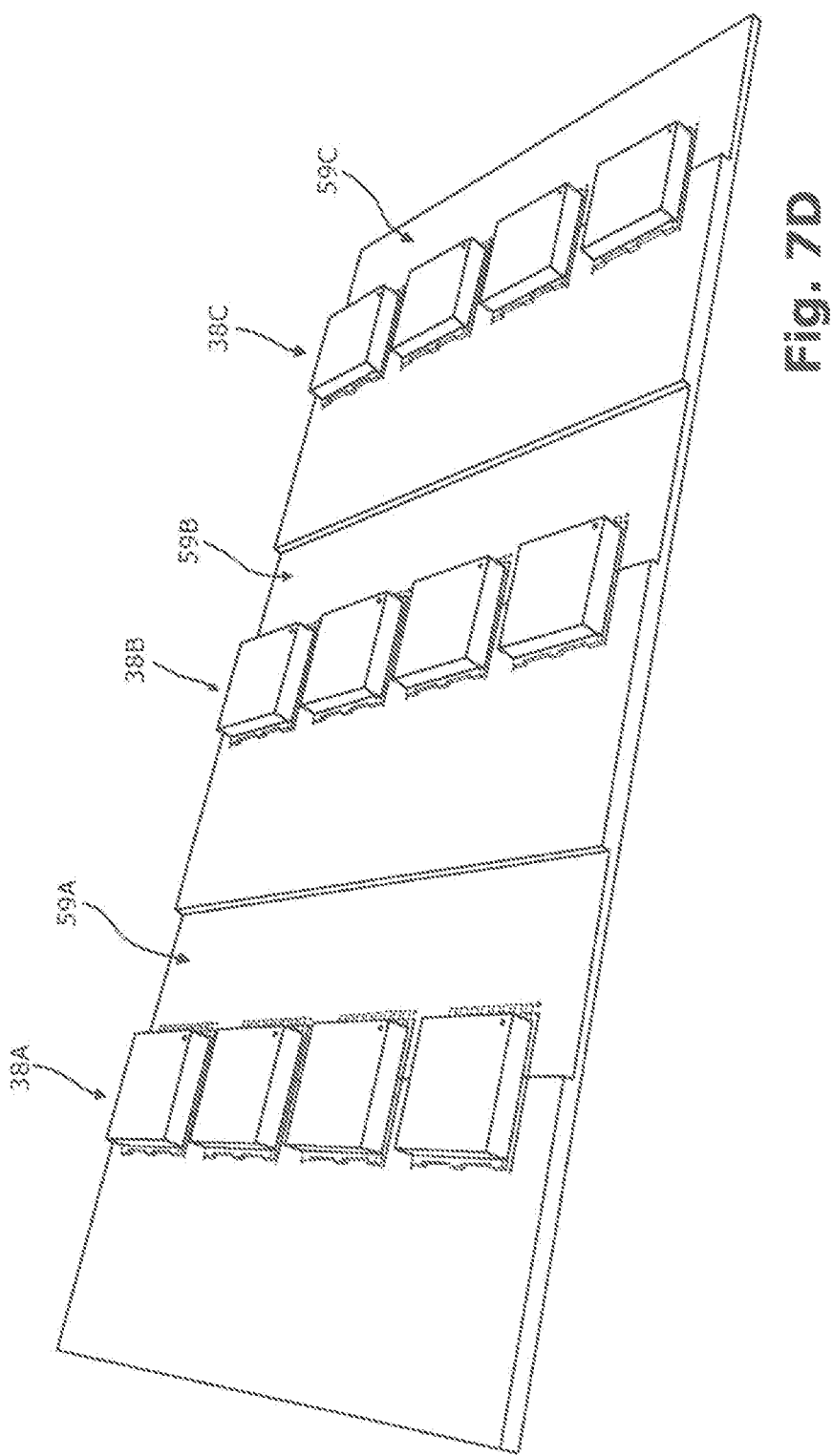

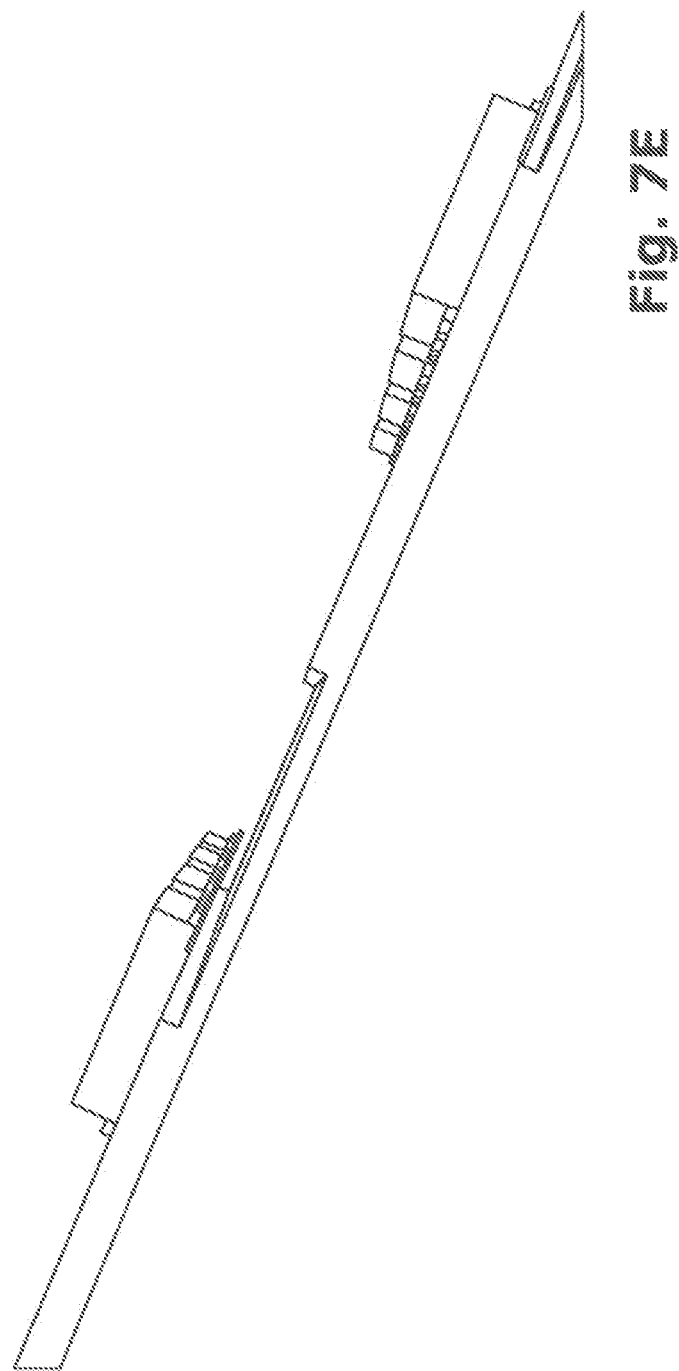

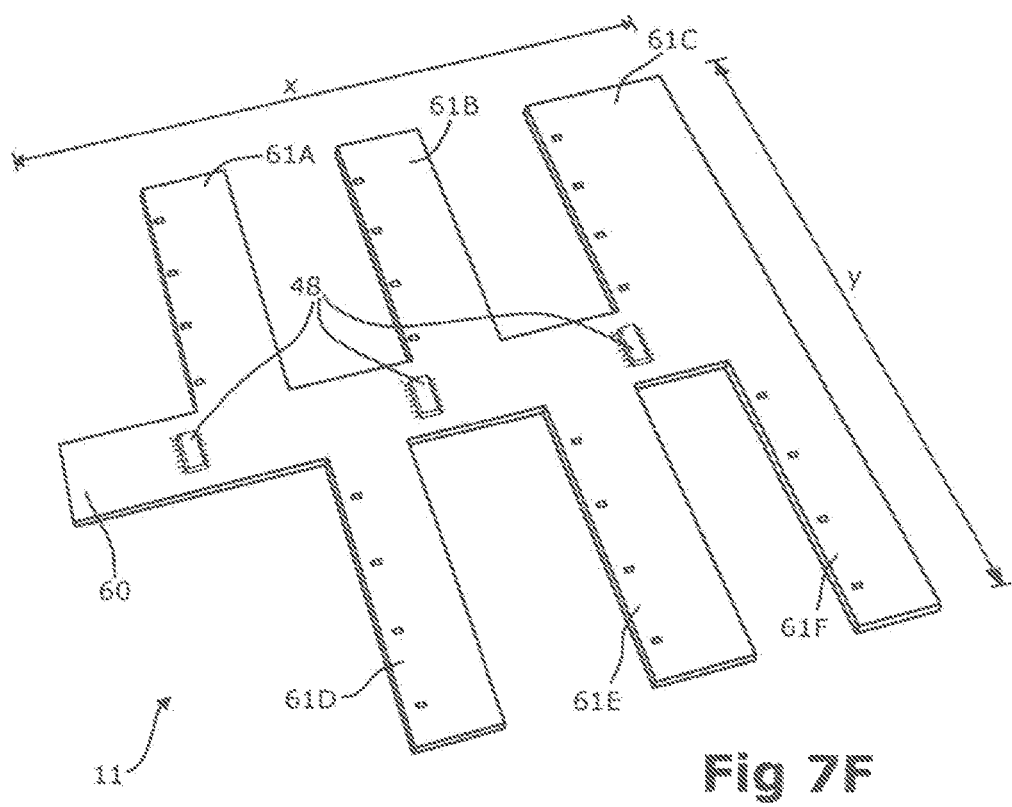

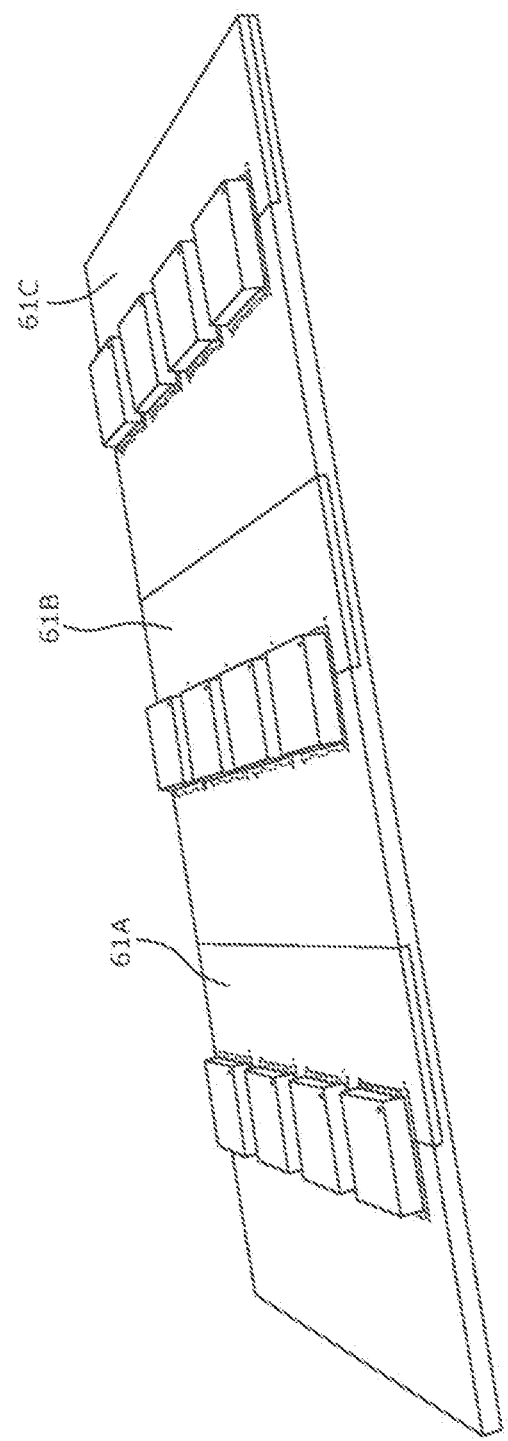

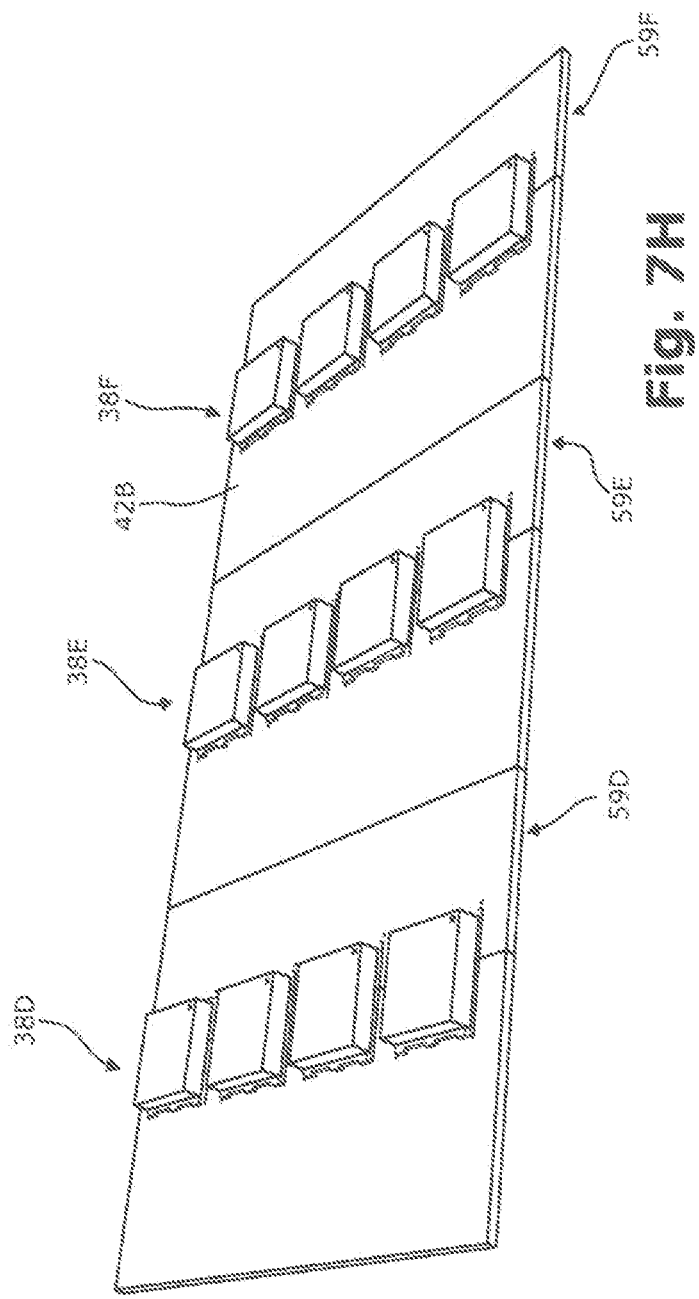

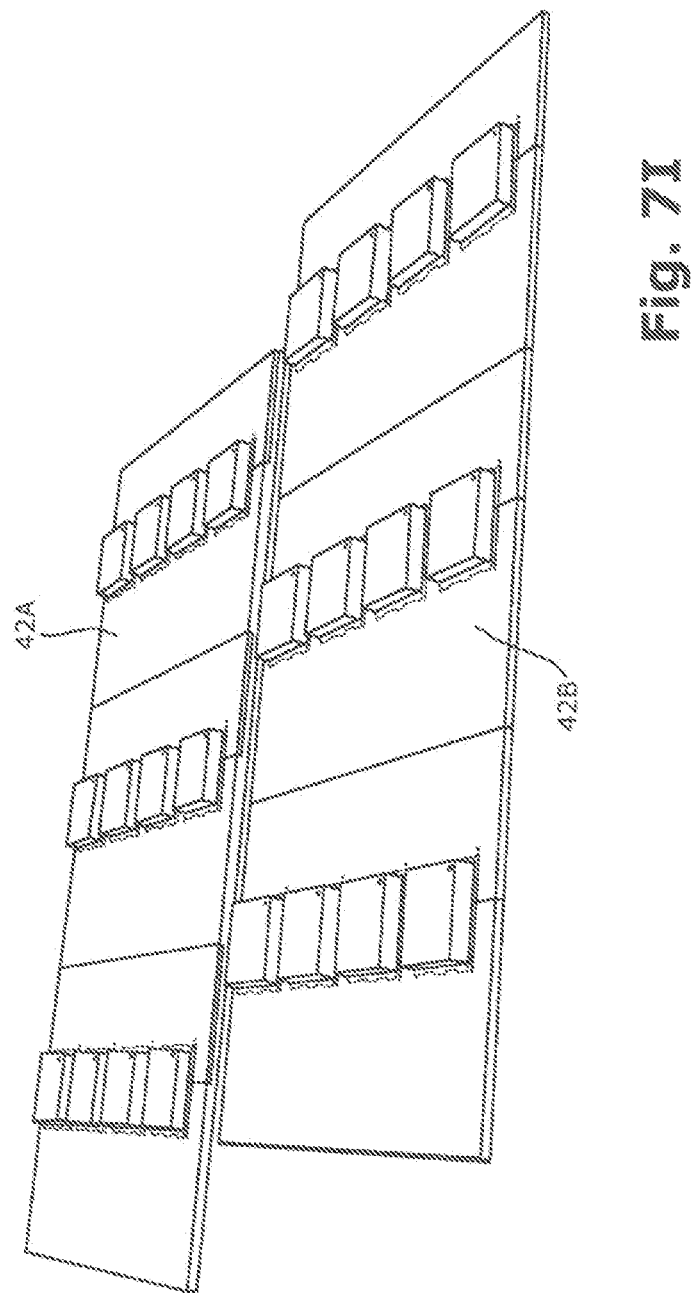

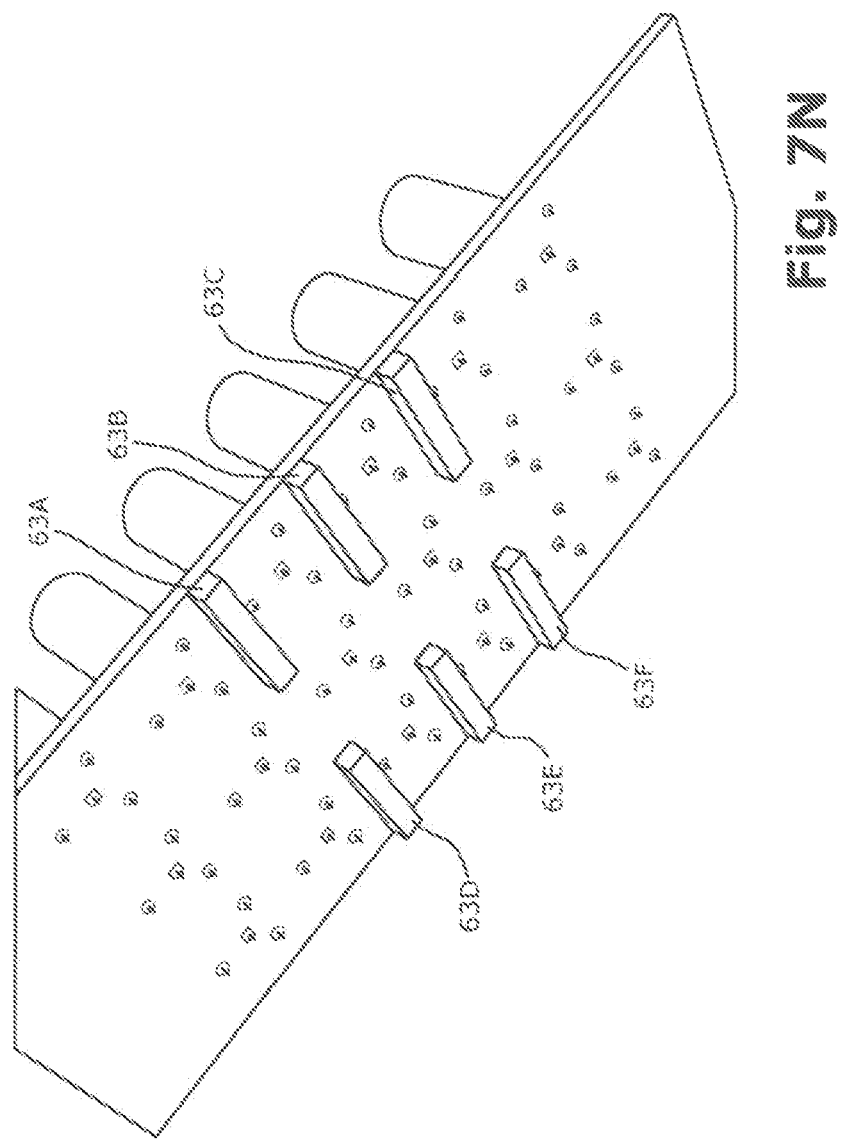

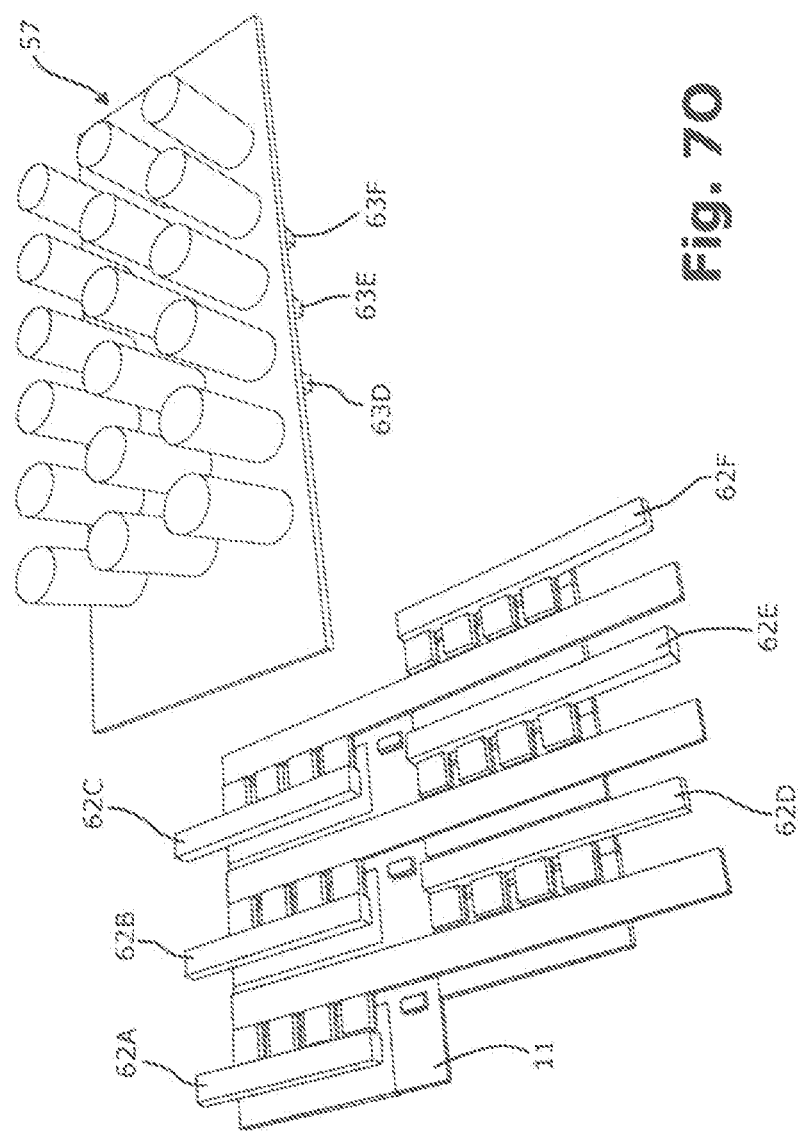

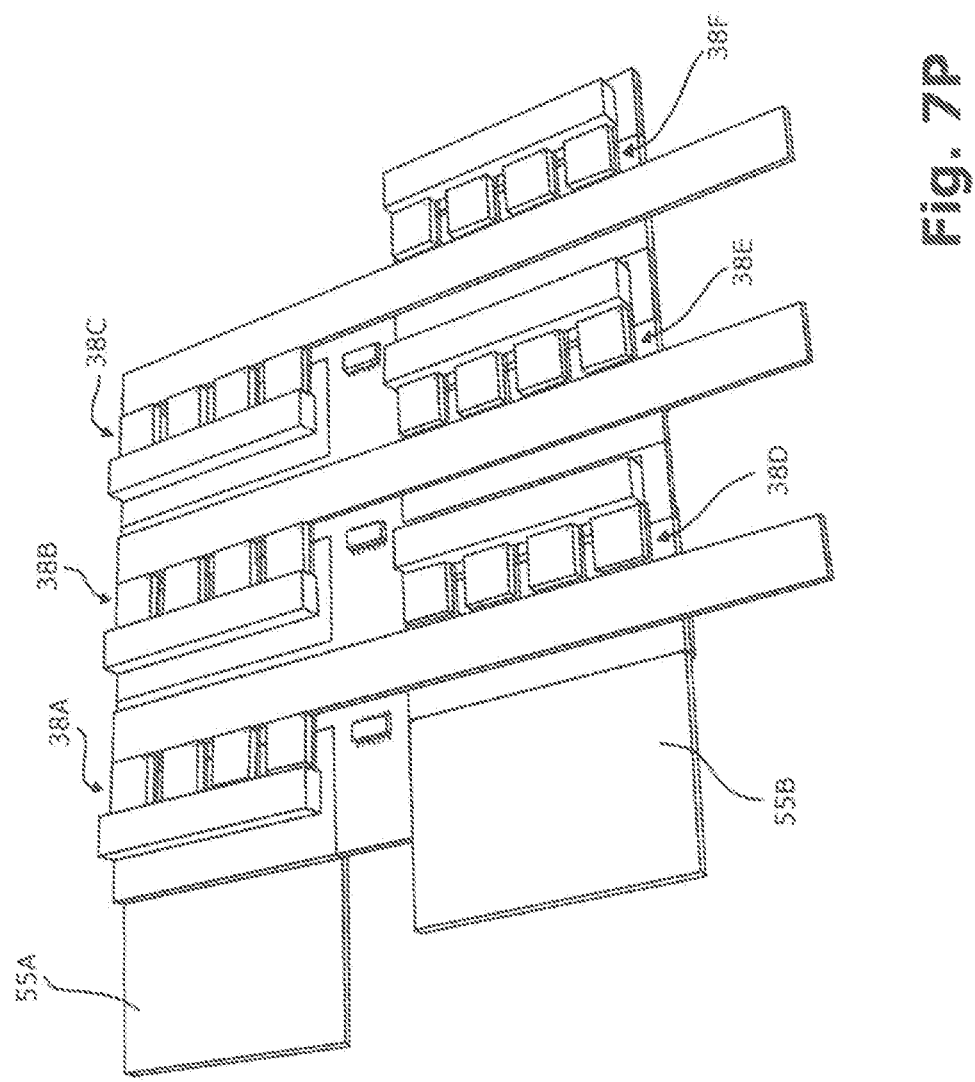

DEVICE INCLUDING A PRINTED CIRCUIT BOARD AND A METAL WORKPIECE

CROSS REFERENCE TO RELATED APPLICATION

This Utility Patent Application claims priority to German Patent Application No. 10 2014 117 943.9 filed Dec. 5, 2014; and which is incorporated herein by reference.

BACKGROUND

The invention relates to devices including a printed circuit board (PCB) and a metal workpiece. In addition, the invention relates to methods for manufacturing such devices.

Electronic devices may include PCBs and components arranged thereon. For example, semiconductor packages may be mounted on a PCB and form a part of electronic circuitry. Electronic devices and methods for manufacturing electronic devices constantly have to be improved. In particular, it may be desirable to improve an electrical and thermal performance of the electronic devices. In addition, it may be desirable to provide a mechanically stable arrangement of components mounted on a PCB.

BRIEF DESCRIPTION OF THE DRAWINGS

The accompanying drawings are included to provide a further understanding of aspects and are incorporated in and constitute a part of this description. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

FIGS. 4A to 4C illustrate schematic diagrams of devices including exemplary three phase inverters 400A to 400C.

DETAILED DESCRIPTION

Figure 1:
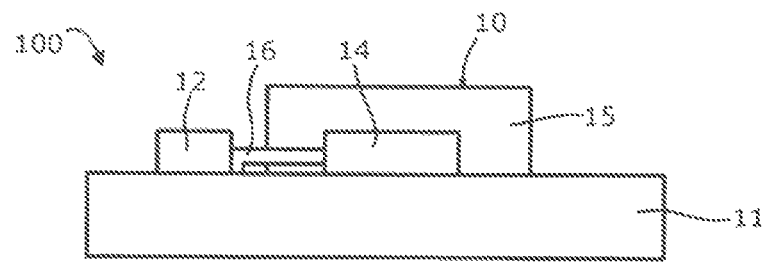
FIG. 1 illustrates a cross-sectional view of a device 100 in accordance with the disclosure.

In the following detailed description, reference is made to the accompanying drawings. The drawings show by way of illustration specific aspects in which the invention may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present invention. Hence, the following detailed description is not to be taken in a limiting sense, and the concept of the present invention is defined by the appended claims.

It is to be understood that the features of the various exemplary embodiments described herein may be combined with each other, unless specifically noted otherwise.

As employed in this description, the terms "connected", "coupled", "electrically connected" and/or "electrically coupled" are not meant to necessarily mean that elements must be directly connected or coupled together. Intervening elements may be provided between the "connected", "coupled", "electrically connected" or "electrically coupled" elements.

Further, the word "over" used with regard to e.g., a material layer formed or located "over" a surface of an object may be used herein to mean that the material layer may be located (e.g., formed, deposited, etc.) "directly on", e.g., in direct contact with, the implied surface. The word "over" used with regard to e.g., a material layer formed or located "over" a surface may also be used herein to mean that the material layer may be located (e.g., formed, deposited, etc.) "indirectly on" the implied surface with e.g., one or more additional layers being arranged between the implied surface and the material layer.

Devices and methods for manufacturing devices are described herein. Comments made in connection with a described device may also hold true for a corresponding method and vice versa. For example, if a specific component of a device is described, a corresponding method for manufacturing the device may include a step of providing the component in a suitable manner, even if such step is not explicitly described or illustrated in the figures. In addition, the features of the various aspects and examples described herein may be combined with each other, unless specifically noted otherwise.

The devices described herein may include one or more semiconductor chips. The semiconductor chips may be of different types and may be manufactured by different technologies. For example, the semiconductor chips may include integrated electrical, electro-optical or electro-mechanical circuits, or passives. The integrated circuits may be designed as logic integrated circuits, analog integrated circuits, mixed signal integrated circuits, power integrated circuits, memory circuits, integrated passives, micro-electro mechanical systems, etc. The semiconductor chips need not be manufactured from a specific semiconductor material, for example, Si, SiC, SiGe, GaAs, and, furthermore, may contain inorganic and/or organic materials that are not semiconductors, such as, for example, insulators, plastics, metals, etc. In one example, the semiconductor chips may be made of or may include an elemental semiconductor material, for example Si, etc. In a further example, the semiconductor chips may be made of or may include a compound semiconductor material, for example SiC, SiGe, GaAs, etc.

The semiconductor chips may be packaged or unpackaged. That is, the semiconductor chips may be at least partly covered by an encapsulation material or not. Semiconductor devices including an encapsulation material may be referred to as semiconductor packages. The encapsulation material may be electrically insulating and may form an encapsulation body. The encapsulation material may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material, etc. Various techniques may be used to encapsulate components of the device with the encapsulation material, for example at least one of compression molding, injection molding, powder molding, liquid molding, lamination, etc. The encapsulation material may at least partly cover further components of the device, for example at least one of a leadframe, a contact element electrically coupled to the semiconductor chip, etc.

In one example, a semiconductor package may particularly correspond to a surface mount device (SMD). Such semiconductor package may be mounted or placed directly onto a surface of a printed circuit board (PCB). An SMD may have leads or not. In general, an SMD may have at least one of short pins, leads of various styles, flat contacts, a matrix of solder balls (Ball Grid Array), etc. Preferably, devices in accordance with the disclosure may include multiple leads protruding out of an encapsulation body of the semiconductor device and providing an electrical connection to components located inside the semiconductor package. In one specific example, the leads may have a gull wing form. An SMD may particularly correspond to a TOLL (TO-Leadless) package.

The semiconductor chips may include one or more power semiconductors. Such semiconductor chips (or power semiconductor chips) may have a vertical structure, i.e., the semiconductor chips may be fabricated such that electric currents may flow in a direction perpendicular to the main faces of the semiconductor chips. A semiconductor chip having a vertical structure may have electrodes on its two main faces, i.e., on its top side and bottom side. In particular, power semiconductor chips may have a vertical structure and may have load electrodes on both main faces. For example, the vertical power semiconductor chips may be configured as power MOSFETs (Metal Oxide Semiconductor Field Effect Transistors), IGBTs (Insulated Gate Bipolar Transistors), JFETs (Junction Gate Field Effect Transistors), super junction devices, power bipolar transistors, etc. The source electrode and gate electrode of a power MOSFET may be situated on one face, while the drain electrode of the power MOSFET may be arranged on the other face. A power MOSFET may particularly be configured to operate as e.g., a switch or switching device. In addition, the devices described herein may include integrated circuits to control the integrated circuits of the power semiconductor chips.

The semiconductor chips may have contact pads (or contact elements or contact terminals or contact electrodes) which may allow electrical contact to be made with integrated circuits included in the semiconductor chips. For the case of a power semiconductor chip, a contact pad may correspond to a gate electrode, a source electrode, or a drain electrode. The contact pads may include one or more metal layers that may be applied to the semiconductor material. The metal layers may be manufactured with any desired geometric shape and any desired material composition. Any desired metal or metal alloy, for example at least one of aluminum, titanium, gold, silver, copper, palladium, platinum, nickel, chromium, and nickel vanadium, may be used as the material. The metal layers need not be homogenous or manufactured from just one material, i.e., various compositions and concentrations of the materials contained in the metal layers may be possible.

The devices described herein may include a carrier over which one or more semiconductor chips may be arranged. The devices are not restricted to only include one single carrier, but may also include multiple carriers. In addition, a semiconductor chip of the device may not exclusively be arranged over only one carrier, but may also be arranged over multiple carriers. The carrier may be manufactured of a metal, an alloy, a dielectric, a plastic, a ceramic, a combination thereof, etc. The carrier may have a homogeneous structure, but may also provide internal structures like conducting paths with an electric redistribution function. In addition, a footprint of the carrier may depend on the number and footprints of semiconductor chips arranged on the carrier. That is, the carrier may particularly include mounting areas configured to carry semiconductor chips. Examples for carriers are a die pad, a lead frame including a die pad, a ceramic substrate including one or more redistribution layers, etc.

In one example, the carrier may particularly include a leadframe that may be of any shape, size, material, etc. The leadframe may be structured such that die pads (or chip islands) and leads may be formed. During a fabrication of the devices, the die pads and the leads may be connected to each other. The die pads and the leads may also be made from one single piece. The die pads and the leads may be connected among each other by connection means with the purpose of separating some of the die pads and the leads in the course of the fabrication. Here, separating the die pads and the leads may be carried out by at least one of mechanical sawing, a laser beam, cutting, stamping, milling, etching, and any other appropriate technique. The leadframe may be electrically conductive. For example, it may be entirely fabricated from metals and/or metal alloys, in particular at least one of copper, copper alloys, nickel, iron nickel, aluminum, aluminum alloys, steel, stainless steel, and other appropriate materials. The leadframe may be plated with an electrically conductive material, for example at least one of copper, silver, palladium, gold, nickel, iron nickel, nickel phosphorus, etc. The leadframe may then be referred to as "pre-plated leadframe". Even though the leadframe may be electrically conductive, an arbitrary selection of die pads may be electrically insulated from each other.

The devices described herein may include a contact element that may be electrically coupled to the semiconductor chip. For example, the contact element may be configured to provide an electrical connection between a semiconductor chip of a semiconductor package and a component arranged externally to the semiconductor package. In one example, the electrically conductive elements may include a part of a leadframe, in particular a lead. All above comments made in connection with the above described leadframe thus may also hold true for the contact element. In another example, the contact element may include one or more contact clips. The shape of the contact clip is not necessarily limited to a specific size or a specific geometric shape. The contact clip may be fabricated by at least one of stamping, punching, pressing, cutting, sawing, milling, and any other appropriate technique. A contact between the contact element and a contact pad of a semiconductor chip may be established by any appropriate technique. In one example, the electrically conductive element may be soldered to other components, for example by employing a diffusion soldering process.

The devices described herein may include a printed circuit board (PCB). A PCB may mechanically support and electrically connect electronic components using conductive tracks, contacts pads and further technical features that may be produced from electrically conductive layers that may be formed over a non-conductive substrate. Semiconductor chips or semiconductor packages of arbitrary type may be arranged over and/or in a PCB. In one example, a PCB may be single sided (e.g., one copper layer). In further examples, a PCB may be double sided (e.g., two copper layers), or multi-layered. Conductors arranged over different layers may be connected by plated-through holes (or via connections). A PCB may include components, such as e.g., capacitors, resistors, and active devices, that may also be embedded in the substrate.

In one example, a PCB may only include electrically conductive connections (e.g., copper connections), but no embedded components. Such board may be referred to as Printed Wiring Board (PWB) or etched wiring board. In a further example, a PCB may include electronic components and may be referred to as Printed Circuit Assembly (PCA), Printed Circuit Board Assembly, or PCB Assembly (PCBA). The term PCB as used herein may be used both for bare and assembled boards. The present description is not restricted to a specific type of PCB.

In general, a PCB may be manufactured by using at least one of laminates, copper-clad laminates, resin impregnated B-stage cloth (prepreg), copper foil, conductive ink, etc. Laminate materials may include at least one of BT-Epoxy, composite epoxy material, CEM-1,5, cyanate ester, FR-2, FR-4, polyimide, PTFE, polytetrafluoroethylene (Teflon), etc.

The devices described herein may include one or more metal workpieces. In general, a metal workpiece may correspond to a delimited part of largely solid material that has been processed in some way. The metal workpiece may have been worked on or made by a hand tool or a machine. The metal workpiece may have been formed by mechanically processing an initial material by at least one of sawing, mechanical sawing, laser cutting, cutting, shaping, punching, pressing, stamping, milling, etching, etc.

The metal workpiece may be of any geometric shape and/or size. In one example, the metal workpiece may include a metal plate including a recess. In a further example, the metal workpiece may include a metal bar. In yet a further example, the metal workpiece may include three planes substantially connected in a u-shape form. The metal workpiece may include one or more contact elements protruding from a surface of the metal workpiece, wherein the metal workpiece may be electrically coupled to another component via the contact element(s), for example to a PCB. The metal workpiece may include one or more holes such that the metal workpiece may be attached to another component by one or more screws extending through the hole(s), for example to a PCB. In one example, the metal workpiece may be formed as a single piece or integral piece that may be continuously formed. In a further example, the metal workpiece may include multiple integral pieces that may be mechanically and/or electrically coupled with each other or not.

In particular, the metal workpiece may be electrically conductive. The metal workpiece may e.g., be entirely fabricated from metals and/or metal alloys, in particular at least one of copper, copper alloys, nickel, iron nickel, aluminum, aluminum alloys, steel, stainless steel, and other appropriate materials. In one example, the metal workpiece may be plated with an electrically conductive material, for example at least one of copper, silver, palladium, gold, nickel, iron nickel, and nickel phosphorus. In a further example, the metal workpiece may also include selected portions that may be electrically insulating.

The metal workpiece may be configured to provide one or more electrical couplings. In one example, the metal workpiece may be configured to provide an electrical coupling between different electronic components arranged on a PCB. In a further example, the metal workpiece may be configured to provide an electrical coupling between an electronic component arranged on a PCB and a component located external to the PCB, for example a power supply or an application, such as e.g., a motor. As such, the metal workpiece may be distinguished from other electrical connections that may have been manufactured by techniques that may differ from the techniques used for manufacturing the metal workpiece as described above. For example, the metal workpiece may be distinguished from conventional conductor tracks of a PCB that may have been manufacturing by lamination, plating, coating, printing, etc. In general, the metal workpiece may be configured to carry electrical currents of any desired magnitude. In particular, the metal workpiece may be configured to carry high electrical currents greater than one of 100 A (Ampere), 150 A, 200 A, 250 A, 300 A, 350 A, etc. Hence, when the metal workpiece may be used for providing electrical couplings on a PCB, the PCB may be free of further electrical conductors configured to carry electrical currents greater than the above mentioned values. However, in a further example, the PCB may be configured to carry electrical currents of several hundreds of Ampere through very short wide traces.

The metal workpiece may be configured to operate as a heatsink. For example, the metal workpiece may support a heat dissipation in a direction away from a component arranged on a PBC, for example a semiconductor package. For this purpose, the metal workpiece may be in direct contact with the component, in particular with an electrically conductive part of the component. In one example, the metal workpiece may be in direct contact with a contact element protruding out of an encapsulation material of a semiconductor package, thereby supporting a heat dissipation to cool the semiconductor package.

The devices described herein may be configured to operate as an inverter (or power inverter). An inverter may particularly correspond to an electronic device or circuitry that may be configured to change a direct current (DC) to an alternating current (AC). Here, input voltage, output voltage, output frequency and/or overall power handling may depend on the design of the specific device or circuitry. An inverter is not necessarily configured to produce power. Instead, power may be provided by the DC power supply. In general, a power inverter may be entirely electronic or may be a combination of mechanical effects (such as a rotary apparatus) and electronic circuitry. The example of a static inverter may not necessarily employ moving parts in the conversion process.

In one example, a device in accordance with the disclosure may operate as a three phase inverter. Three phase inverters may e.g., be used for variable-frequency drive applications and/or for high power applications such as HVDC power transmission. A basic three phase inverter may consist of three single phase inverter switches each connected to one of three load terminals. A connection to a load terminal may be referred to as phase out connection. The three phase inverter switches may be controlled by any suitable technique such as e.g., block commutation, sinusoidal pulse width modulation (PWM), field oriented control (FOC), etc.

The devices described herein may be applied in an operation of a Brushless DC (BLDC) electric motor. BLDC motors may be synchronous motors that may be powered by a DC power supply via an integrated inverter/switching power supply, which may produce an AC electric signal to drive the motor. In particular, the devices described herein may operate as such inverter/switching power supply. In the context of BLDC motors, alternating current does not necessarily imply a sinusoidal waveform, but a bi-directional current with no restriction on waveform. Additional sensors and electronics may control the inverter output amplitude and waveform (and therefore percent of DC bus usage/efficiency) and frequency (i.e. rotor speed). In one example, the rotor part of a BLDC motor may be a permanent magnet type. In a further example, the rotor part may be a switched reluctance motor or induction motor. High power brushless motors may e.g., be found in electric vehicles and hybrid vehicles. Such motors may be essentially AC synchronous motors with permanent magnet rotors or asynchronous induction motor type.

Figure 2:
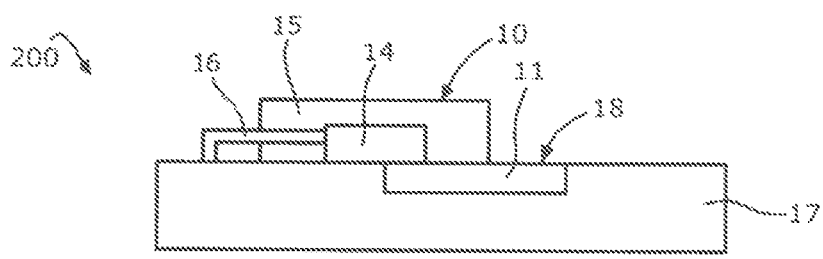
FIG. 2 illustrates a cross-sectional view of a further device 200 in accordance with the disclosure.
Figure 3:
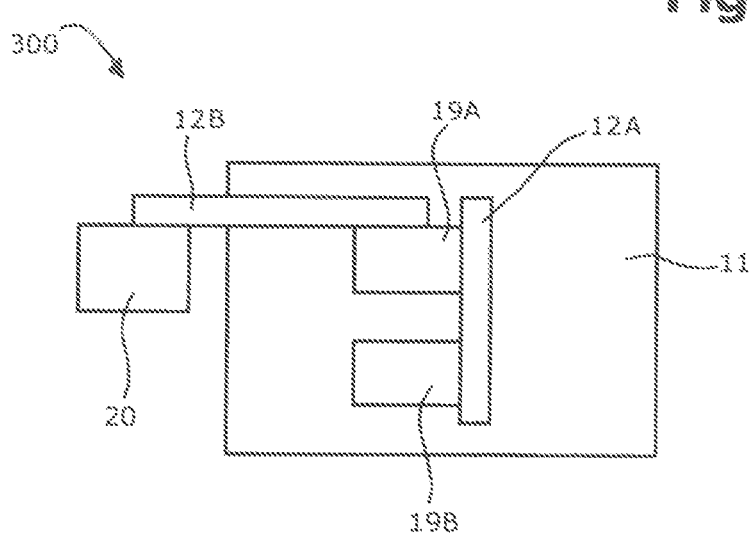
FIG. 3 illustrates a PCB layout of a further device 300 in accordance with the disclosure.

FIGS. 1 to 3 schematically illustrate devices 100 to 300 as basic concepts of the present invention. Hence, the devices 100 to 300 are illustrated in a general manner and may include further components that are not illustrated for the sake of simplicity. For example, each of the devices 100 to 300 may further include one or more components of other devices described herein. More detailed devices similar to the devices 100 to 300 are described below.

FIG. 1 illustrates a cross-sectional view of a device 100 in accordance with the disclosure. The device 100 includes a semiconductor package 10, a PCB 11 and a metal workpiece 12. The semiconductor package 10 includes a semiconductor chip 14, an encapsulation material 15 at least partly covering the semiconductor chip 14, and a contact element 16 electrically coupled to the semiconductor chip 14 and protruding out of the encapsulation material 15. The semiconductor package 10 is mounted on the PCB 11, and the contact element 16 of the semiconductor package 10 is electrically coupled to the PCB 11. The metal workpiece 12 is mounted on the PCB 11 and electrically coupled to the contact element 16 of the semiconductor package 10.

FIG. 2 illustrates a cross-sectional view of a device 200 in accordance with the disclosure. The device 200 includes a metal plate 17 including a recess 18. The device 200 further includes a PCB 11, wherein a part of the PCB 11 is arranged in the recess 18 of the metal plate 17. FIG. 2 only illustrates the part of the PCB 11 that is arranged in the recess 18 while possible further parts of the PCB 11 are not illustrated for the sake of simplicity. The device 200 further includes a semiconductor package 10 that includes a semiconductor chip 14, an encapsulation material 15 at least partly covering the semiconductor chip 14, and a contact element 16 electrically coupled to the semiconductor chip 14 and protruding out of the encapsulation material 15. The semiconductor package 10 is mounted on the metal plate 17 and on the part of the PCB 11 arranged in the recess 18 of the metal plate 17. The contact element 16 of the semiconductor package 10 is electrically coupled to the metal plate 17.

FIG. 3 illustrates a PCB layout of a further device 300 in accordance with the disclosure. The device includes a PCB 11, a first surface mount switching device 19A mounted on the PCB 11 and a second surface mount switching device 19B mounted on the PCB 11. The device 300 further includes a first metal workpiece 12A configured to provide an electrical coupling between the first surface mount switching device 19A and the second surface mount switching device 19B. In addition, the device 300 includes a second metal workpiece 12B configured to provide an electrical connection between a power supply 20 and at least one of the first surface mount switching device 19A and the second surface mount switching device 19B.

FIG. 4A illustrates a schematic diagram of a device including an example three phase inverter 400A. The device may include multiple components that may be connected as illustrated in FIG. 4A. In particular, the device may include an (electric) power supply 21, a BLDC motor 22 and the three phase inverter 400A connected in between. The power supply 21 may particularly include a DC power supply, for example a battery. The three phase inverter 400A is not restricted to be used in a BLDC motor application, but may also be applied to other types of motors and passive loads. In the example of FIG. 4A, the three phase inverter 400A may include all components that are illustrated to be arranged between the power supply 21 and the BLDC motor 22. That is, the power supply 21 and the BLDC motor 22 may not necessarily be seen as a part of the three phase inverter 400A.

The three phase inverter 400A may include multiple sections that may be arranged in parallel, namely a (in particular electrolytic) capacitor 23, a (in particular multilayer ceramic (MLC)) capacitor 24, a first half bridge circuit 25A, a second half bridge circuit 25B, and a third half bridge circuit 25C. An example operation of the half bridge circuits 25A to 25C is described in connection with FIG. 8. In addition, the three phase inverter 400A may include multiple (in particular electrolytic) capacitors 26A to 27C, wherein each capacitor may be connected in parallel to a respective one of the half bridge circuits 25A to 25C. For example, a first capacitor 26A and a second capacitor 27A may be connected in parallel to the first half bridge circuit 25A, respectively.

The first half bridge circuit 25A may include a first switch (or switching device) 28A and a second switch 29A connected in series. Here, the first switch 28A may operate as a high side switch, and the second switch 29A may operate as a low side switch. Each one of the first switch 28A and the second switch 29A may be implemented by means of an appropriate electronic component. In the example of FIG. 4A, each of the switches 28A and 29A may include a power MOSFET. The drain of the first switch 28A may be connected to a positive terminal of the power supply 21, the source of the first switch 28A may be connected to the drain of the second switch 29A, and the source of the second switch 29A may be connected to a negative terminal of the power supply 21. Each of the gate of the first switch 28A and the gate of the second switch 29A may be connected to a gate resistor (not illustrated). In a further example, each one of the switches 28A and 29A may include multiple power MOSFETs that may be arranged in parallel. Each or both of the second half bridge 25B and the third half bridge 25C may be similar to the first half bridge 25A.

The three phase inverter 400A may further include three phase out connections 30A to 30C. Each of the phase out connections 30A to 30C may be configured to provide an electrical connection between a node arranged between the switches of the respective one of the half bridge circuits 25A to 25C and a respective input of the BLDC motor 22.

Figure 4B:
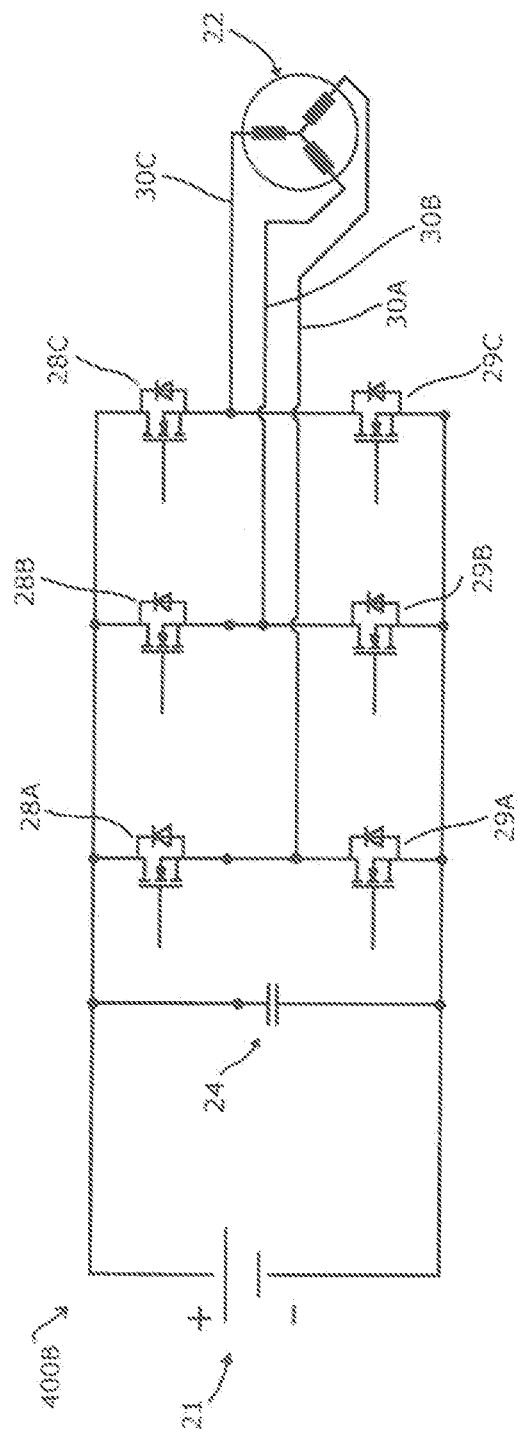

FIG. 4B illustrates a schematic diagram of a further device including a further example three phase inverter 400B. The three phase inverter 400B may operate similar to the three phase inverter 400A of FIG. 4A. The three phase inverters 400A and 400B may include similar components. In the example of FIG. 4B, the three phase inverter 400B may not necessarily include the capacitor 23 and the capacitors 26A to 27C of FIG. 4A. In this arrangement, the missing capacitors may be placed on a separate PCB, thus making the inverter power stage more compact.

Figure 4C:
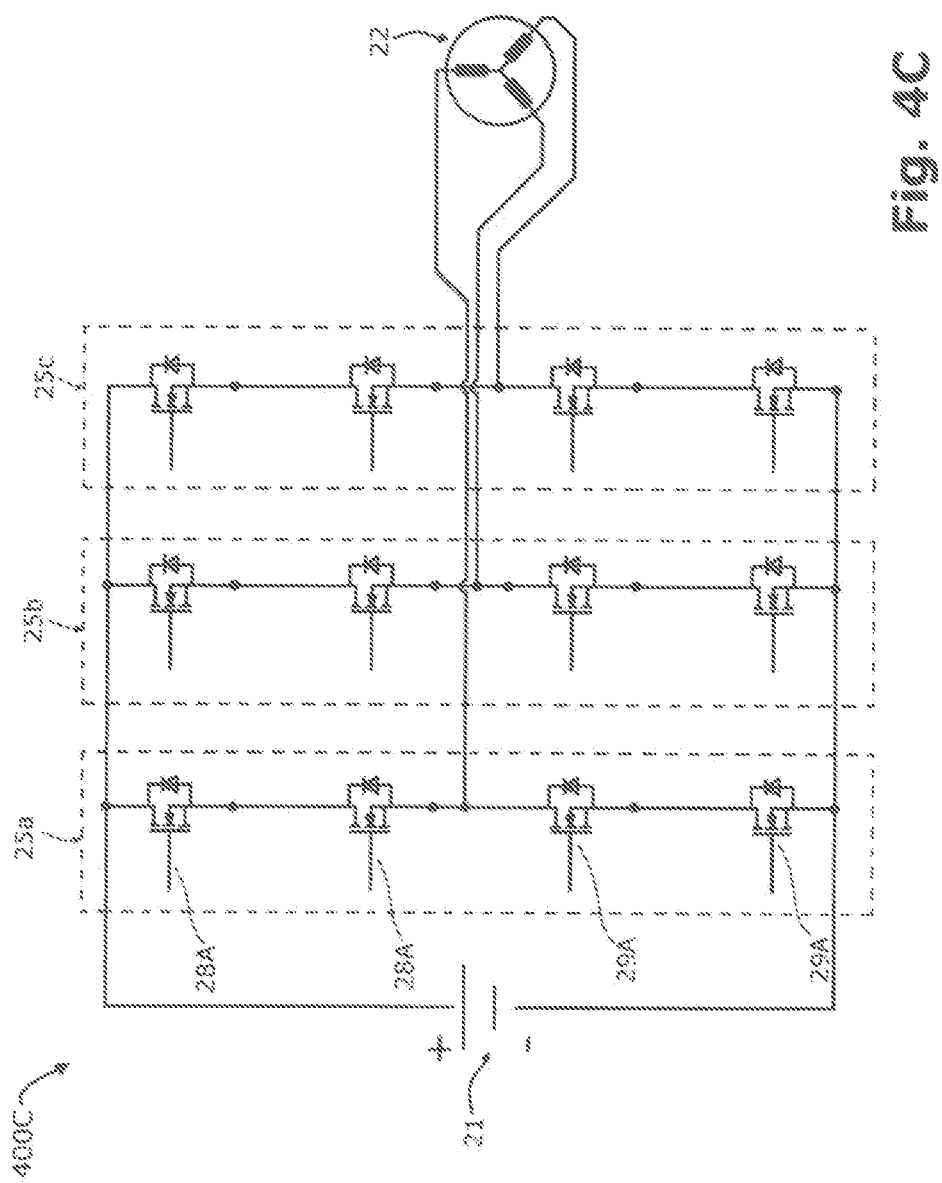

FIG. 4C illustrates a schematic diagram of a further device including a further example three phase inverter 400C. The three phase inverter 400C may operate similar to each one of the three phase inverters 400A and 400B of FIGS. 4A and 4B. In contrast to FIG. 4B, each high side switch of the half bridges 25A to 25C of the three phase inverter 400C may particularly include two power MOSFETs 28A. In addition, each low side switch of the half bridges 25A to 25C of the three phase inverter 400C may particularly include two power MOSFETs 29A. The three phase inverter 400C of FIG. 4C may also be referred to as multilevel inverter.

FIGS. 5A to 5X illustrate a method for manufacturing a device in accordance with the disclosure. For example, the manufactured device may be configured to operate similar to the three phase inverters of FIGS. 4A and 4B. In addition, the layout of the device manufactured by the method of FIGS. 5A to 5X may serve as a basis for manufacturing devices that may be configured to operate similar to the three phase inverter of FIG. 4C. For the sake of simplicity and for illustrative purposes, one or more of the FIGS. 5A to 5X may not necessarily include all components that may be required for the illustrated method step.

In FIG. 5A, a PCB 11 including multiple slots (or sockets or connections or connection points) may be provided. Electronic components may be arranged on the PCB 11 and connected to the slots such that a circuitry for a three phase inverter may be provided. For example, a resulting three phase inverter may correspond to one of the three phase inverters of FIGS. 4A and 4B. It is noted that an internal circuitry including connections between the slots of the PCB 11 is not explicitly illustrated for the sake of simplicity. However, the PCB 11 may particularly be configured to provide all electrical connections that may be required to realize one of the three phase inverters of FIGS. 4A and 4B.

The PCB 11 may include multiple slots that may be arranged in an exemplary capacitor bank layout of FIG. 5A. In particular, the PCB 11 may include a set of slots 31 that may be configured to connect the PCB 11 to multiple electrolytic capacitors that may e.g., be connected in parallel. In FIG. 5A, the slots 31 may be located in large circles. Referring back to FIG. 4A, the set of slots 31 may be associated with the capacitor 23. The PCB 11 may further include a set of slots 32 that may be configured to connect the PCB 11 to multiple multi-layer ceramic capacitors (MLCC) that may e.g., be connected in parallel. In FIG. 5A, the slots 32 are located in small rectangles that may be arranged between the large circles of the slots 31. Referring back to FIG. 4A, the set of slots 32 may be associated with the capacitor 24.

Further, the PCB 11 may include multiple sets of slots 33A to 33F that may be configured to connect the PCB 11 to multiple electrolytic capacitors that may e.g., be connected in parallel. In FIG. 5A, the slots 33A to 33F may be located in small circles. Referring back to FIG. 4A, a first set of slots 33A (including eight small circles) may be associated with the capacitor 26A, a second set of slots 33B may be associated with the capacitor 26B, a third set of slots 33C may be associated with the capacitor 26C, a fourth set of slots 33D may be associated with the capacitor 27A, a fifth set of slots 33E may be associated with the capacitor 27B, and a sixth set of slots 33F may be associated with the capacitor 27C.

The PCB 11 may further include multiple slots that may be arranged in the example switching devices layout of FIG. 5A. The PCB 11 may include multiple sets of slots 34A to 34F that may be configured to connect the PCB 11 to multiple switching devices. In particular, each set may include multiple slots that may be configured to connect the PCB 11 to multiple MOSFETs that may be connected in parallel. In the example of FIG. 5A, each set may include slots for connecting four MOSFETs in parallel. However, in further examples, an arbitrary other number of MOSFETs may be connected in parallel. The set of slots 34A may include connections for four MOSFETs, wherein each MOSFET may be arranged over a location indicated by a rectangle. On the left side and the right side of each rectangle, small lines indicate possible connections between leads of a MOSFET package arranged over the rectangle and the PCB 11. Each rectangle may be neighbored by two slots that may be configured to provide a connection to the terminals of the MOSFETs. In particular, the slot on the left of a rectangle may be associated with a drain contact of the MOSFET while the slot on the right of the rectangle may be associated with a source contact of the MOSFET. The gate of a MOSFET may be connected to a gate driver (not illustrated) that may e.g., be arranged on the backside of the PCB 11. Referring back to FIG. 4A, a first set of slots 34A may be associated with the switch 28A, a second set of slots 34B may be associated with the switch 28B, a third set of slots 34C may be associated with the switch 28C, a fourth set of slots 34D may be associated with the switch 29A, a fifth set of slots 34E may be associated with the switch 29B, and a sixth set of slots 34F may be associated with the switch 29C.

Figure 5B:
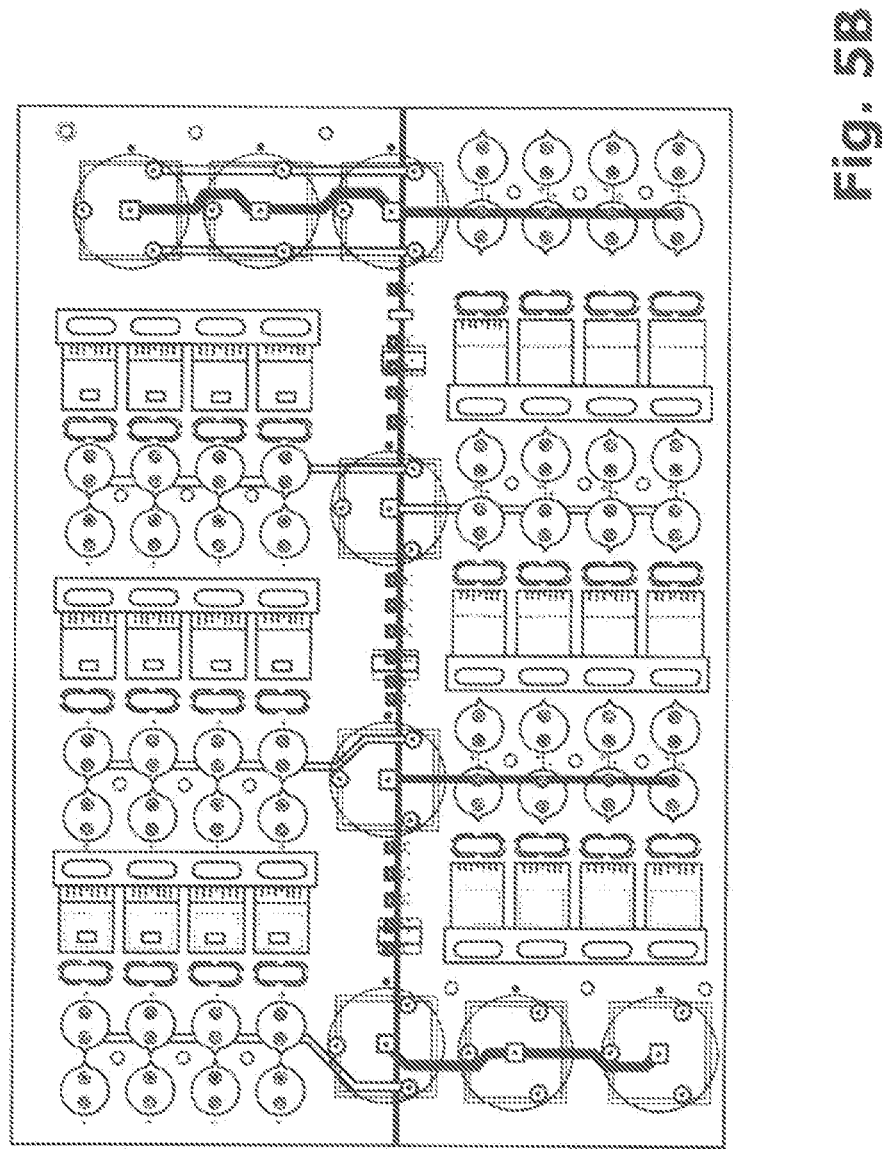
FIGS. 5A to 5X illustrate a method for manufacturing a device in accordance with the disclosure. The device may operate similar to the three phase inverters of FIGS. 4A to 4C.

FIG. 5B illustrates the PCB 11 of FIG. 5A wherein positive pole connections of the PCB 11 are highlighted. That is, FIG. 5B is meant to illustrate which connections on the PCB 11 may be connected to a positive terminal of an electric power supply.

Figure 5C:
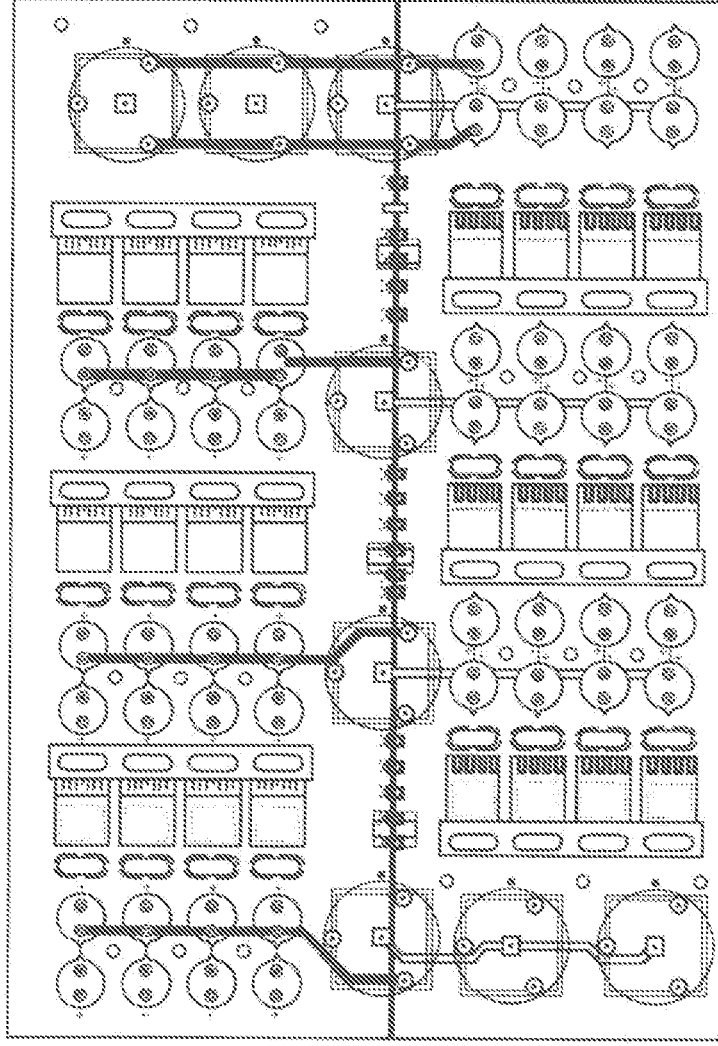

FIG. 5C illustrates the PCB 11 of FIG. 5A wherein negative pole connections of the PCB 11 are highlighted. That is, FIG. 5C is meant to illustrate which connections on the PCB 11 may be connected to a negative terminal of an electric power supply.

FIG. 5D illustrates the PCB 11 of FIG. 5A including multiple electronic components that may be arranged over the PCB 11. The electronic components may be connected to the slots of the PCB 11 that have been described in connection with FIG. 5A. In particular, a set of electrolytic capacitors 35 illustrated as large cylinders may be connected to the set of slots 31. Referring back to FIG. 4A, the set of electrolytic capacitors 35 may correspond to the capacitor 23. Further, a set of MLCC 36 illustrated as small blocks may be connected to the set of slot 32. Referring back to FIG. 4A, the set of MLCC 36 may correspond to the capacitor 24.

In addition, multiple sets of electrolytic capacitors 37A to 37F illustrated as small cylinders may be connected to the multiple sets of slots 33A to 33F. Referring back to FIG. 4A, a first set of electrolytic capacitors 37A may correspond to the capacitor 26A, a second set of electrolytic capacitors 37B may correspond to the capacitor 26B, a third set of electrolytic capacitors 37C may correspond to the capacitor 26C, a fourth set of electrolytic capacitors 37D may correspond to the capacitor 27A, a fifth set of electrolytic capacitors 37E may correspond to the capacitor 27B, and a sixth set of electrolytic capacitors 37F may correspond to the capacitor 27C.

Further, multiple sets of switching devices in form of MOSFETs 38A to 38F illustrated by small packages may be connected to the multiple sets of slots 34A to 34F. Referring back to FIG. 4A, a first set of MOSFETs 38A (e.g. connected in parallel) may correspond to the switch 28A, a second set of MOSFETs 38B may correspond to the switch 28B, a third set of MOSFETs 38C may correspond to the switch 28C, a fourth set of MOSFETs 38D may correspond to the switch 29A, a fifth set of MOSFETs 38E may correspond to the switch 29B, and a sixth set of MOSFETs 38F may correspond to the switch 29C.

In FIG. 5E, a metal workpiece 39 may be provided. In the example of FIG. 5E, the metal workpiece 39 may correspond to a metal bar 39 that may e.g., be made of copper. The metal workpiece 39 may be configured to carry high electrical currents greater than e.g., 100 A. A dimension "a" of the metal workpiece 39 may lie in a range between about 1 mm and about 4 mm, more particular, between about 1.5 mm and about 3.5 mm, and even more particular between about 2 mm and about 3 mm. The metal workpiece 39 may have multiple contact elements 40 that may protrude from a surface of the metal bar 39. Each of the contact elements 40 may be electrically connected to the PCB 11 as will become apparent later on. In the example of FIG. 5E, the metal workpiece 39 may include two sets of four contact elements 40 that may be connected to the PCB 11 as illustrated and described in connection with FIG. 5F.

FIG. 5F illustrates a PCB 11 that may be similar to the PCB 11 of FIG. 5D. However, compared to FIG. 5D, the arrangement of the high side switches 38A to 38C and the low side switches 38D to 38F may be laterally shifted such that the source terminals of the high side switches 38A to 38C and the drain terminals of the low side switches 38D to 38F may be arranged in one line, respectively. In addition, three metal workpieces 39A to 39C may be connected to slots of the PCB 11. Each of the metal workpieces may be similar to the metal workpiece 39 of FIG. 5E. A first metal workpiece 39A may be configured to provide an electrical connection between the source contacts of the set of MOSFETs 38A and the drain contacts of the set of MOSFETs 38D. Referring back to FIG. 4A, the first metal workpiece 39A may thus correspond to the electrical connection between the source of the switch 28A and the drain of the switch 29A. That is, the first metal workpiece 39A may be configured to provide an electrical coupling between a high side switch and a low side switch.

A second metal workpiece 39B may be configured to provide an electrical connection between the source contacts of the set of MOSFETs 38B and the drain contacts of the set of MOSFETs 38E. Referring back to FIG. 4A, the first metal workpiece 39B may thus correspond to the electrical connection between the source of the switch 28B and the drain of the switch 29B. A third metal workpiece 39C may be configured to provide an electrical connection between the source contacts of the set of MOSFETs 38C and the drain contacts of the set of MOSFETs 38F. Referring back to FIG. 4A, the first metal workpiece 39C may thus correspond to the electrical connection between the source of the switch 28C and the drain of the switch 29C.

Each of the metal workpieces 39A to 39C may be configured to provide a phase out connection of a three phase inverter that is to be manufactured. Each of the phase out connections may be connected to a passive load, for example a BLDC motor. Connections between the metal workpieces 39A to 39C and the terminals of the load may e.g. be provided by one or more wires. Referring back to FIG. 4A, the first metal workpiece 39A may serve as the left node of the first phase out connection 30A, the second metal workpiece 39B may serve as the left node of the second phase out connection 30B, and the third metal workpiece 39C may serve as the left node of the third phase out connection 30C.

FIG. 5G illustrates an example connection between a contact element 40 of one of the metal workpieces 39 and the PCB 11. For example, FIG. 5G may relate to a connection between the first metal workpiece 39A and a drain contact of a MOSFET of the set of MOSFETs 38D. However, one or more of the further connections between the metal workpieces 39 and the PCB 11 may be similar. The PCB 11 may include a slot (or opening) that may expose the electrically conductive PCB bottom arranged next to the drain contact of the MOSFET 38. For example, a connection between the contact element 40 of the metal workpiece 39 and the bottom of the PCB 11 may be provided by at least one of a wave soldering technique and a reflow soldering process. Further, a connection between the package of the MOSFET 38 and the PCB 11 may be provided by a reflow soldering process.

The contact element 40 may be in direct contact with at least one of the contact elements (or leads) 16 of the MOSFET 38 that may protrude out an encapsulation material of the MOSFET 38. For example, a connection between the lead 16 of the MOSFET 38 and the PCB bottom may be provided by a wave soldering technique.

In the example of FIG. 5G, a surface on the right of the metal workpiece 39 may be flush with a side surface on the left of the MOSFET 38. In addition, the contact element 40 of the metal workpiece 39 may be formed such that the lead 16 of the MOSFET 38 may fit between the metal workpiece 39 and the contact element 40. That is, an upper surface of the lead 16 may be flush with a lower surface of the metal bar of the metal workpiece 39, and a left side surface of the lead 16 may be flush with a right surface of the contact element 40 of the metal workpiece 39.

From FIG. 5G, it can be seen that the metal workpiece 39 may have multiple functions. First, the metal workpiece 39 may be configured to provide an electrical coupling between electrical components that may be arranged over the PCB 11. In the example of FIG. 5G, the metal workpiece 39 may e.g., provide an electrical connection between a high side switch and a low side switch of the three phase inverter circuitry. Second, the metal workpiece 39 may serve as a heatsink that may be configured to dissipate heat in a direction away from an electric component to which the metal workpiece 39 may be connected. In the example of FIG. 5G, a heat dissipation may particularly be increased because the contact element 40 of the metal workpiece 39 is in direct contact with the contact element (or lead) 16 of the MOSFET 38. Third, the metal workpiece 39 may provide a phase out connection as discussed above, for example to a passive load. Fourth, the metal workpiece 39 may provide a stable mechanical connection between the semiconductor package of the MOSFET 38 and the PCB 11. In the example of FIG. 5G, the contact element 16 of the MOSFET 38 may be securely fixed to the PCB 11 due to its arrangement in the recess between the metal bar of the metal workpiece 39 and the contact element 40 of the metal workpiece 39.

Figure 5H:
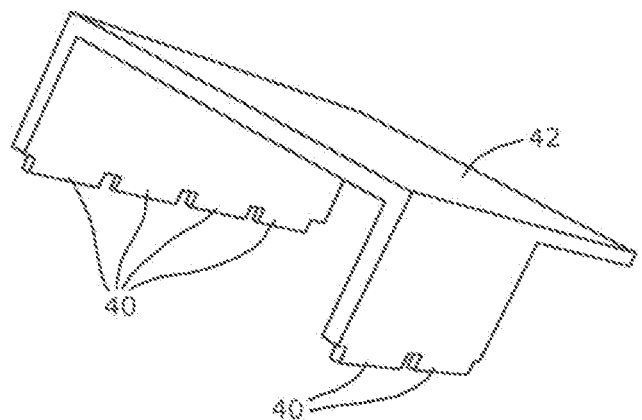

In FIG. 5H, a further metal workpiece 42 may be provided. The metal workpiece 42 may include three planes that may be substantially connected in a u-shape form. In the example of FIG. 5H, an angle between connected planes of the metal workpiece 42 may be about 90 degrees. More general, the angle may also lie in a range between about 75 degrees and 105 degrees, more particular between about 80 degrees and 100 degrees, and even more particular 85 degrees and 95 degrees. The metal workpiece 42 may be formed as a single piece and/or may be made of copper. Regarding electrical and material properties, the metal workpiece 42 may be similar to the metal workpieces 39A to 39C described above. The metal workpiece 42 may have multiple contact elements 40 that may protrude from one or more of the planes forming the metal workpiece 42. Each of the contact elements 40 may be configured to be electrically connect the metal workpiece 42 to the PCB 11 as will become apparent later on. In the example of FIG. 5H, the metal workpiece 42 may include two contact elements 40 that may be arranged over an exposed side surface of a first plane and four contact elements 40 that may be arranged over an exposed side surface of a second plane.

Figure 5I:
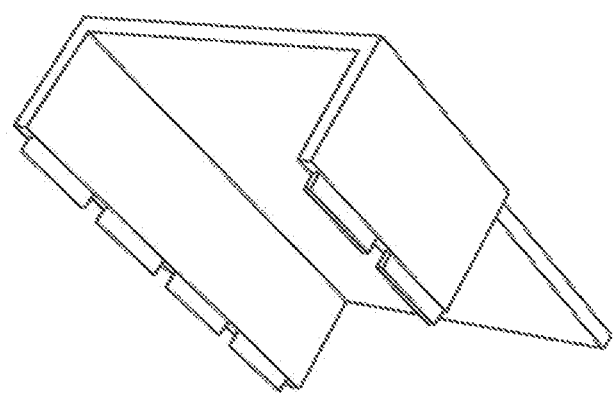
Figure 5J:
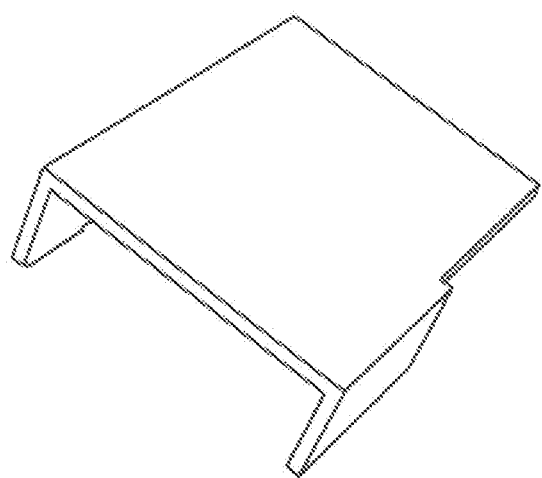
Figure 5K:
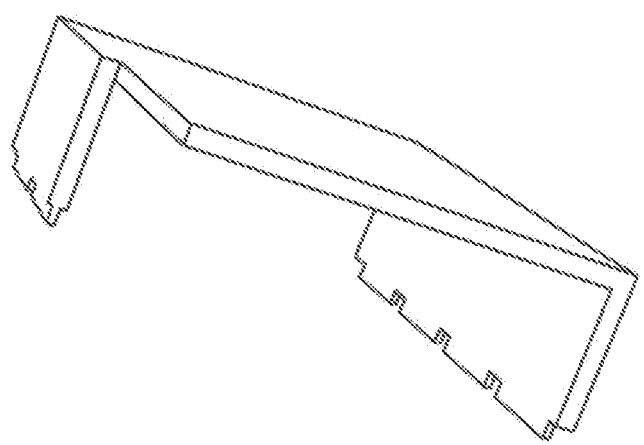

FIGS. 5I to 5K illustrate the metal workpiece 42 of FIG. 5H from multiple perspectives that may be obtained by a rotation of FIG. 5H.

In FIG. 5L, two metal workpieces 42A and 42B similar to the metal workpiece 42 of FIG. 5H may be combined. The first metal workpiece 42A may be similar to the second metal workpiece 42B, but rotated by an angle of 180 degrees. The two metal workpieces 42A and 42B may be mechanically and/or electrically connected to each other or not. A combination of the two metal workpieces 42A and 42B may correspond to one metal workpiece including three sets of contact elements 40A, 40B, 40C, each set including four contact elements.

FIG. 5M illustrates a further step in which the sets of contact elements 40A to 40C of the metal workpieces 42A and 42B may be connected to the drain contacts of the set of MOSFETs 38A to 38C representing the high side switches of the discussed three phase inverter circuitry. In the example of FIG. 5M, an illustration of further components is omitted for the sake of simplicity and for illustrative reasons. In particular, the first set of contact elements 40A may be connected to the drain contacts of the set MOSFETs 38A, the second set of contact elements 40B may be connected to the drain contacts of the set MOSFETs 38B, and the third set of contact elements 40C may be connected to the drain contacts of the set MOSFETs 38C.

The metal workpieces 42A and 42B may thus provide a close electrical and thermal connection between the four drain MOSFET connection of all three phase out connections of a three phase inverter as e.g., illustrated in FIG. 4A. In addition, the metal workpieces 42A and 42B may be configured to provide an electrical connection between the drain contacts of the set of MOSFETs 38A to 38C and a terminal of a power supply. For example, such connection may be established by a wire connected to a terminal of the power supply and soldered to the metal workpieces 42A and 42B. Referring back to FIG. 4A, the metal workpieces 42A and 42B may correspond to the electrical connections between the positive terminal of the power supply 21 and the drain contacts of the high side switches of the half bridge circuits 25A to 25C.

Figure 5N:
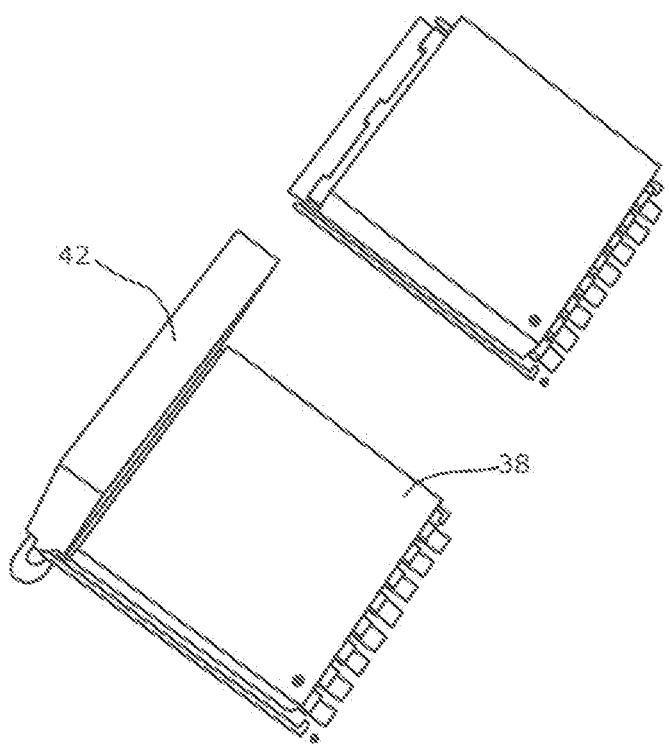

FIGS. 5N and 5O illustrate more detailed views of the connection between one of the metal workpieces 42A, 42B and the drain connection of one of the MOSFETs 38. The connection illustrated in FIG. 5O may be similar to the connection discussed with regard to FIG. 5G. Comments made in connection with FIG. 5G may thus also hold true for FIG. 5O.

FIG. 5P illustrates a further method in which sets of contact elements 40D to 40F of a metal workpiece 42 may be connected to the source contacts of the set of MOSFETs 38D to 38F representing the low side switches of the discussed three phase inverter circuitry. Again, an illustration of further components of the device is omitted for the sake of simplicity. The metal workpiece 42 of FIG. 5P may be similar to a combination of the metal workpieces 42A and 42B of FIG. 5L. In particular, a first set of contact elements 40D may be connected to the source contacts of the set MOSFETs 38D, a second set of contact elements 40E may be connected to the source contacts of the set MOSFETs 38E, and a third set of contact elements 40F may be connected to the source contacts of the set of MOSFETs 38F.

The metal workpiece 42 of FIG. 5P may thus provide a close electrical and thermal connection between the four source MOSFET connection of all three phase out connections of a three phase inverter as e.g., illustrated in FIG. 4A. In addition, the metal workpiece 42 may be configured to provide an electrical connection between the source contacts of the set of MOSFETs 38D to 38F and a terminal of a power supply. For example, such connection may be established by a wire connected to a terminal of the power supply and soldered to the metal workpieces 42. Referring back to FIG. 4A, the metal workpiece 42 may correspond to the electrical connections between the negative terminal of the power supply 21 and the source contacts of the low side switches of the half bridge circuits 25A to 25C.

FIG. 5Q illustrates a bottom view of the metal workpiece 42 connecting the source contacts of the MOSFETs 38. As can be seen from FIG. 5Q, the metal workpiece 42 may be formed such that gate contacts 43 of the MOSFETs 38 may remain exposed from the metal workpiece 42.

FIG. 5R illustrates the PCB 11 of FIG. 5D. In addition, the illustrated arrangement may include three metal workpieces 39A to 39C described in connection with FIG. 5F and the metal workpieces 42 described in connection with FIGS. 5M and 5P. Referring back to FIG. 4A, the arrangement of FIG. 5R may correspond to the three phase inverter 400A arranged between the power supply 21 and the BLDC motor 22.

FIGS. 5S to 5V illustrate additional methods for providing a connection between a heatsink and the arrangement of FIG. 5R. In particular, the provided connection may be a thermal connection, but not an electrical connection.

In one step, the PCB 11 as described in connection with foregoing figures may be provided. In FIG. 5S, for illustrative purposes, the PCB 11 is illustrated without switching devices arranged on the slots 34A to 34F of FIG. 5A. Instead, FIG. 5S illustrates a perforation of the PCB 11 including sets of opening holes 44A to 44F at the positions of the slots 34A to 34F of FIG. 5A. Each of the sets of opening holes 44A to 44F is illustrated by four small rectangles.

In FIG. 5T, a base cooling plate 45 including multiple stand off tabs 46 may be provided. In the example, the base cooling plate 45 may be rectangular and may particularly have a surface area greater than or equal to a surface area of the PCB 11. However, in further examples, the base cooling plate 45 may also have a different geometrical shape that may depend on the shape of the PCB under consideration and the overall design of the device that is to be manufactured. The base cooling plate 45 may be manufactured from an appropriate thermally conductive material, in particular from at least one of copper, copper alloy, aluminum, aluminum alloy, etc.

The stand off tabs 46 may have a geometrical shape similar to the sets of opening holes 44A to 44F of FIG. 5S. That is, the stand off tabs 46 may be formed such that they may extend through the opening holes 44A to 44F. The number of the stand off tabs 46 may particularly equal the number of switching devices that are to be cooled. In the example of FIG. 5T, the stand off tabs 46 may be arranged in groups of four tabs that may be thermally connected to groups of four MOSFETs later on. Each of the stand off tabs 46 may have a base part that may be attached to the base cooling plate 45 and a top part that may attached to the base part. The top part and/or the base part of the stand off tabs 46 may be manufactured from an appropriate thermally conductive material, in particular from at least one of silicon and a silicon based material.

In FIG. 5U, the PCB 11 may be fitted onto the base cooling plate 45 such that the stand off tabs 46 may extend through the through holes 44.

Figure 5V:
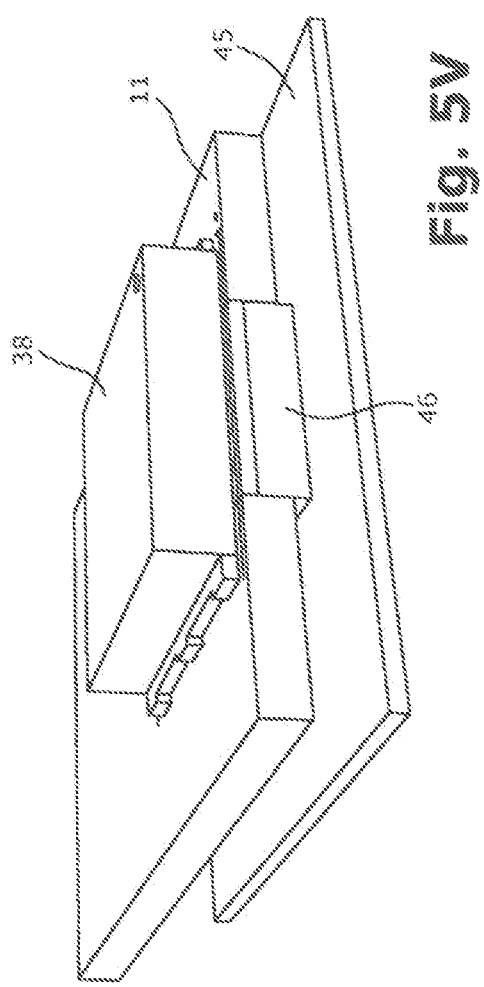

FIG. 5V illustrates an enlarged view of the thermal connection that may be provided between the base cooling plate 45 and the PCB 11, more particular between a stand off tab 46 and a semiconductor package 38. In the example of FIG. 5V, the semiconductor package 38 may correspond to a TOLL package that may be configured to operate as a switching device. The substrate of the PCB 11 may be arranged over the base cooling plate 45 such that the stand off tab 46 may extend through an opening of the PCB 11 and a thermal connection may be provided between the top part of the stand off tab 46 and a bottom surface of the semiconductor package 38.

FIG. 5W illustrates a bottom view of the PCB 11 that has been described in connection with foregoing figures. Hence, the layout of the bottom side PCB 11 may become apparent from previous comments. Multiple gate resistors 47 may be arranged over the bottom side of the PCB 11. For the sake of simplicity, only two groups of four gate resistors 47 are illustrated in FIG. 5W. In one example, a number of gate resistors 47 may equal the number of switching devices including a gate that are to be arranged over the front side of the PCB 11. A gate resistor 47 may e.g., be configured to avoid parasitic effects that may occur at the gate of the respective switching device. In addition, multiple gate drivers 48 may be arranged over the bottom side of the PCB 11. A gate driver 48 may be configured to drive at least one of the switching devices that may be arranged over the front side of the PCB 11.

FIG. 5X illustrates a bottom view of a section of the PCB 11. The PCB 11 may include short parallel traces 49 that may be configured to provide an electrically coupling to a gate and a source of a MOSFET that may be arranged over the PCB 11. The traces 49 may be configured to provide a low inductance loop.

FIGS. 6A to 6L illustrate a further method for manufacturing a further device in accordance with the disclosure. For example, the manufactured device may be configured to operate similar to one of the three phase inverters of FIGS. 4A and 4B. In addition, the layout of the device manufactured by the method of FIGS. 6A to 6L may serve as a basis for manufacturing devices configured to operate similar to the three phase inverter of FIG. 4C. For the sake of simplicity and for illustrative purposes, one or more of the FIGS. 6A to 6L may not necessarily include all components that may be required for the illustrated method.

Figure 6A:
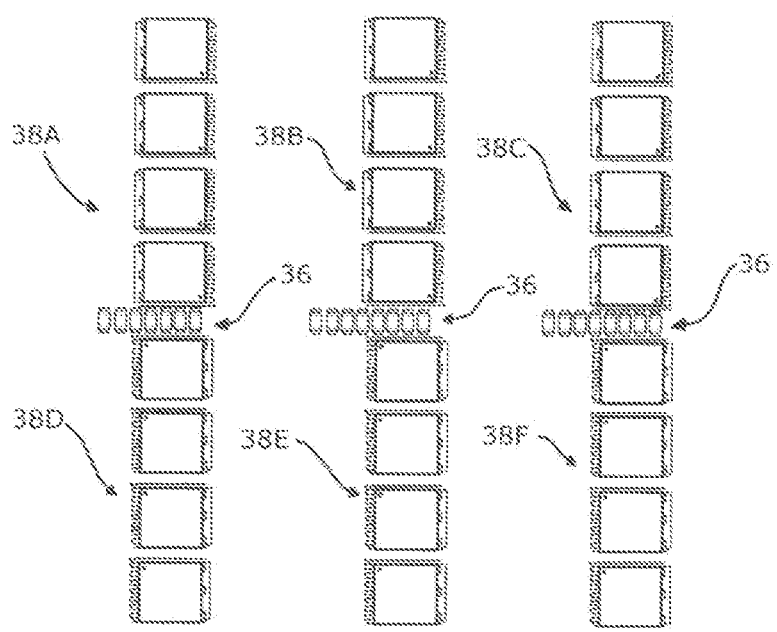
FIGS. 6A to 6L illustrate a further method for manufacturing a device in accordance with the disclosure. The device may operate similar to the three phase inverters of FIGS. 4A to 4C.

FIG. 6A illustrates multiple electronic components that may be arranged over a PCB (not illustrated). In particular, multiple sets of switching devices in form of MOSFETs 38A to 38F illustrated by small semiconductor packages may be provided. Each of the upper three sets of MOSFETs 38A to 38C may be arranged in a similar fashion, wherein drain contacts are arranged on the left side of the respective MOSFET and source contacts are arranged on the right side of the respective MOSFET. Each of the lower three sets of MOSFETs 38D to 38F may be arranged in a similar fashion with source contacts being arranged on the left side of the respective MOSFET and drain contacts being arranged on the right side of the respective MOSFET. Each of the illustrated MOSFETs may further include a gate terminal In addition, multiple sets of MLCC 36 may be provided and arranged between the MOSFETs 38A to 38F. In the example of FIG. 6A, three sets of eight MLCC 36 may be provided, wherein the MLCC 36 of each set e.g., may be connected in parallel. In further examples, the number of MLCC may be chosen differently. The sets of MOSFETs 38A to 38F and the MLCC 36 may be configured to form a part of a three phase inverter as e.g. described in connection with FIGS. 4A and 4B. The components of FIG. 6A may be similar to similar components as e.g., illustrated and described in connection with FIG. 5D such that corresponding comments may also hold true for FIG. 6A.

Figure 6B:
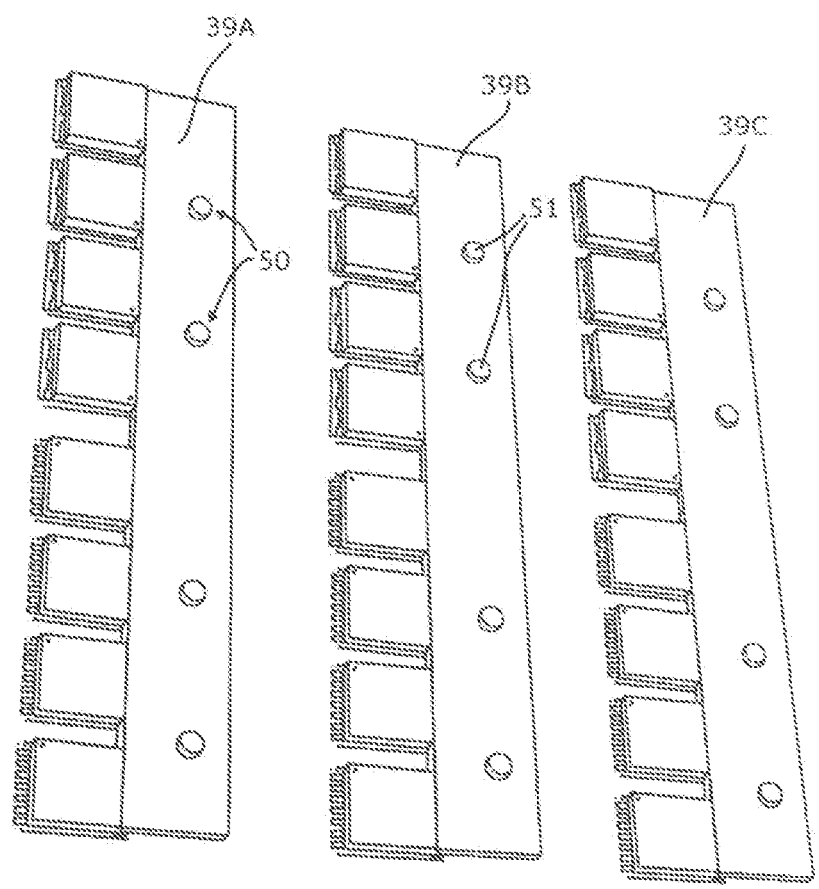

In FIG. 6B, three metal workpieces 39A to 39C may be provided that may be similar to each other. The metal workpieces 39A to 39D may be connected to the sets of MOSFETs 38A to 38F and may provide electrical connections as described in connection with FIG. 5F. For example, the metal workpiece 39A may correspond to a metal bar made of copper. The metal workpiece 39A may be configured to carry high electrical currents greater than e.g., 100 A. In one example, a height of the metal workpiece 39A may correspond to the dimension "a" of the metal workpiece 39 described in connection with FIG. 5E.

The metal workpiece 39A may include multiple holes 50, wherein the chosen number of holes 50 may depend on the overall design of the device to be manufactured. The metal workpiece 39A may be attached to a PCB (not illustrated) by screws 51 extending through the holes 50. For example, a cross section of the holes 50 and the screws 51 may have a circular shape. In the example of FIG. 6B, the screws 51 are illustrated to extend over the top surface of the metal workpieces 39A to 39C. In a further example, the top surface of one or more of the screws 51 may be flush with the top surface of the respective one of the metal workpieces 39A to 39C.

FIG. 6C illustrates an example connection between the metal workpiece 39A and the PCB 11. In particular, FIG. 6C may relate to a connection between the metal workpiece 39A and the drain contacts of the set of MOSFETs 38D. However, one or more of the further connections between the metal workpiece 39A and the further MOSFETs of the device may be similar. The metal workpiece 39A may include a notch 52 that may be formed such that the surfaces of the leads of the drain contacts may be flush with the surfaces of the notch 52. The relative arrangement between the notch 52 and the drain terminals may be similar to like connections described in connection with FIG. 5G. In addition, the functions of the metal workpiece 39A may similar to the functions of the metal workpiece 39 of FIG. 5G.

Figure 6D:
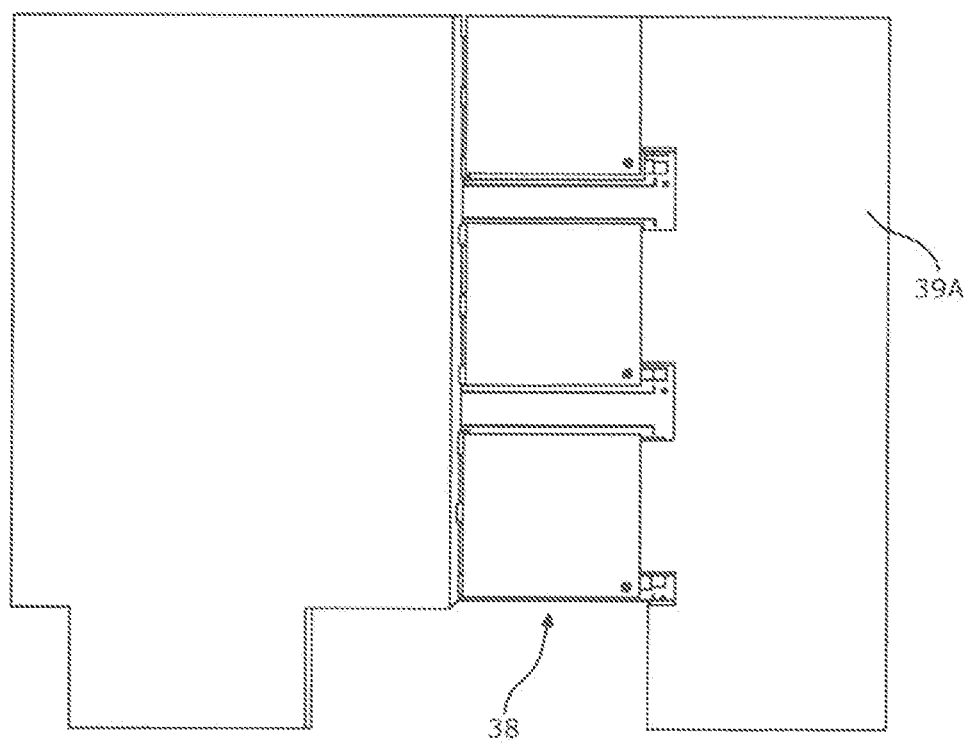

FIG. 6D illustrates the arrangement of FIG. 6C in a top view. The metal workpiece 39A may be formed to include a cutout such that the gate pins of one or more MOSFETs 38 may be exposed from the metal workpiece 39A at the position of the cutout.

Figure 6E:
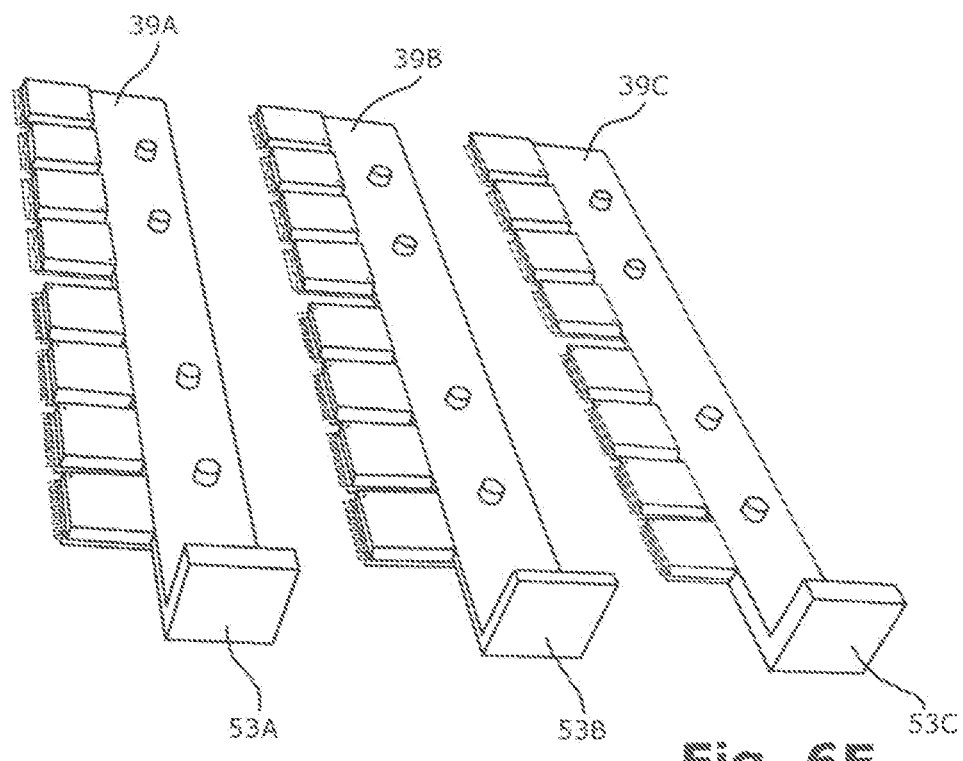
Figure 6T:
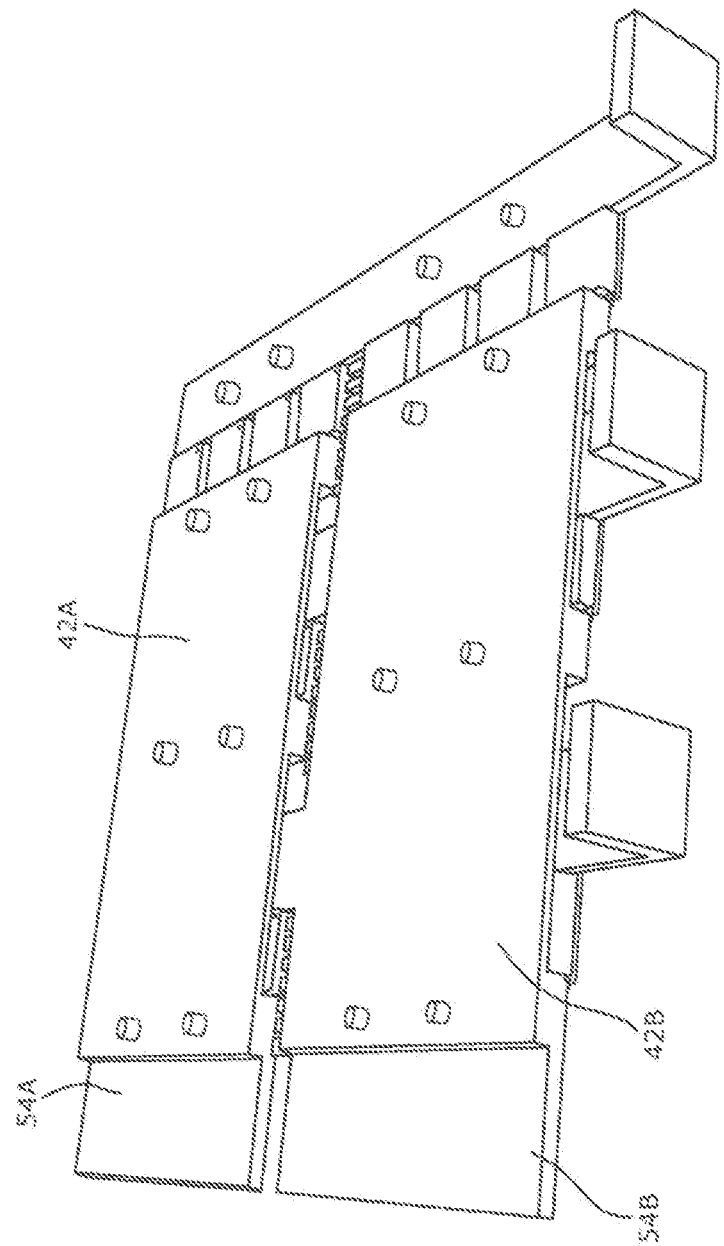

In FIG. 6E, the metal workpiece 39A may be connected to a contact element 53A. In addition, the further metal workpieces 39B and 39C may be connected to further contact elements 53B and 53C in a similar fashion. In the example of FIG. 6E, the contact element 53A may be located at one end of the metal workpiece 39A. The contact element 53A may be manufactured from an electrically conductive material, for example from a material that has been mentioned in connection with the production of the metal workpiece 39A. In one example, the contact element 53A and the metal workpiece 39A may be formed as a single piece made from the same material. In a further example, the contact element 53A and the metal workpiece 39A may be separate pieces that may be joint together and that may be made from a similar material or not. The contact element 53A may be configured to provide a phase output connection of a three phase inverter that is to be manufactured. Comments of FIG. 5F regarding discussed phase out connections may also hold true for FIG. 6E.

In FIG. 6F, a further metal workpiece 42A may be provided. The metal workpiece 42A may be similar to the metal workpiece(s) discussed in connection with FIG. 5M and thus may provide similar electrical connections. That is, the metal workpiece 42A of FIG. 6F may provide an electrical connection between the drain terminals of the high side switches of the three phase converter that is to be produced. The metal workpiece 42A may be attached to the PCB (not illustrated) similar to the metal workpieces 39A to 39C of FIG. 6B by means of screws that may extend through openings of the metal workpiece 42A and may fix it to the PCB.

FIG. 6G illustrates a more detailed view of the connection between the metal workpiece 42A and a drain terminal of one of the MOSFETs 38. The connection illustrated in FIG. 6G may be similar to the connection discussed with regard to FIG. 6C such that corresponding comments may also hold true for FIG. 6G.

In FIG. 6H, a further metal workpiece 42B may be provided that may be similar to and may provide similar electrical connections as the metal workpiece(s) discussed in connection with FIG. 5P. That is, the metal workpiece 42B of FIG. 6H may provide an electrical connection between the source terminals of the low side switches of the three phase converter that is to be manufactured. The metal workpiece 42B may be attached to the PCB (not illustrated) in a similar fashion as the metal workpieces 39A to 39C by means of screws that may extend through openings of the metal workpiece 42B and may fix it to the PCB.

FIG. 6I illustrates the arrangement of FIG. 6H including additional contact elements 54A and 54B. The first contact element 54A may be configured to provide an electrical connection between the first metal workpiece 42A and a positive terminal of a power supply. In a similar fashion, the second contact element 54B may be configured to provide an electrical connection between the second metal workpiece 42B and a negative terminal of the power supply. The contact elements 54A and 54B may be made from a material similar to the material of the metal workpieces 42A and 42B. The first contact element 54A and the first metal workpiece 42A may form a single piece or may correspond to different pieces that may be joint together. The same holds true for the second contact element 54B and the second metal workpiece 42B.

In FIG. 6J, a thermal interface material 55 may be arranged over the arrangement of FIG. 6I. In the example of FIG. 6J, the thermal interface material 55 may have a rectangular shape and may have a surface area that may be substantially equal to a surface area of the upper surface of the arrangement of FIG. 6I. The thermal interface material 55 may be manufactured from an appropriate thermally conductive material, in particular from at least one of silicon and a silicon based material. In addition, a heatsink 56 may be arranged over the thermal interface material 55 such that a thermal connection between the arrangement of FIG. 6I and the heatsink 56 may be provided. The heatsink 56 may be manufactured from an appropriate thermally conductive material, in particular from at least one of copper, copper alloy, aluminum, aluminum alloy, etc.

FIG. 6K illustrates a bottom side of a PCB 11, wherein the opposite top side of the PCB 11 may include the arrangement of the foregoing figures. Multiple gate drivers 48 may be arranged over the bottom side of the PCB 11. Comments made in connection with the gate drivers of FIG. 5W may also hold true for FIG. 6K. In addition, FIG. 6K illustrates multiple inlay nuts arranged over the bottom side of the PCB 11 that may be configured to screw the metal workpieces that may have been arranged over the top side of the PCB 11 to the PCB 11.

Figure 6L:
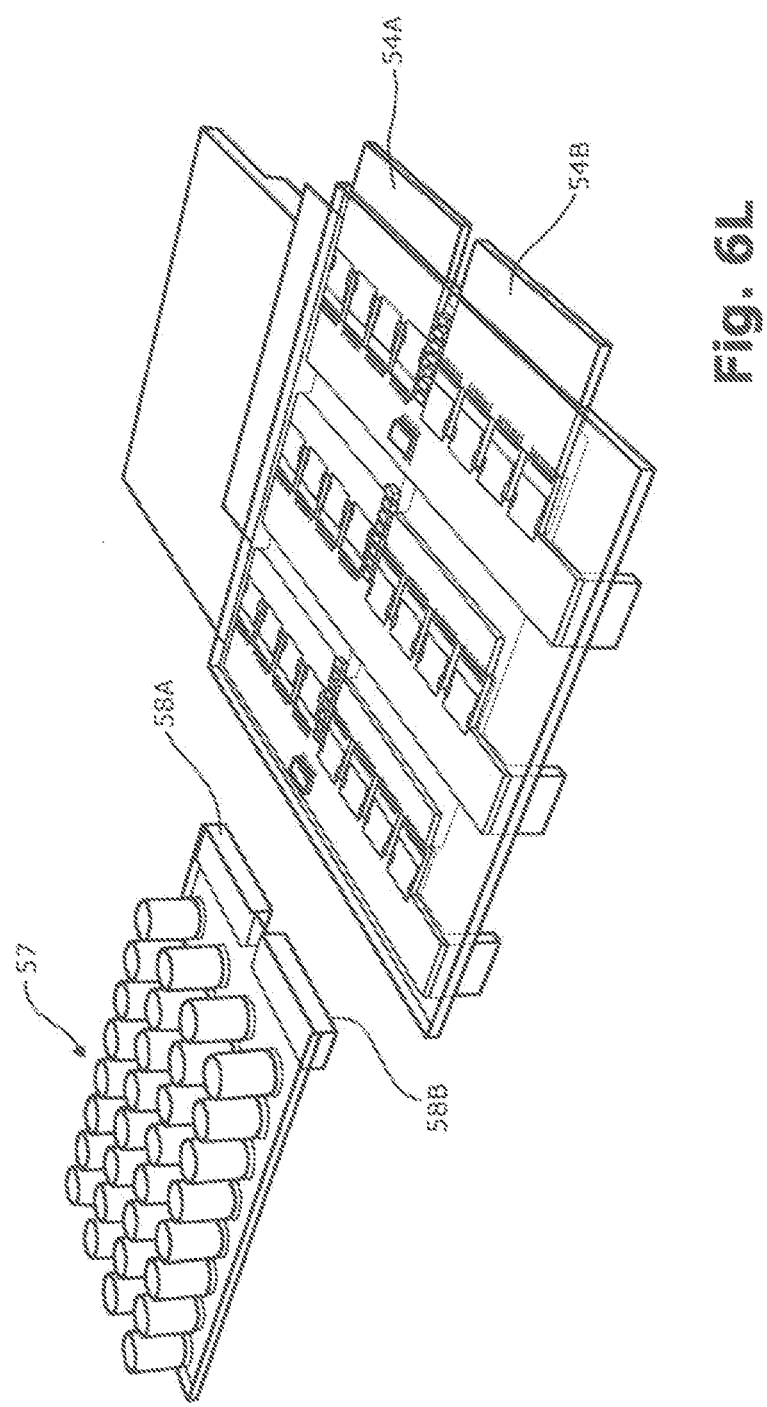

In FIG. 6L, a capacitor bank 57 may be connected to the PCB 11 which is illustrated in a bottom view. The capacitor bank 57 may include a first contact element 58A and a second contact element 58B. The first contact element 58A may be connected to a positive terminal of a power supply via the first contact element 54A, and the second contact element 58B may be connected to a negative terminal of a power supply via the second contact element 54B. The design and layout of the capacitors on the capacitor bank 57 and the electric connections between the capacitors may be chosen such that the connection of the capacitor bank 57 to the contact elements 54A and 54B may result in a circuitry in which the capacitors of the capacitor bank 57 may correspond to the capacitors 26A to 26C and 27A to 27C of the three phase inverter of FIG. 4A.

The method of FIGS. 6A to 6L may be adapted for producing a multilevel inverter as e.g., described in connection with FIG. 4C. For example, each of the high side structure and the low side structure of the multilevel inverter 400C of FIG. 4C may be designed similar to the arrangement of FIG. 6I, respectively. A possible layout may thus include two structures similar to the arrangement of FIG. 6I that may be connected with each other at the respective contact elements 53A to 53C.

Figure 7A:
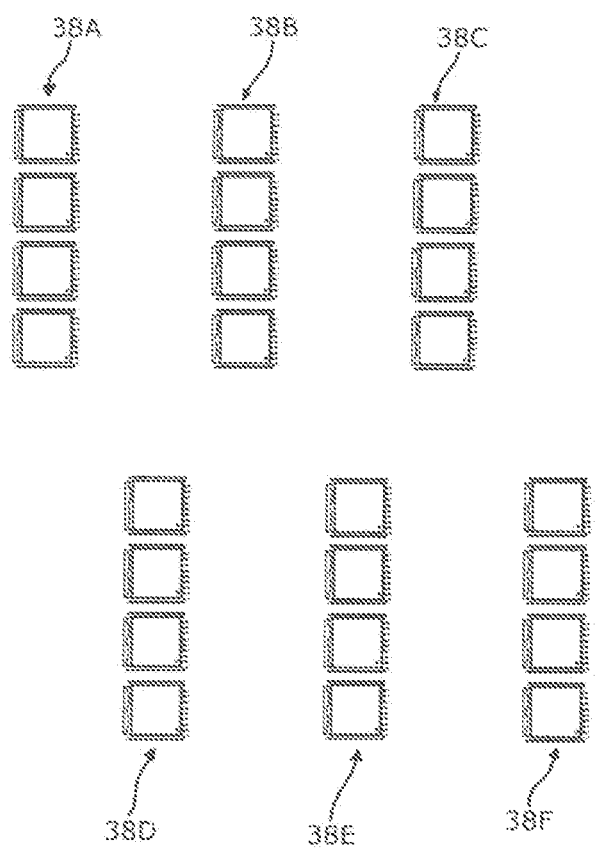
FIGS. 7A to 7R illustrate a further method for manufacturing a device in accordance with the disclosure. The device may operate similar to the three phase inverters of FIGS. 4A to 4C.
Figure 7J:
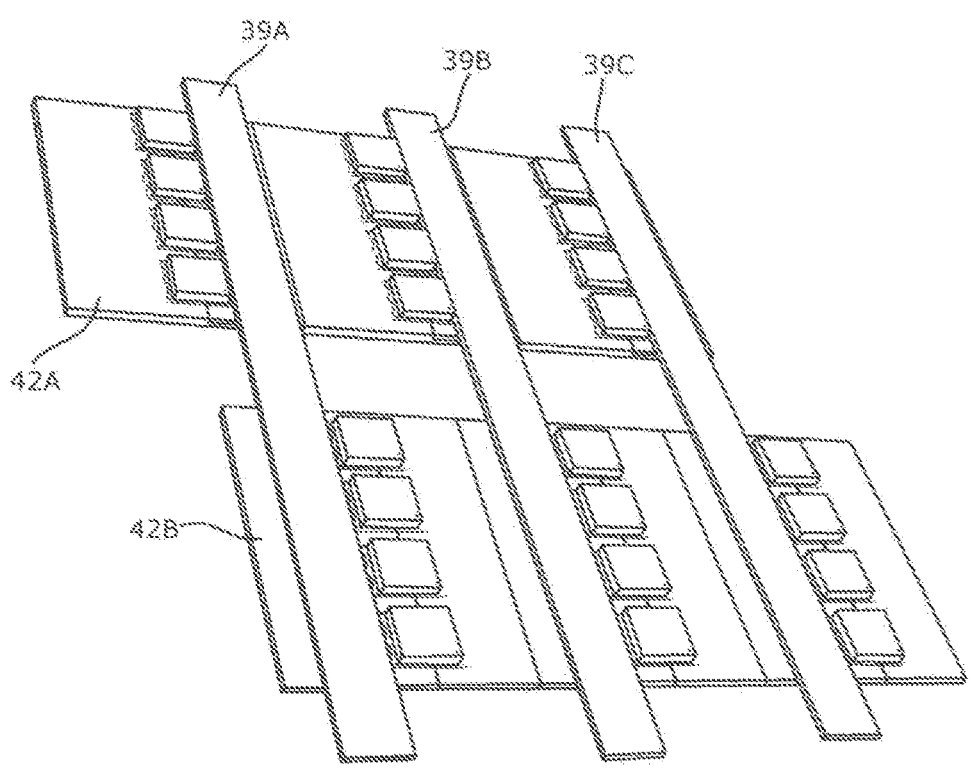
Figure 7K:
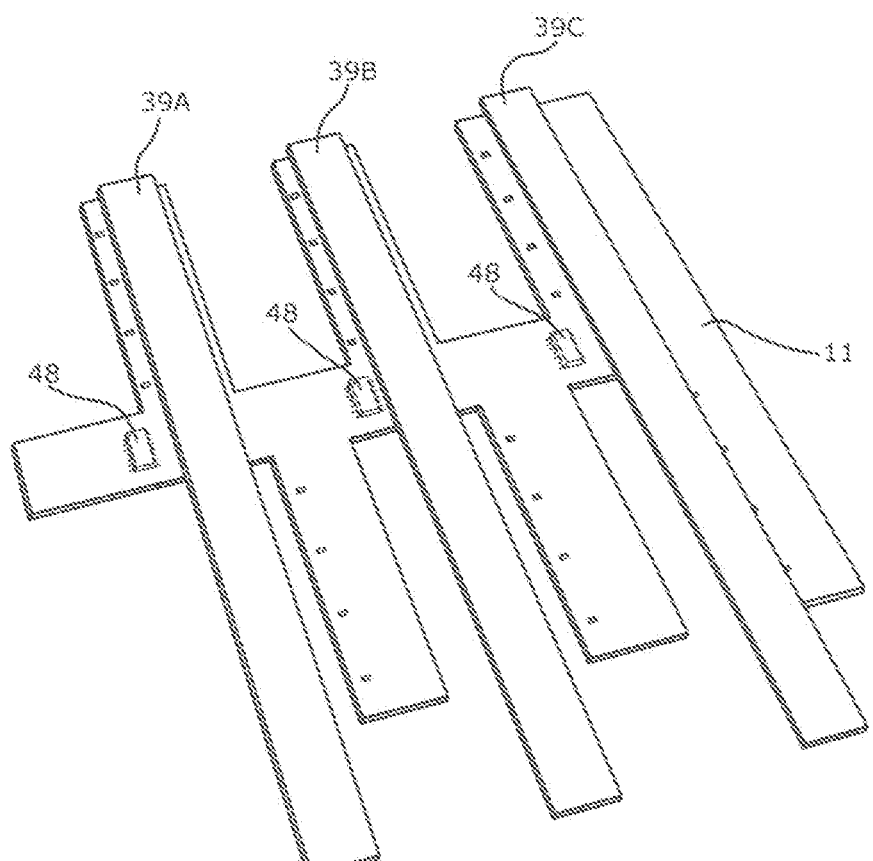
Figure 7L:
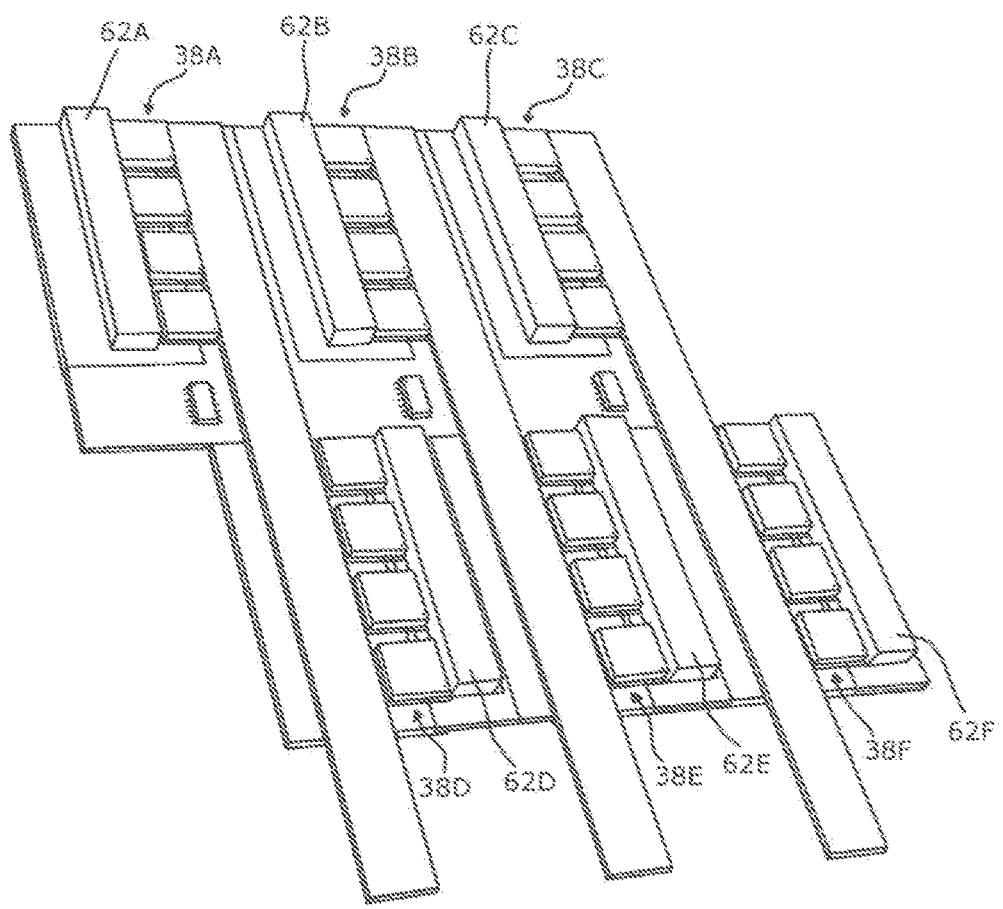
Figure 7M:
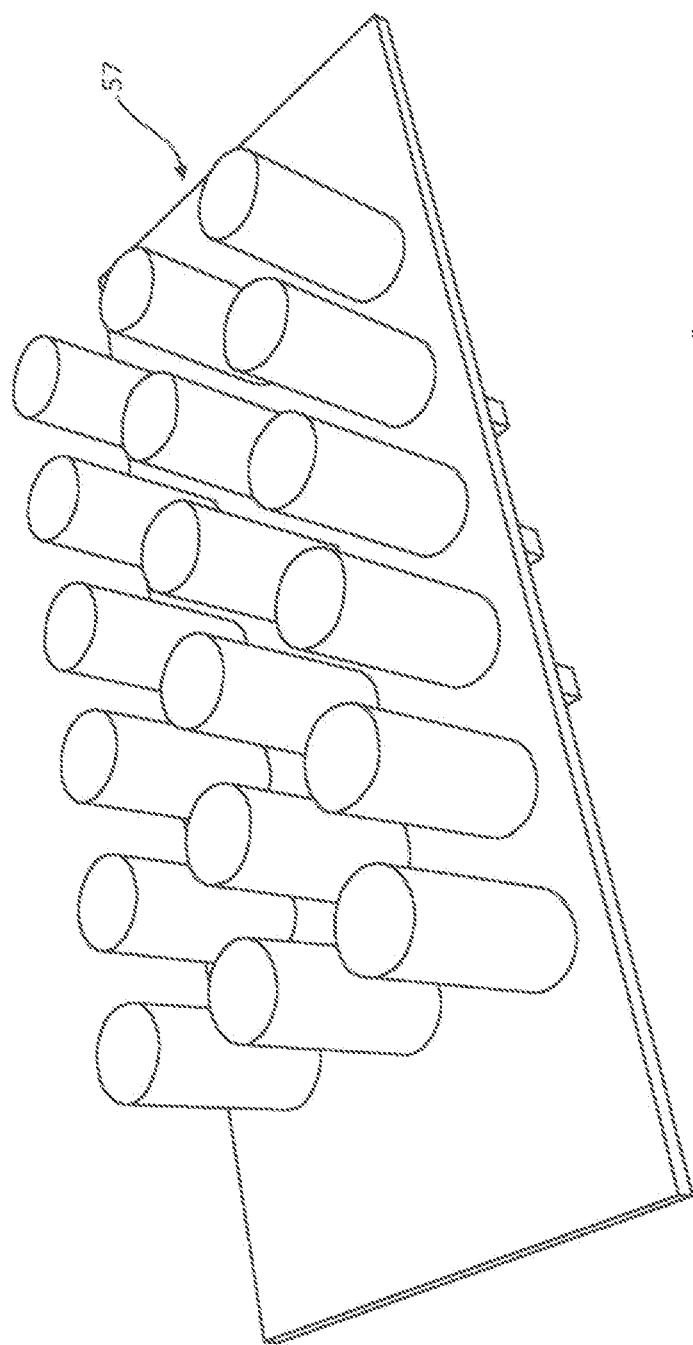
Figure 7Q:
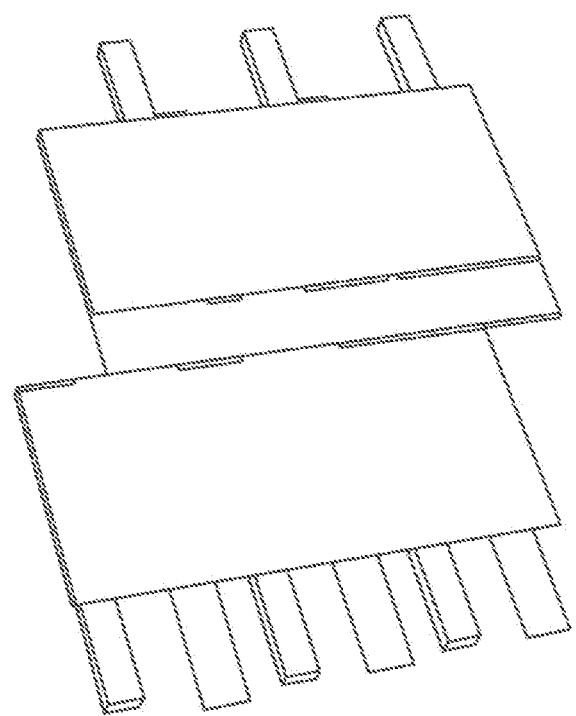
Figure 7R:
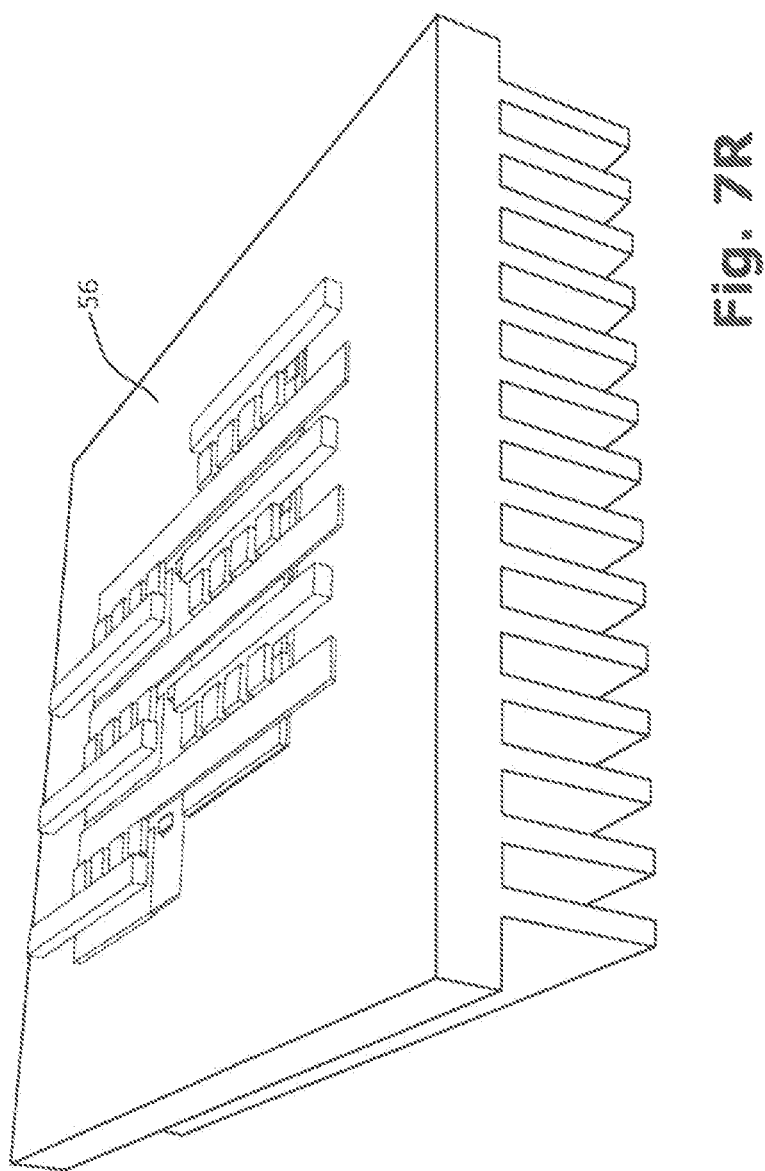

FIGS. 7A to 7R illustrate a method for manufacturing a device in accordance with the disclosure. For example, the manufactured device may be configured to operate similar to one of the three phase inverters of FIGS. 4A and 4B. In addition, the layout of the device manufactured by the method of FIGS. 7A to 7R may serve as a basis for manufacturing devices configured to operate similar to the three phase inverter of FIG. 4C. For the sake of simplicity and for illustrative purposes, one or more of the FIGS. 7A to 7R may not necessarily include all components that may be required for the illustrated method step.

In FIG. 7A, an arrangement of switching devices in form of MOSFETs 38A to 38F that are illustrated by small semiconductor packages may be provided. Each of the upper three sets of MOSFETs 38A to 38C may be arranged in a similar fashion with the drain contacts being arranged on the left side of the respective MOSFET and the source contacts being arranged on the right side of the respective MOSFET. The upper three sets of MOSFETs 38A to 38C may become high side switches of half bridge circuits later on. The lower three sets of MOSFETs 38D to 38F may be similar to the upper three sets of MOSFETs 38A to 38C, but shifted to the right. The lower three sets of MOSFETs 38D to 38F may become low side switches of the half bridge circuits later on. The sets of MOSFETs 38A to 38F may be configured to form a part of a three phase inverter as e.g., described in connection with FIGS. 4A and 4B.

In FIG. 7B, a first metal workpiece 42A may be provided that may include three recesses 59A to 59C. In one example, the shape and size of the recesses 59A to 59C may be similar.

With regard to material and electrical properties, the first metal workpiece 42A may be similar to any of the metal workpieces described above. A height "a" of the metal workpiece 42A may e.g., correspond to the dimension "a" of the metal workpiece in FIG. 5E. A depth of each recess 59A to 59C may take any value in a range between zero and the height a. The three surfaces at the bottom of the recesses 59A to 59C and the top surfaces of the metal workpiece 42A next to the recesses 59A to 59C may be substantially planar in one example.

FIG. 7C illustrates a different view of the first metal workpiece 42A of FIG. 7B.

In FIG. 7D, the upper three sets of MOSFETs 38A to 38C of FIG. 7A may be connected to the first metal workpiece 42A. In particular, the first set of MOSFETs 38A may be arranged such that the drain contacts of the MOSFETs may be electrically connected to the top surface of the first metal workpiece 42A arranged to the left of the first recess 59A. Here, the drain contacts may e.g., be directly connected to the first metal workpiece 42A. In the example of FIG. 7D, the source contacts of the first set of MOSFETs 38A may be exposed and may be connected to further components later on. The further two sets of MOSFETs 38B and 38C may be arranged similar to the first set of MOSFETs 38A. Referring back to FIG. 4A, the three sets of MOSFETs 38A to 38C may correspond to the three high side switches 28A to 28C.

FIG. 7E illustrates a detail of the arrangement of FIG. 7D from a different perspective.

In FIG. 7F, a PCB 11 may be provided. In one example, the PCB 11 may constitute a part of an FR4 PCB. The shape and size of the PCB 11 may depend on the properties of the device that is to be manufactured. In the example of FIG. 7F, a first dimension x of the PCB 11 may lie in a range from about 13 cm to about 16 cm, more particular from about 14 cm to about 15 cm. A second dimension y of the PCB 11 may lie in a range from about 12 cm to about 15 cm, more particular from about 13 cm to about 14 cm. FIG. 7F illustrates a top side of the PCB 11 that may include a middle section 60 and multiple finger sections 61A to 61F. The shape and dimension of the finger sections 61A to 61F may be similar to the shape and dimension of the recesses 59A to 59C of the metal workpiece 42A. Multiple gate drivers 48 that may be similar to the gate drivers of FIG. 5W may be arranged over the PCB 11. In the example of FIG. 7F, three gate drivers 48 are illustrated. In further examples, the number of gate drivers 48 may be different and may particularly depend on the layout and design of the device that is to be manufactured.

In FIG. 7G, a part of the PCB 11 of FIG. 7F may be arranged in the recesses 59A to 59C of the first metal workpiece 42A. In particular, the first finger section 61A of the PCB 11 may be arranged in the first recess 59A, the second finger section 61B may be arranged in the second recess 59B, and the third finger section 61C may be arranged in the third recess 59C. The source contacts of the MOSFETs 38A to 38C may be electrically connected to the PCB 11.

In FIG. 7H, a second metal workpiece 42B may be provided. The second metal workpiece 42B may be similar to the first metal workpiece 42A explained in connection with FIG. 7B. The second metal workpiece 42B may include three recesses 59D to 59F. The lower three sets of MOSFETs 38D to 38F of FIG. 7A may be connected to the second metal workpiece 42B. In particular, the first set of MOSFETs 38D may be arranged such that the drain contacts of the MOSFETs may be electrically connected to the top surface of the second metal workpiece 42B that is arranged to the left of recess 59D. In particular, the drain contacts may be directly connected to the second metal workpiece 42B. The further two sets of MOSFETs 38E and 38F may be arranged similar to the first set of MOSFETs 38C. Referring back to FIG. 4A, the three sets of MOSFETs 38D to 38F may correspond to the three low side switches 29A to 29C.

In the example of FIG. 7H, a part of the PCB 11 may be arranged in the recesses 59D to 59F of the second metal workpiece 42B. In particular, the fourth finger section 61D of the PCB 11 may be arranged in the first recess 59D of the second metal workpiece 42B, the fifth finger section 61E may be arranged in the second recess 59E, and the sixth finger section 61F may be arranged in the third recess 59F. The source contacts of the MOSFETs 38D to 38F may be electrically connected to the PCB 11.

In FIG. 7I, the first metal workpiece 42A and the second metal workpiece 42B may be arranged relative to each other such that the sets of MOSFETs 38A to 38F may be arranged relative to each other as illustrated in FIG. 7A. For illustrative purposes and for the sake of simplicity, the middle section 60 of the PCB 11 is not illustrated in FIG. 7I.

In FIG. 7J, three further metal workpieces 39A to 39C may be provided. For example, the metal workpieces 39A to 39C may be similar to the metal workpieces 39A to 39C of FIG. 6B. The metal workpieces 39A to 39C may be configured to provide an electrical connection between the source contacts of the sets of high side MOSFETs 38A to 38C and the drain contacts of the sets of low side MOSFETs 38D to 38F, respectively. Comments made in connection with FIG. 5F may also hold true for the arrangement of FIG. 7J. The metal workpieces 39A to 39C may be fixed to the PCB 11 by means of screws as described above or using another appropriate fixing technique. For illustrative purposes and for the sake of simplicity, the middle section 60 of the PCB 11 is not illustrated in FIG. 7J.

FIG. 7K illustrates the spatial arrangement of the metal workpiece 39A to 39C relative to the gate drivers 48. For illustrative purposes and for the sake of simplicity, the middle section 60 of the PCB 11 is not illustrated in FIG. 7K.

In FIG. 7L, multiple metal blocks 62A to 62F may be arranged over the PCB 11. The metal blocks 62A to 62F may be configured to provide an electrical coupling to the sets of MOSFETs 38A to 38F and to a capacitor bank that may be provided later on. A first metal block 62A may be arranged next to the first set of MOSFETs 38A wherein the first metal block 62A may be electrically connected to the drain contacts of the MOSFETs 38A. In a similar fashion, the metal blocks 62B and 62C may be arranged to electrically contact the drain contacts of the sets of MOSFETs 38B and 38C. In addition, the metal blocks 62D to 62F may be arranged to electrically contact the source contacts of the sets of MOSFETs 38D to 38F. The metal blocks 62A to 62F may be manufactured from a similar material as the metal workpieces described above.

FIG. 7M illustrates the top side of a capacitor bank that may be provided. In one example, the capacitor bank may be similar to the capacitor bank 57 of FIG. 6L.

FIG. 7N illustrates a bottom view of the capacitor bank 57 of FIG. 7M. Multiple metal blocks 63A to 63F may be arranged over the bottom side of the capacitor bank 57. The metal blocks 63A to 63F may be configured to serve as electrical contact elements.

In FIG. 7O, the capacitor bank 57 may be arranged over the PCB 11 in such a way that the metal blocks 63A to 63F arranged over the capacitor bank 57 may be electrically coupled to the metal blocks 62A to 62F arranged over the PCB 11. Due to the chosen perspective, only metal blocks 63D to 63F are illustrated in FIG. 7O. In particular, the first metal block 62A of the PCB 11 may be electrically connected to the first metal block 63A of the capacitor bank 57, the second metal block 62B of the PCB 11 may be electrically connected to the second metal block 63B of the capacitor band 57, etc. The design and layout of the capacitors on the capacitor bank 57 as well as the electric connections between these capacitors may be chosen such that the connection of the capacitor bank 57 to the PCB 11 via the metal blocks may result in a circuitry in which the capacitors of the capacitor bank 57 may correspond to the capacitors 26A to 26C and 27A to 27C of the three phase inverter of FIG. 4A.

FIG. 7O further illustrates that the metal blocks 62A to 62F arranged over the PCB 11 may extend over the contour or outline of the PCB 11. The metal blocks 62A to 62F may be configured to provide an electrical coupling to a power supply (not illustrated). For example, a connection between the power supply and the metal blocks 62A to 62F may be provided via wires that may particularly be attached to the sections of the metal blocks 62A to 62F that may extend over the contour of the PCB 11. The metal blocks 62A to 62C next to the high side switching devices 38A to 38C may be connected to a positive terminal of the power supply, and the metal blocks 62D to 62F next to the low side switching devices 38D to 38F may be connected to a negative terminal of the power supply.

In FIG. 7P, a thermal interface material 55 may be arranged on a bottom side of the arrangement of FIG. 7O. The geometric shape of the thermal interface material 55 may depend on the geometric shape of the arrangement, in particular the PCB 11. In the example of FIG. 7P, the thermal interface material 55 may include a first rectangular part 55A that may be arranged opposite to the high side switching devices 38A to 38C and a second rectangular part 55B that may be arranged opposite to the low side switching devices 38D to 38F. The thermal interface material 55 may be manufactured from an appropriate thermally conductive material, in particular from at least one of silicon and a silicon based material.

FIG. 7Q illustrates a bottom view of the arrangement of FIG. 7P.

In FIG. 7R, the arrangement of FIG. 7P may be arranged over a heatsink 56 such that the thermal interface material 55 may be located between the PCB 11 and the heatsink 56. The heatsink 56 may be similar to the heatsink 56 as described in connection with FIG. 6J.

Figure 8:
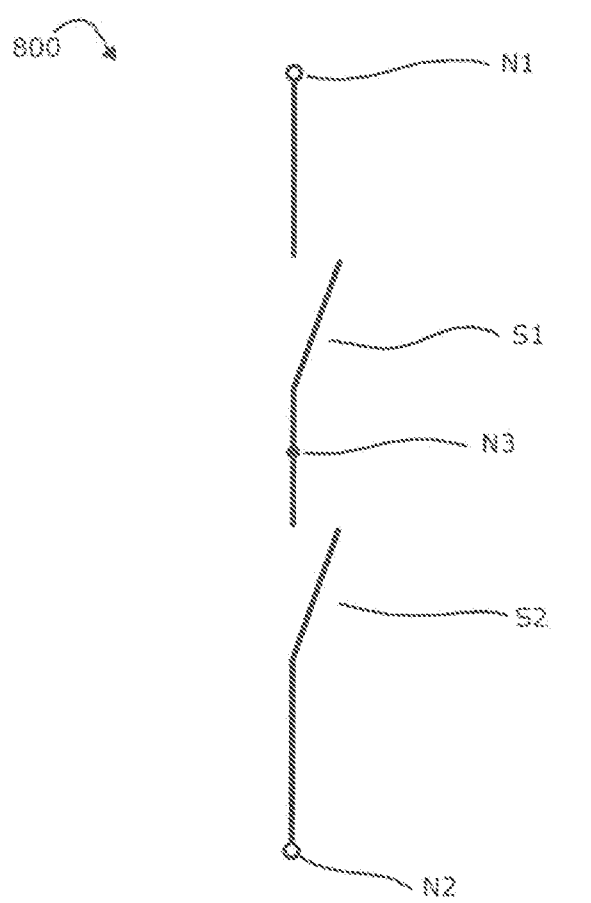
FIG. 8 illustrates a schematic diagram of a half bridge circuit 800.

FIG. 8 illustrates a schematic diagram of a half bridge circuit 800 as it may e.g., be included in a three phase inverter, for example one of the three phase inverters of FIGS. 4A to 4C. The half bridge circuit 800 may be arranged between nodes N1 and N2. The half bridge circuit 800 may include switches S1 and S2 connected in series. Constant electrical potentials may be applied to the nodes N1 and N2. For example, a high potential, such as e.g., 10 V, 50 V, 100 V, 200 V, 500 V or 1000 V or any other appropriate potential, may be applied to the node N1 and a low electrical potential, for example 0 V, may be applied to the node N2. The switches S1 and S2 may be switched at frequencies in a range from e.g., about 1 kHz to e.g., about 100 MHz, but the switching frequencies may also be outside this range. This means that a varying electrical potential may be applied to a node N3 arranged between the switches S1 and S2 during an operation of the half bridge circuit 800. The potential of the node N3 may vary in the range between the low and the high electrical potential.

The half bridge circuit 800 may, for example, also be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 50 A or even higher may flow through the DC-DC converters.

Devices and methods in accordance with the disclosure may provide the following effects and/or advantages compared to other devices. The listed effects are neither exclusive nor limiting. In particular, the devices in accordance with the disclosure may be advantageous compared to devices that may be based on an insulated metal substrate (IMS) board and/or thermal vias. However, it is noted that the devices in accordance of the disclosure may also be combined with an IMS solution and/or a thermal via solution.

The devices in accordance with the disclosure may e.g., be applied to three phase solutions for motor applications, but may also be applied to any other passive load.

The devices in accordance with the disclosure may be based on a scaleable design that may be applied to any number of devices connected in parallel. For example, the device of FIG. 5R may be modified by increasing the number of MOSFETs connected in parallel and correspondingly scaling the employed metal workpieces connected to the MOSFETs.

The devices in accordance with the disclosure may be based on any type of SMD packages featuring a similar mechanical structure as TOLL packaged MOSFETs.

The devices in accordance with the disclosure may include one or more heatsinks for cooling components included in the device. In addition, the metal workpieces of the device may also contribute to a cooling of device components. In particular, the metal workpieces may contribute to a cooling of switching devices connected to the metal workpieces. The heat dissipation from a MOSFET to the metal workpieces may be maximized by a direct connection between MOSFETs pins and the metal workpieces. The metal workpieces may particularly be configured to dissipate heat that may occur due to short time (several seconds) overload.

The metal workpieces as described herein may be located on top of the package pins (e.g., TOLL pins), thereby providing an improved electrical and thermal connection. Furthermore, the metal workpieces may serve the purpose of stabilizing and enforcing a mechanical attachment of the package to the PCB.

The metal workpieces may serve as electrical jumpers and may be used as a connection point to a battery and phase outputs.

Since the metal workpieces may be configured to carry high currents, no additional high current traces connected to the MOSFETs may be required. Hence, the device in accordance with the disclosure may be based on an inexpensive standard PCB, for example a 2-layer 2-4 Oz copper thickness PCB. All high currents may be carried by the metal workpieces, except for possible capacitor connections. The devices in accordance with the disclosure may provide a flexibility to use a multilayer PCB in order to increase the performance of the implemented circuit.

The devices in accordance with the disclosure may provide a possibility of mounting gate drivers such that a very short connection to MOSFETs may be feasible. Hence, a low parasitic inductance and/or an improved switching performance may be achieved. The design and layout of the devices in accordance with the disclosure may result in an efficiency improvement and a lower electromagnetic interference (EMI).

The devices in accordance with the disclosure may provide a possibility of soldering battery wires to the metal workpieces. In addition, phase output connections may be provided by the metal workpieces, in particular in form of flat copper bars to which motor wires may be attached.

The design and layout of the devices in accordance with the disclosure may provide an increased area for arranging bypass ceramic capacitors that may serve high frequency current filtering. The capacitors may be effectively mounted between positive and negative battery power planes such that a short possible connection may be established.

The devices in accordance with the disclosure may include electrolytic capacitors that may be closely connected to the switching devices. Hence, a possible parasitic inductance between these components may be reduced. A reduced parasitic inductance may result in an improved DC voltage filtering and lower voltage overshoots.

The devices in accordance with the disclosure may be based on a PCB layout such that the use of snubbers or transient suppressors may be reduced or completely avoided.

The devices in accordance with the disclosure may provide a heatsink attachment providing a consistent thermal interface to switching devices with no voids between these components.

The metal workpieces as described herein may provide an improved thermal contact with the packages arranged on the PCB via a PCB copper top layer.

The devices in accordance with the disclosure may provide a flexibility of using a different PCB copper layer thickness in order to increase a performance of an implemented circuit.

The devices in accordance with the disclosure may provide the flexibility of using different thicknesses of the metal workpieces in order to scale for required currents.

An attachment of a heatsink as described in the above examples may provide an additional thermal capacitance. The heatsink may interface the metal workpieces via a large area such that a thermal resistance may be lowered and an effective cooling may be provided.

In an IMS solution, a package (such as e.g., an SMD package like TOLL) mounted on the IMS PCB may prematurely suffer from solder cracks due to a thermal cycling on the IMS PCB. In contrast to this, such negative effect may be reduced or avoided by using a device in accordance with the disclosure that may include a more expandable FR-4 PCB.

While a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ from that illustrated herein.

Although specific aspects have been illustrated and described herein, it will be appreciated by those of ordinary skill in the art that a variety of alternate and/or equivalent implementations may be substituted for the specific aspects illustrated and described without departing from the concept of the invention. This application is intended to cover any adaptations or variations of the specific aspects discussed herein. Therefore, it is intended that this invention be limited only by the claims and the equivalents thereof.

What is claimed is:

1. A device, comprising:
   a first semiconductor package, comprising a semiconductor chip, an encapsulation material at least partly covering the semiconductor chip, and a contact element electrically coupled to the semiconductor chip and protruding out of the encapsulation material;
   a printed circuit board, wherein the first semiconductor package is mounted on the printed circuit board and the contact element of the first semiconductor package is electrically coupled to the printed circuit board; and
   a first metal workpiece mounted on the printed circuit board and adjacent to the first semiconductor package, wherein the first metal workpiece is electrically coupled to the contact element of the first semiconductor package and configured to provide a direct electrical connection between the contact element of the first semiconductor package and a second contact element of a second semiconductor package that is mounted on the printed circuit board, wherein the first semiconductor package is arranged over a first location on the printed circuit board and the second semiconductor package is arranged over a second location on the printed circuit board that is different than the first location.

2. The device of claim 1, wherein the first metal workpiece is configured to operate as a heatsink for dissipating heat in a direction away from the first semiconductor package.

3. The device of claim 1, wherein the contact element of the first semiconductor package is arranged between the first metal workpiece and the printed circuit board, wherein the first metal piece is configured to support a mechanical connection between the first semiconductor package and the printed circuit board.

4. The device of claim 1, wherein the first metal workpiece is in direct contact with the contact element of the first semiconductor package.

5. The device of claim 1, wherein the first metal workpiece comprises copper.

6. The device of claim 1, wherein the first metal workpiece is configured to carry electric currents greater than 100 Ampere.

7. The device of claim 1, wherein the printed circuit board is free of electrical conductors configured to carry electrical currents greater than 100 Ampere.

8. The device of claim 1, wherein the first metal workpiece comprises a metal plate including a recess.

9. The device of claim 1, wherein the first metal workpiece comprises a metal bar.

10. The device of claim 9, wherein the metal bar comprises at least one contact element protruding from a surface of the metal bar, wherein the first metal workpiece is electrically coupled to the printed circuit board by the contact element of the metal bar.

11. The device of claim 1, wherein the first metal workpiece comprises at least one hole, and the first metal workpiece is attached to the printed circuit board by a screw extending through the hole.

12. The device of claim 1, wherein the first metal workpiece comprises three planes connected in a u-shape form.

13. The device of claim 1, wherein the first metal workpiece is formed as a single piece.

14. The device of claim 1, further comprising:
a second metal workpiece mounted on the printed circuit board and configured to provide an electrical coupling between the first semiconductor package and an electric power supply.

15. The device of claim 1, wherein the semiconductor chip of the first semiconductor package is mounted on a leadframe and the contact element of the first semiconductor package comprises a lead of the leadframe.

16. The device of claim 1, further comprising a heatsink arranged over the printed circuit board.

17. The device of claim 1, wherein the first semiconductor package is a surface mount device.

18. The device of claim 1, wherein the first semiconductor package is configured to operate as a switching device.

19. The device of claim 1, wherein the device is configured to operate as a power inverter and the first metal workpiece is configured to provide a phase out connection of the power inverter.

* * * * *